United States Patent
Kurose

(10) Patent No.: US 9,762,836 B2
(45) Date of Patent: Sep. 12, 2017

(54) ELECTRONIC DEVICE

(71) Applicant: Sony Corporation, Tokyo (JP)

(72) Inventor: Yoshikazu Kurose, Tokyo (JP)

(73) Assignee: Sony Corporation, Tokyo (JP)

( * ) Notice: Subject to any disclaimer, the term of this patent is extended or adjusted under 35 U.S.C. 154(b) by 86 days.

(21) Appl. No.: 14/510,935

(22) Filed: Oct. 9, 2014

(65) Prior Publication Data

US 2015/0189214 A1 Jul. 2, 2015

(30) Foreign Application Priority Data

Dec. 26, 2013 (JP) ................................ 2013-268253

(51) Int. Cl.
| | |
|---|---|
| *H01L 27/00* | (2006.01) |
| *H04N 5/3745* | (2011.01) |
| *H01L 27/146* | (2006.01) |
| *H04N 5/378* | (2011.01) |
| *H01L 25/18* | (2006.01) |

(52) U.S. Cl.
CPC ......... *H04N 5/37455* (2013.01); *H01L 25/18* (2013.01); *H01L 27/14612* (2013.01); *H01L 27/14634* (2013.01); *H04N 5/378* (2013.01); *H01L 2924/0002* (2013.01)

(58) Field of Classification Search
CPC combination set(s) only.
See application file for complete search history.

(56) References Cited

U.S. PATENT DOCUMENTS

| | | | |
|---|---|---|---|
| 2006/0186315 A1* | 8/2006 | Lee | .................. H01L 27/14609 250/208.1 |
| 2013/0023210 A1* | 1/2013 | Rofougaran | ............ H01L 23/66 455/41.1 |
| 2013/0068929 A1 | 3/2013 | Solhusvik et al. | |
| 2013/0083227 A1 | 4/2013 | Murata et al. | |

FOREIGN PATENT DOCUMENTS

| | | |
|---|---|---|
| EP | 2 528 093 A1 | 11/2012 |
| JP | H06-232404 | 8/1994 |
| JP | H06-244420 | 9/1994 |
| JP | 2000-156523 A | 6/2000 |
| JP | 2004-363666 A | 12/2004 |

(Continued)

OTHER PUBLICATIONS

Extended European Search Report issued May 20, 2015 for corresponding European Application No. 14198537.4.

(Continued)

*Primary Examiner* — Telly Green
(74) *Attorney, Agent, or Firm* — Michael Best & Friedrich LLP

(57) ABSTRACT

An electronic device comprising a laminated structure including a first semiconductor chip and a second semiconductor chip is disclosed. In one example, the first semiconductor chip includes a sensor portion in which sensors are arranged, and the second semiconductor chip includes a signal processing portion in which signals obtained by the sensors are processed. The signal processing portion includes a high breakdown voltage transistor circuit and a low breakdown voltage transistor circuit. The low breakdown voltage transistor circuit includes a depletion-type field effect transistor.

20 Claims, 37 Drawing Sheets

(56) References Cited

FOREIGN PATENT DOCUMENTS

| | | |
|---|---|---|
| JP | 2005-528810 A | 9/2005 |
| JP | 2009-182360 A | 8/2009 |
| JP | 2009-239003 A | 10/2009 |
| JP | 2011-035701 A | 2/2011 |
| JP | 2011-159958 | 8/2011 |
| JP | 2012-054495 A | 3/2012 |
| JP | 2012-164870 A | 8/2012 |
| JP | 2012-191060 A | 10/2012 |
| JP | 2012-191359 A | 10/2012 |
| JP | 2013-507000 A | 2/2013 |
| JP | 2013-093371 A | 5/2013 |
| JP | 2013-093527 A | 5/2013 |
| JP | 2013-232473 A | 11/2013 |
| WO | WO-2006/109937 A1 | 10/2006 |

OTHER PUBLICATIONS

Coudrain P. et al., "Investigation of a Sequential Three-Dimensional Process for Back-Illuminated CMOS Image Sensors with Miniaturized Pixels" IEEE Transactions on Electron Devices, IEEE Service Center, Piscataway, NJ., vol. 56, No. 11 Nov. 1, 1999, pp. 2403-2413, XPO11277548.
European Patent Office Communication Pursuant to Article 94(3) EPC issued Oct. 14, 2016 for corresponding European Application No. 14198537.4.
Japanese Office Action issued Dec. 27, 2016 for corresponding Japanese Application No. 2013-268253.
Japanese Office Action dated Jul. 11, 2017 for corresponding Japanese Application No. 2013-268253.

\* cited by examiner

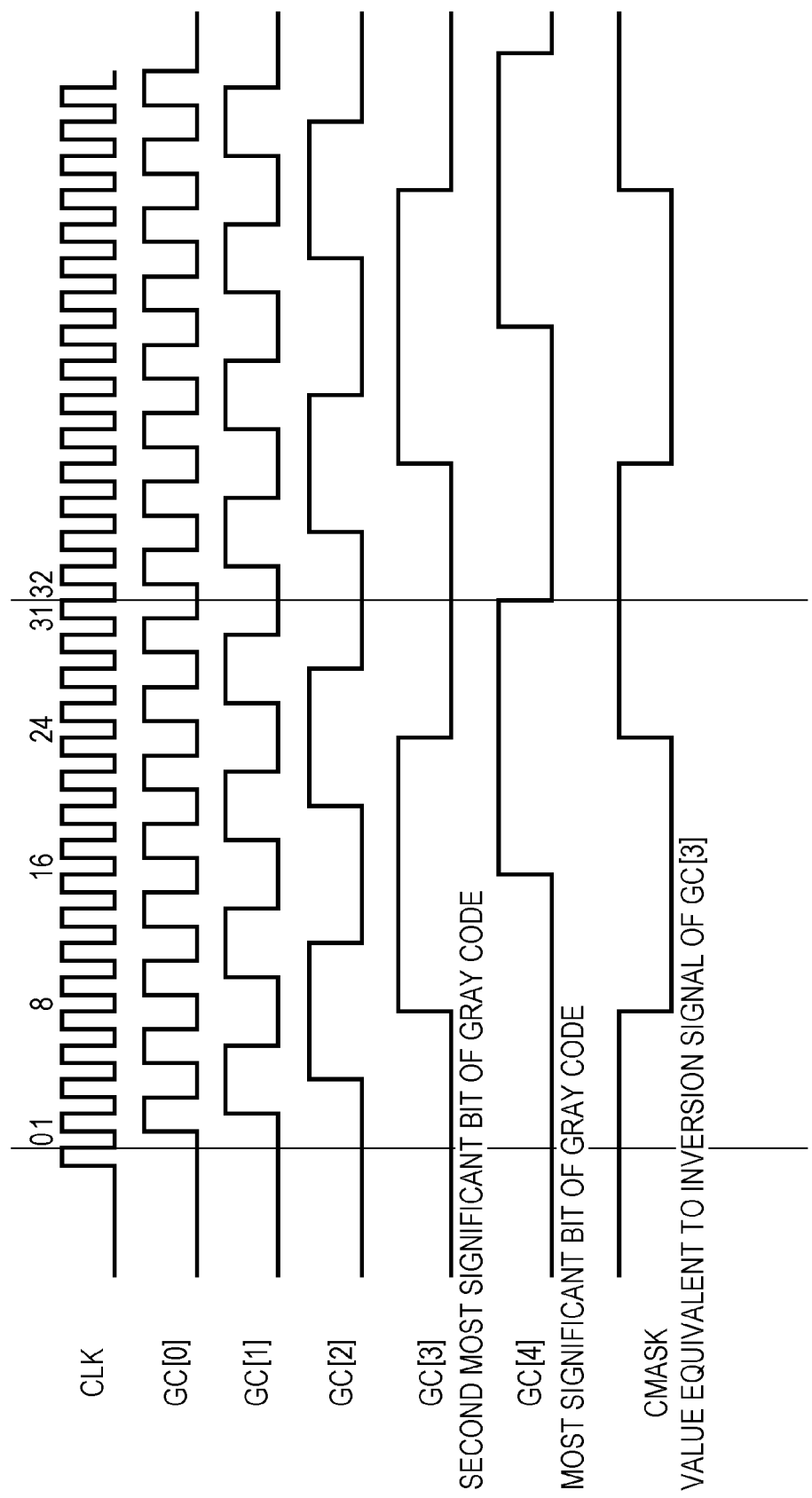

ELECTRONIC DEVICE

CROSS REFERENCE TO RELATED APPLICATIONS

This application claims the benefit of Japanese Priority Patent Application JP 2013-268253 filed Dec. 26, 2013, the entire contents of which are incorporated herein by reference.

BACKGROUND

The present disclosure relates to an electronic device.

In an electronic device such as a solid-state imaging device having a structure in which a plurality of sensors such as CMOS image sensors are arranged in a two-dimensional matrix, a demand for advancement and miniaturization of signal processing is increasing. In order to realize the demand, for example, Japanese Unexamined Patent Application Publication No. 2011-159958 has proposed a method in which a large signal processing circuit is integrated within a semiconductor chip having a size which is equivalent to that in the related art by providing a plurality of semiconductor chips in a lamination structure. Specifically, the method has a lamination structure in which a semiconductor chip (hereinafter, may also be called "first semiconductor chip") equipped with a sensor portion (sensor array) in which multiple sensors generating analog signals are arranged in a two-dimensional matrix is laminated on a chip (hereinafter, may also be called "second semiconductor chip") equipped with a logic circuit for signal processing. Various circuits configuring the first semiconductor chip and various circuits configuring the second semiconductor chip are connected to each other by a through contact (Silicon) VIA (TC(S)V) formed in the first semiconductor chip, for example. Thus, miniaturization of the electronic device is realized by laminating the plurality of semiconductor chips in this manner.

SUMMARY

Incidentally, in semiconductor chips, the number of semiconductor devices per unit area becomes vast, resulting in a major disadvantage of an increase of a leakage current of the semiconductor device in the semiconductor chip in its entirety. There is another major disadvantage of performance deterioration of a sensor which is caused by thermal noise accompanied by an increase of power consumption.

Accordingly, it is desirable to provide an electronic device having a configuration and a structure in which low power consumption can be achieved in a semiconductor chip and the performance deterioration of a sensor caused by thermal noise can be prevented.

According to one example an electronic device comprises a laminated structure including a first semiconductor chip and a second semiconductor chip is disclosed. The first semiconductor chip includes a sensor portion in which sensors are arranged, the second semiconductor chip includes a signal processing portion in which signals obtained by the sensor are processed, with the signal processing portion including a depletion-type field effect transistor.

According to another example an electronic device comprises a laminated structure including a first semiconductor chip and a second semiconductor chip. The first semiconductor chip includes a sensor portion in which sensors are arranged, and the second semiconductor chip includes a signal processing portion in which signals obtained by the sensors are processed, wherein the signal processing portion includes a high breakdown voltage transistor circuit and a low breakdown voltage transistor circuit, and wherein the low breakdown voltage transistor circuit includes a depletion-type field effect transistor.

According to still another example, there is provided an electronic device including a first semiconductor chip that has a sensor portion in which a plurality of sensors are arranged, and a second semiconductor chip that has a signal processing portion in which a signal obtained by the sensor is processed. The first semiconductor and the second semiconductor are laminated. The signal processing portion has a high breakdown voltage transistor system circuit and a low breakdown voltage transistor system circuit. At least a portion of the low breakdown voltage transistor system circuit has a depletion-type field effect transistor.

In an electronic device according to some examples, at least a portion of a signal processing portion has a depletion-type field effect transistor or at least a portion of a low breakdown voltage transistor system circuit has the depletion-type field effect transistor so that low power consumption can be achieved in the electronic device in its entirety. As a result, it is possible to prevent performance deterioration of a sensor caused by thermal noise. Effects described in the present specification are merely examples without being limited thereto, and there may be additional effects.

BRIEF DESCRIPTION OF THE DRAWINGS

FIG. 31 is a waveform chart illustrating a carry mask signal in the electronic device of Example 4;

DETAILED DESCRIPTION OF EMBODIMENTS

Figure 1:
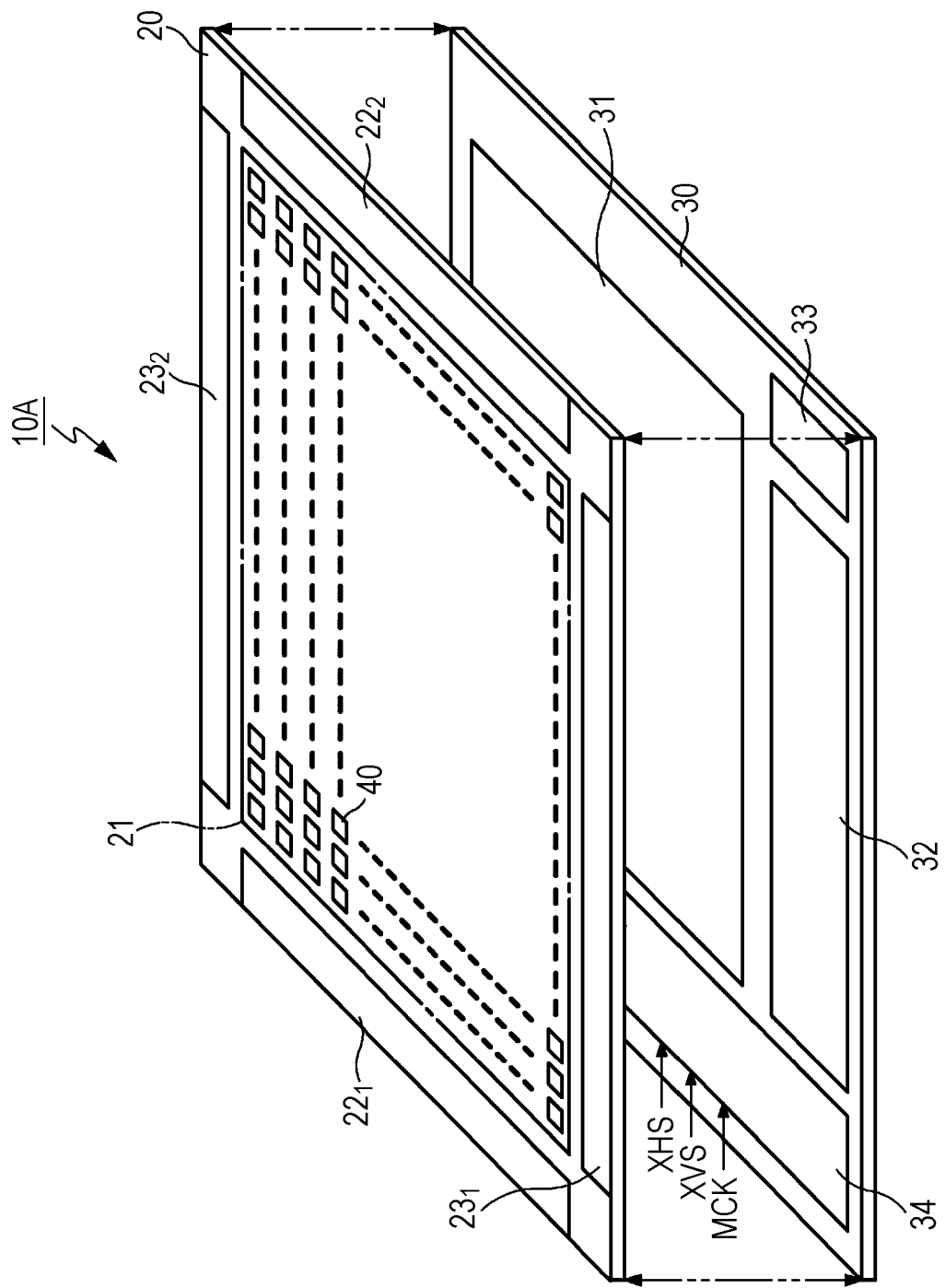
FIG. 1 is a conceptual diagram of an electronic device in Example 1.

Hereinafter, the present disclosure will be described based on Examples with reference to the drawings. However, the present disclosure is not limited to Examples, and various numeric values and materials in Examples are exemplifications. The description will be given in the following order.

1. Descriptions throughout an electronic device according to a first embodiment and a second embodiment of the present disclosure 2. Example 1 (the electronic device according to the first embodiment and the second embodiment of the present disclosure: single slope-type analog-digital converter)

3. Example 2 (a modification of Example 1)

4. Example 3 (another modification of Example 1)

5. Example 4 (modifications of Example 1 to Example 3: gray code counter)

6. Example 5 (modifications of Example 1 to Example 4: successive approximation-type analog-digital converter)

7. Example 6 (modifications of Example 1 to Example 4: delta-sigma modulation-type analog-digital converter)

8. Example 7 (a configuration example of a solid-state imaging device configuring the electronic device according to the embodiments of the present disclosure)

9. Example 8 (descriptions of various depletion-type field effect transistors), and others Descriptions throughout an electronic device according to a first embodiment and a second embodiment of the present disclosure An electronic device according to a first embodiment of the present disclosure includes a case where a portion of a signal processing portion also exists in a first semiconductor chip.

In the electronic device according to a second embodiment of the present disclosure, a high breakdown voltage transistor system circuit and a sensor portion can planarly overlap each other, and in the second semiconductor chip, a shading region can be formed above the high breakdown voltage transistor system circuit which faces the sensor portion of the first semiconductor chip. For example, the shading region can be obtained by appropriately arranging wiring formed on the second semiconductor chip. Otherwise, the high breakdown voltage transistor system circuit and the sensor portion can be formed not to planarly overlap each other so that it is not necessary to form the shading region by adopting such forming. Thus, it is possible to achieve simplification of steps, structures, and configurations, improvement of the degree of freedom in terms of design, and reduction of limitation in terms of layout design.

In the electronic device according to the first embodiment or the second embodiment of the present disclosure including the above-described preferable forms, a sensor can be an image sensor, and the electronic device can be a solid-state imaging device. In this case, the image sensor can be a CMOS image sensor. However, without being limited thereto, the image sensor can also be a CCD image sensor. The image sensor may be a back-side illumination-type or may be a front-side illumination-type. The solid-state imaging device can be used as an image capturing portion (an image fetching portion) thereof in an electronic device (an electronic equipment) such as portable terminal equipment such as a portable telephone including an imaging function, a digital still camera, a single lens reflex camera, a camcorder, or a monitoring camera. Additionally, as the electronic device, a measuring apparatus, a measurement instrument, and a monitoring apparatus other than a camera can be exemplified. As the sensor, a distance measuring sensor (including a phase-difference sensor), an X-ray sensor, a biosensor (a fingerprint sensor, a vein sensor, or the like), a temperature sensor (a far-infrared sensor), a pressure sensor, a millimeter-wave sensor, an illuminance sensor, and a thermal sensor can be exemplified. Moreover, there can be provided a sensor in which the image sensor and these sensors are mixed.

Moreover, in the electronic device according to the first embodiment or the second embodiment of the present disclosure including the preferable forms described above, a depletion-type field effect transistor can be formed to have a complete depletion-type SOI structure, can be formed to have a partial depletion-type SOI structure, can be formed to have a fin structure (may also be referred to as the double-gate structure or the tri-gate structure), or can be formed to have a deeply depleted channel structure.

Furthermore, in the electronic device according to the first embodiment or the second embodiment of the present disclosure including the preferable forms described above, the signal processing portion or a low breakdown voltage transistor system circuit can include an analog-digital converter, and a portion of the analog-digital converter can have the depletion-type field effect transistor.

In the preferable configurations described above, the analog-digital converter can include a single slope-type analog-digital converter, a successive approximation-type analog-digital converter, and a delta-sigma modulation-type ($\Delta\Sigma$ modulation-type) analog-digital converter. In the preferable configurations and forms, the analog-digital converter can be formed to include a gray code counter. However, as the analog-digital converter, without being limited thereto, a flash type, a half flash type, a subranging type, a pipelined type, a bit-per-stage type, a magnitude amplifier type, and the like can be exemplified.

Otherwise, in the preferable configurations described above, one analog-digital converter can be provided with respect to a plurality of sensors. The analog-digital converter which is the single slope-type analog-digital converter can have a ramp voltage generator (reference voltage generator), a comparator to which an analog signal obtained by the sensor and a ramp voltage from the ramp voltage generator (reference voltage generator) are input, and a counter portion to which a clock is supplied from a clock supply portion and which operates based on an output signal of the comparator. At least a portion of the counter portion can have the depletion-type field effect transistor. In this case, the clock supply portion can have the depletion-type field effect transistor.

Otherwise, in the preferable configurations described above, the signal processing portion or the low breakdown voltage transistor system circuit can include the clock supply portion which is connected to the analog-digital converter. The clock supply portion can have the depletion-type field effect transistor. In this case, the clock supply portion can have a PLL circuit.

Here, in the single slope-type analog-digital converter, for example, in addition to the counter portion or the clock supply portion, a semiconductor device (FET) configuring a digital-analog converter (DA converter) included in the comparator or the ramp voltage generator (reference voltage generator) can also have the depletion-type field effect transistor. In the successive approximation-type analog-digital converter, for example, semiconductor device (FET) configuring a successive approximation clock generator, a successive approximation register, or an output register can have the depletion-type field effect transistor. In the delta-sigma modulation-type ($\Delta\Sigma$ modulation-type) analog-digital converter, for example, a semiconductor device (FET) configuring a delay circuit can have the depletion-type field effect transistor. Moreover, a semiconductor device (FET) configuring a timing control circuit, an image signal processing portion, or the like included in the electronic device can have the depletion-type field effect transistor.

Furthermore, in the electronic device according to the first embodiment or the second embodiment of the present disclosure including the preferable forms and configurations described above, the second semiconductor chip can further be provided with a memory portion. Otherwise, the electronic device can further include a third semiconductor chip that is provided with the memory portion. The semiconductor chips can be laminated in the order of the first semiconductor chip, the second semiconductor chip, and the third semiconductor chip. The memory portion may have a non-volatile memory or may have a volatile memory.

Furthermore, in the electronic device according to the first embodiment or the second embodiment of the present disclosure including the preferable forms and configurations described above, in the second semiconductor chip, the analog-digital converter can be arranged on an outer peripheral portion thereof. Otherwise, in the second semiconductor chip, the analog-digital converter can be arranged below the sensor portion.

In the electronic device according to the first embodiment or the second embodiment of the present disclosure, multiple sensors are arranged in the sensor portion. However, depending on the configuration and the structure of the electronic device, the multiple sensors may be arrayed in a two-dimensional matrix (in rows and columns), or may be arrayed in a one-dimensional shape (in lines). A silicon semiconductor substrate can be exemplified as a semiconductor substrate configuring a semiconductor chip. Although it depends on the structure and the configuration of the depletion-type field effect transistor to be formed, a so-called silicon on insulator (SOI) substrate can be exemplified. The lamination (bonding) of the first semiconductor chip and the second semiconductor chip can be performed based on an existing method. Electrical connection between the sensor portion formed in the first semiconductor chip and the signal processing portion formed in the second semiconductor chip, can be performed based on TC(S)V, for example, or can be performed through a bump based on a so-called chip-on-chip method. Otherwise, when laminating (bonding) the first semiconductor chip and the second semiconductor chip, the electrical connection can be achieved by directly joining an electrode formed in the first semiconductor chip and an electrode formed in the second semiconductor chip (based on the technology of joining electrodes of which surfaces are coated with insulating films and which are embedded in insulating films after being aligned with each other in positions). A high breakdown voltage transistor (high breakdown voltage MOS transistor) configuring the high breakdown voltage transistor system circuit indicates a transistor in which the thickness of a gate insulating layer of the high breakdown voltage transistor is set to be thicker than the thickness (a thickness approximately equal to or less than that of the gate insulating layer of an ordinary MOSFET) of the gate insulating layer of a low breakdown voltage transistor (low breakdown voltage MOS transistor) configuring the low breakdown voltage transistor system circuit so as to be able to operate under a high voltage with no problem. In some cases, the low breakdown voltage transistor may be included in the high breakdown voltage transistor system circuit.

Example 1

Example 1 relates to the electronic device according to the first embodiment and the second embodiment of the present disclosure. A conceptual diagram of the electronic device of Example 1 is illustrated in FIG. 1.

To be described in accordance with the electronic device according to the first embodiment of the present disclosure, an electronic device 10A of Example 1 includes a first semiconductor chip 20 that has a sensor portion 21 in which a plurality of sensors 40 are arranged, and a second semiconductor chip 30 that has a signal processing portion 31 in which a signal obtained by the sensors 40 is processed. The first semiconductor chip 20 and the second semiconductor chip 30 are laminated. At least a portion of the signal processing portion 31 has a depletion-type field effect transistor. The multiple sensors 40 are arranged in the two-dimensional matrix (in rows and columns). The same condition is applied to the following description. In FIG. 1, for convenience of description, the first semiconductor chip 20 and the second semiconductor chip 30 are illustrated in a state of being separated from each other.

To be described in accordance with the electronic device according to the second embodiment of the present disclosure, an electronic device 10A of Example 1 includes a first semiconductor chip 20 that has a sensor portion 21 in which a plurality of sensors 40 are arranged, and a second semiconductor chip 30 that has a signal processing portion 31 in which a signal obtained by the sensors 40 is processed. The first semiconductor chip 20 and the second semiconductor chip 30 are laminated. The signal processing portion 31 has a high breakdown voltage transistor system circuit and a low breakdown voltage transistor system circuit. At least a portion of the low breakdown voltage transistor system circuit has a depletion-type field effect transistor.

The depletion-type field effect transistor has a complete depletion-type SOI structure, has a partial depletion-type SOI structure, has a fin structure (also referred to as the double-gate structure or the tri-gate structure), or has a deeply depleted channel structure. The configurations and the structures of these depletion-type field effect transistors will be described below.

Figure 2:
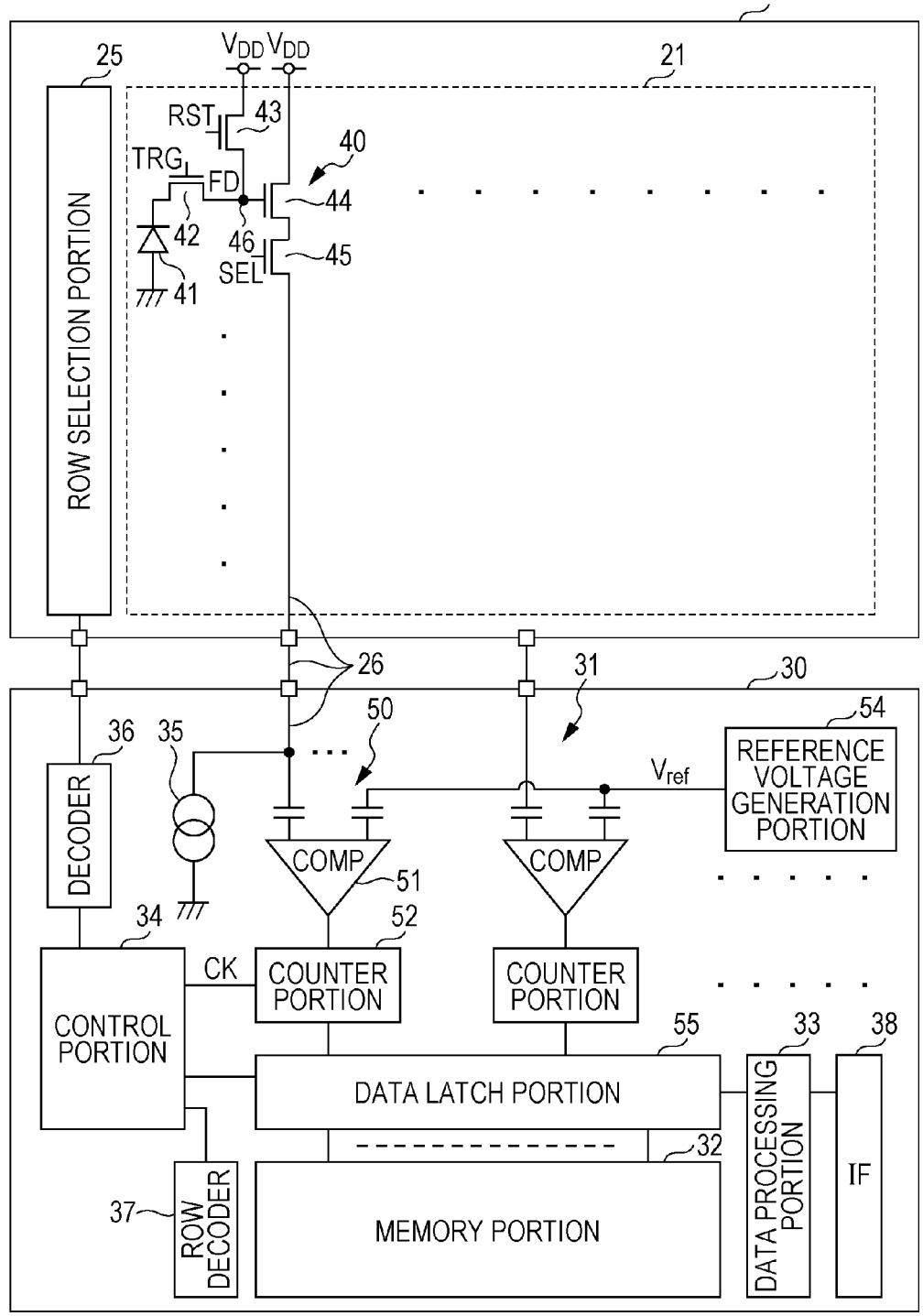
FIG. 2 is a circuit diagram illustrating a specific configuration of a circuit on a first semiconductor chip side and a circuit on a second semiconductor chip side in the electronic device of Example 1.
Figure 4:
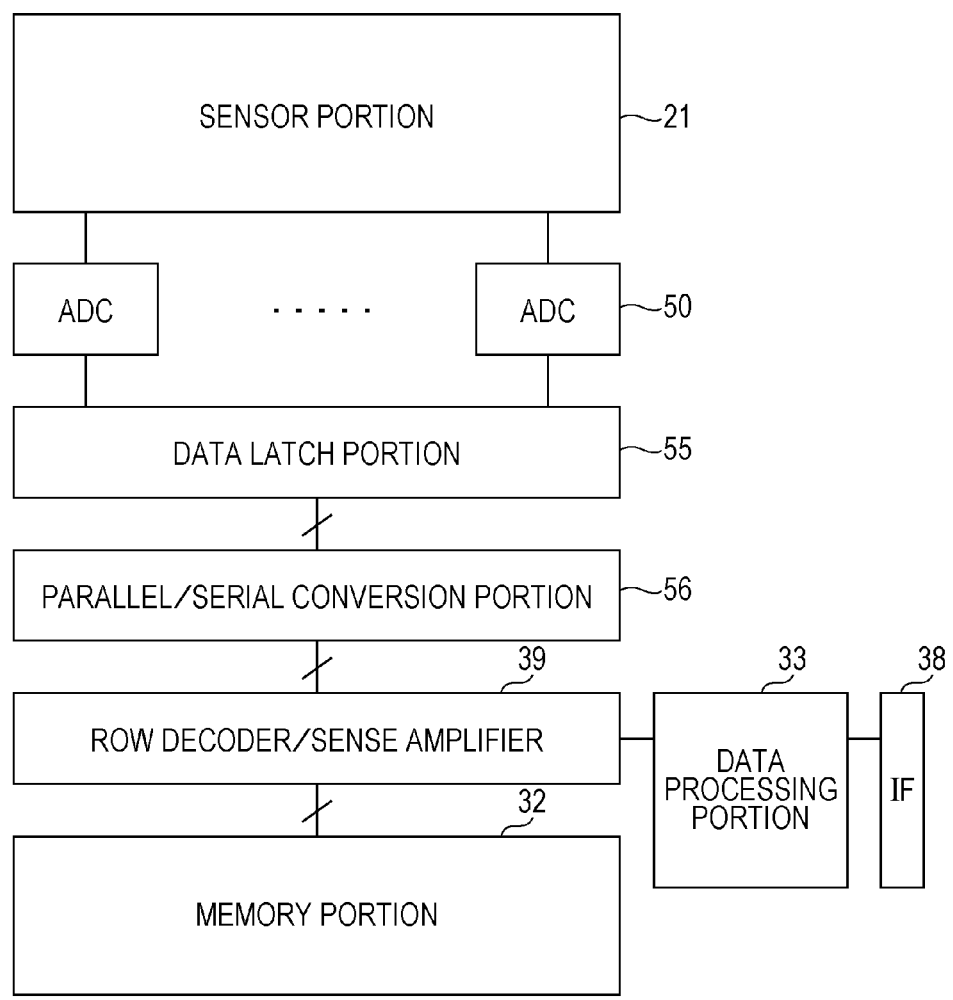
FIG. 4 is a block diagram illustrating a specific example of a configuration of a signal processing portion in the electronic device of Example 1.

Specifically, as illustrated in FIGS. 2 and 4, the sensor portion 21 and a row selection portion 25 are disposed in the first semiconductor chip 20. On the other hand, the signal processing portion 31 is disposed in the second semiconductor chip 30. The signal processing portion 31 has an analog-digital converter (hereinafter, abbreviated to "AD converter") 50 including a comparator 51 and a counter portion 52, a ramp voltage generator (hereinafter, may also be referred to as the "reference voltage generator") 54, a data latch portion 55, a parallel/serial conversion portion 56, a memory portion 32, a data processing portion 33, a control portion 34 (including the clock supply portion connected to the AD converter 50), a current source 35, a decoder 36, a row decoder 37, and an interface (IF) portion 38.

In the electronic device of Example 1, the high breakdown voltage transistor system circuit (the specific configuration circuit will be described later) in the second semiconductor chip 30 and the sensor portion 21 in the first semiconductor chip 20 planarly overlap with each other. In the second semiconductor chip 30, the shading region is formed above the high breakdown voltage transistor system circuit which faces the sensor portion 21 of the first semiconductor chip 20. In the second semiconductor chip 30, the shading region which is arranged below the sensor portion 21 can be secured by appropriately arranging wiring (not illustrated) formed in the second semiconductor chip 30. In the second semiconductor chip 30, the AD converter 50 is arranged below the sensor portion 21. Here, the signal processing portion 31 or the low breakdown voltage transistor system circuit (the specific configuration circuit will be described later) includes a portion of the AD converter 50, and at least a portion of the AD converter 50 has the depletion-type field effect transistor. Specifically, the AD converter 50 has a single slope-type AD converter of which the circuit diagram is illustrated in FIG. 2. Otherwise, regarding the electronic device of Example 1, as another layout, the high breakdown voltage transistor system circuit in the second semiconductor chip 30 and the sensor portion 21 in the first semiconductor chip 20 can be configured not to planarly overlap with each other. In other words, in the second semiconductor chip 30, a portion and the like of the analog-digital converter 50 are arranged on the outer periphery portion of the second semiconductor chip 30. Accordingly, it is not necessary to form the shading region, and thus, it is possible to achieve simplification of steps, structures, and configurations, improvement of the degree of freedom in terms of design, and reduction of limitation in layout design.

One AD converter 50 is provided with respect to the multiple sensors 40 (in Example 1, the sensors 40 belonging to one sensor column). The AD converter 50 which is the single slope-type analog-digital converter has the ramp voltage generator (reference voltage generator) 54, the comparator 51 to which an analog signal obtained by the sensors 40 and a ramp voltage from the ramp voltage generator (reference voltage generator) 54 are input, and the counter portion 52 to which a clock CK is supplied from the clock supply portion (not illustrated) provided in the control portion 34 and which operates based on an output signal of the comparator 51. The clock supply portion connected to the AD converter 50 is included in the signal processing portion 31 or the low breakdown voltage transistor system circuit (more specifically, included in the control portion 34) and has an existing PLL circuit. At least a portion of the counter portion 52, and the clock supply portion have the depletion-type field effect transistor.

In other words, in Example 1, in addition to the below-described column selection portion 27, the sensor portion 21

(sensors 40) and the row selection portion 25 which are provided in the first semiconductor chip 20 correspond to the high breakdown voltage transistor system circuit. The comparator 51 which configures the AD converter 50, the ramp voltage generator (reference voltage generator) 54, the current source 35, the decoder 36, and the interface (IF) portion 38 in the signal processing portion 31 provided in the second semiconductor chip 30 correspond to the high breakdown voltage transistor system circuit. On the other hand, the counter portion 52 which configure the AD converter 50, the data latch portion 55, the parallel/serial conversion portion 56, the memory portion 32, the data processing portion 33 (including the image signal processing portion), the control portion 34 (including the clock supply portion and the timing control circuit connected to the AD converter 50), and the row decoder 37 in addition to the below-described multiplexer (MUX) 57 and data compression portion 58 in the signal processing portion 31 provided in the second semiconductor chip 30 correspond to the low breakdown voltage transistor system circuit. All the counter portions 52 and the clock supply portion which is included in the control portion 34 have the depletion-type field effect transistor.

In order to obtain a lamination structure of the first semiconductor chip 20 and the second semiconductor chip 30, initially, based on an existing method, the various predetermined circuits described above are formed on a first silicon semiconductor substrate configuring the first semiconductor chip 20 and a second silicon semiconductor substrate configuring the second semiconductor chip 30. Then, the first silicon semiconductor substrate and the second silicon semiconductor substrate are bonded together based on an existing method. Subsequently, a penetration hole extending from wiring formed on the first silicon semiconductor substrate side to the wiring formed on the second silicon semiconductor substrate is formed, and the penetration hole is filled with a conductive material, thereby forming the TC(S)V. Thereafter, a color filter and a microlens are formed in the sensor 40 as desired, and then, the bonding structure of the first silicon semiconductor substrate and the second silicon semiconductor substrate are subjected to dicing. Thus, it is possible to obtain the electronic device 10A in which the first semiconductor chip 20 and the second semiconductor chip 30 are laminated.

In Examples 1 to 7, the sensor 40 is specifically the image sensor, and is more specifically the CMOS image sensor having an existing configuration and structure. The electronic device 10A has the solid-state imaging device. The solid-state imaging device is an X-Y address-type solid-state imaging device which can read out a signal (analog signal) from the sensor 40 in each sensor group by one sensor as a unit, by multiple sensors as a unit, or by one or multiple rows (lines) as a unit. In the sensor portion 21, a control line is wired for each sensor row (row control line) and a signal line (column signal line/vertical signal line) 26 is wired for each sensor column with respect to sensor arrays in rows and columns. Each signal line 26 can be connected to the current source 35. A signal (analog signal) is read out from the sensor 40 of the sensor portion 21 through the signal line 26. For example, the reading out can be performed under rolling shutters in which exposure is carried out having the sensor group of one sensor or one line (one row) as a unit. The reading out under the rolling shutters may also be referred to as the "rolling reading out".

In a peripheral edge portion of the first semiconductor chip 20, pad portions 22$_1$ and 22$_2$ to be electrically connected to the outside, and via portions 23$_1$ and 23$_2$ having the TC(S)V structure to be electrically connected to the second semiconductor chip 30 are provided. In the drawings, via portions may be indicated as "VIA". Here, the pad portion 22$_1$ and the pad portion 22$_2$ are provided on both the right and left sides interposing the sensor portion 21 therebetween. However, the pad portion can be provided on either the right or left side. The via portion 23$_1$ and the via portion 23$_2$ are provided on both the upper and lower sides interposing the sensor portion 21 therebetween. However, the via portion can be provided on either the upper or lower side. A bonding pad portion is provided in the second semiconductor chip 30 on the lower side, and an opening portion is provided in the first semiconductor chip 20. It is possible to adopt a configuration in which wire bonding is performed to the bonding pad portion provided in the second semiconductor chip 30 through the opening portion provided in the first semiconductor chip 20, or have a configuration of substrate mounting by adopting the TC(S)V structure from the second semiconductor chip 30. Otherwise, the electrical connection between the circuit in the first semiconductor chip 20 and the circuit in the second semiconductor chip 30 can be achieved through a bump based on the chip-on-chip method. The analog signal obtained from each sensor 40 of the sensor portion 21 is transmitted from the first semiconductor chip 20 to the second semiconductor chip 30 through the via portions 23$_1$ and 23$_2$. In the specification, the concepts of the "left side", the "right side", the "upper side", the "lower side", the "upper and lower", the "vertical direction", the "right and left", and the "transverse direction" indicate a relatively positional relationship when viewing the drawings. Hereinafter, the same will be applied.

The circuit configuration on the first semiconductor chip 20 side will be described using FIG. 2. On the first semiconductor chip 20 side, in addition to the sensor portion 21 in which the sensors 40 are arranged in rows and columns, there is provided the row selection portion 25 which selects each sensor 40 of the sensor portion 21 by row as a unit based on an address signal applied from the second semiconductor chip 30 side. Here, the row selection portion 25 is provided on the first semiconductor chip 20. However, the row selection portion 25 can be provided on the second semiconductor chip 30 side as well.

As illustrated in FIG. 2, the sensor 40 has a photodiode 41 as a photoelectric converting element, for example. In addition to the photodiode 41, the sensor 40 has four transistors, for example, a transfer transistor (transfer gate) 42, a reset transistor 43, an amplification transistor 44, and a selection transistor 45. As the four transistors 42, 43, 44, and 45, N-channel-type transistors are used, for example. However, the conductive-type combination of the transfer transistor 42, the reset transistor 43, the amplification transistor 44, and the selection transistor 45 exemplified herein is merely an example, without being limited to the combination. In other words, it is possible to provide a combination using P-channel-type transistors as necessary. The transistors 42, 43, 44, and 45 are the high breakdown voltage MOS transistors. In other words, the sensor portion 21 is the high breakdown voltage transistor system circuit in its entirety, as described above.

With respect to the sensor 40, a transfer signal TRG, a reset signal RST, and a selection signal SEL which are drive signals to drive the sensor 40 are appropriately applied from the row selection portion 25. In other words, the transfer signal TRG is applied to a gate electrode of the transfer transistor 42, the reset signal RST is applied to a gate electrode of the reset transistor 43, and the selection signal SEL is applied to a gate electrode of the selection transistor 45.

In the photodiode 41, an anode electrode is connected to a low potential side power supply (for example, to a ground), and received light (incident light) is photoelectrically converted into a photoelectrical charge (herein, photoelectron) having an electrical charge in accordance with an amount of light thereof, thereby accumulating the photoelectrical charge. A cathode electrode of the photodiode 41 is electrically connected to a gate electrode of an amplification transistor 44 through the transfer transistor 42. A node 46 which is electrically linked to the gate electrode of the amplification transistor 44 is referred to as the floating diffusion portion (FD/floating diffusion region portion).

The transfer transistor 42 is connected between the cathode electrode of the photodiode 41 and a FD portion 46. A transfer signal TRG of which the high level (for example, $V_{DD}$ level) is active (hereinafter, expressed as "highly active") is applied from the row selection portion 25 to the gate electrode of the transfer transistor 42. In response to the transfer signal TRG, the transfer transistor 42 is in a conduction state, and the photoelectrical charge which is photoelectrically converted in the photodiode 41 is transferred to the FD portion 46. A drain region of the reset transistor 43 is connected to a sensor power supply $V_{DD}$, and a source region is connected to the FD portion 46. The highly active reset signal RST is applied from the row selection portion 25 to the gate electrode of the reset transistor 43. In response to the reset signal RST, the reset transistor 43 is in the conduction state, and the electrical charge of the FD portion 46 is discarded to the sensor power supply $V_{DD}$, thereby resetting the FD portion 46. The gate electrode of the amplification transistor 44 is connected to the FD portion 46, and the drain region is connected to the sensor power supply $V_{DD}$. Then, the amplification transistor 44 outputs the electrical potential of the FD portion 46 which has been reset by the reset transistor 43 as a reset signal (reset level: $V_{Reset}$). Furthermore, the amplification transistor 44 outputs the electrical potential of the FD portion 46 of which the signal charge has been transferred by the transfer transistor 42 as a photoelectrical accumulation signal (signal level) $V_{Sig}$. For example, the drain region of the selection transistor 45 is connected to the source region of the amplification transistor 44, and the source region is connected to the signal line 26. The highly active selection signal SEL is applied from the row selection portion 25 to the gate electrode of the selection transistor 45. In response to the selection signal SEL, the selection transistor 45 is in the conductive state, and the sensor 40 is in a selection state, and thus, the signal (analog signal) of the signal level $V_{Sig}$ which is output from the amplification transistor 44 is transmitted out to the signal line 26.

In this manner, the electrical potential of the FD portion 46 which has been reset is read out as the reset level $V_{Reset}$, and then, the electrical potential of the FD portion 46 of which the signal charge has been transferred is read out as signal level $V_{Sig}$, sequentially from the sensor 40 to the signal line 26. The signal level $V_{Sig}$ includes the component of the reset level $V_{Reset}$. Regarding the selection transistor 45, the circuit configuration is adopted to be connected between the source region of the amplification transistor 44 and the signal line 26. However, it is possible to adopt a circuit configuration to be connected between the sensor power supply $V_{DD}$ and the drain region of the amplification transistor 44.

The sensor 40 is not limited to the configuration of adopting such four transistors. For example, a configuration of three transistors in which the amplification transistor 44 also functions as the selection transistor 45, a configuration in which the transistors after the FD portion 46 are shared between a plurality of the photoelectric converting elements (between the sensors), and the like can be adopted regardless of the configuration of the circuit.

As illustrated in FIGS. 1, 2, and 4 and described above, in the electronic device 10A of Example 1, the memory portion 32, the data processing portion 33, the control portion 34, the current source 35, the decoder 36, the row decoder 37, the interface (IF) portion 38, and the like are provided in the second semiconductor chip 30, in which a sensor drive portion (not illustrated) which drives each sensor 40 of the sensor portion 21 is also provided. In the signal processing portion 31, a predetermined signal processing including digitization (AD conversion) in parallel (column parallel) can be performed by sensor column as a unit with respect to an analog signal which is read out from each sensor 40 of the sensor portion 21 for each sensor TOW. The signal processing portion 31 has the AD converter 50 digitizing an analog signal which is read out from each sensor 40 of the sensor portion 21 to the signal line 26, and transfers image data (digital data) which is subjected to the AD conversion to the memory portion 32. The memory portion 32 stores the image data which is subjected to predetermined signal processing in the signal processing portion 31. The memory portion 32 may have a non-volatile memory or may have a volatile memory. The data processing portion 33 reads out the image data stored in the memory portion 32 in a predetermined order, and performs various processing, thereby outputting the image data outside the chip. The control portion 34 controls each operation in the signal processing portion 31 such as a sensor drive portion, the memory portion 32, and the data processing portion 33 based on reference signals, for example, a horizontal synchronizing signal XHS, a vertical synchronizing signal XVS, and a master clock MCK which are applied from the outside of the chip. In this case, the control portion 34 performs the controlling and performs the synchronization between the circuit on the first semiconductor chip 20 side (the row selection portion 25 or the sensor portion 21) and the signal processing portion 31 on the second semiconductor chip 30 side (the memory portion 32, the data processing portion 33, and the like).

The current source 35 is connected to each signal line 26 to which analog signals are read out from each sensor 40 of the sensor portion 21 for each sensor column. For example, the current source 35 has a so-called load MOS circuit configuration having an MOS transistor of which the gate potential is biased to a constant potential so as to supply a constant electrical current to the signal line 26. The current source 35 having the load MOS circuit supplies the constant current to amplification transistor 44 of the sensor 40 included in the selected row, thereby operating the amplification transistor 44 as a source follower. The decoder 36 applies an address signal which designates an address of a selected row to the row selection portion 25 when selecting each sensor 40 of the sensor portion 21 by row as a unit under the controlling of the control portion 34. The row decoder 37 designates a row address when writing image data to the memory portion 32, or reading out image data from the memory portion 32 under the controlling of the control portion 34.

As described above, the signal processing portion 31 has at least the AD converter 50 which digitizes (AD conversion) an analog signal read out from each sensor 40 of the sensor portion 21 through the signal line 26, and performs the signal processing (column parallel AD) in parallel by sensor column as a unit with respect to the analog signal.

The signal processing portion 31 has the ramp voltage generator (reference voltage generator) 54 which generates a reference voltage $V_{ref}$ which is used at the time of the AD conversion in the AD converter 50. The reference voltage generator 54 generates the reference voltage $V_{ref}$ having a so-called ramp waveform (inclined waveform) of which the voltage value exhibits stepwise changes with the lapse of time. For example, the reference voltage generator 54 can be configured by using the DA converter (digital-analog converter), without being limited thereto.

For example, the AD converter 50 is provided in each sensor column of the sensor portion 21, that is, for each signal line 26. In other words, the AD converter 50 is a so-called column parallel AD converter which is arranged as many as the number of the sensor columns in the sensor portion 21. For example, the AD converter 50 generates a pulse signal having the magnitude (the width of a pulse) in a time axis direction corresponding to the magnitude of the level of the analog signal, and measures the period length of the width of a pulse of the pulse signal, thereby processing the AD conversion. More specifically, as illustrated in FIG. 2, the AD converter 50 has at least the comparator (COMP) 51 and the counter portion 52. The comparator 51 takes the analog signal (the signal level $V_{Sig}$ and the reset level $V_{Reset}$ described above) which is read out from each sensor 40 of the sensor portion 21 through the signal line 26 as a comparison input, and takes the reference voltage $V_{ref}$ having the ramp waveform supplied from the reference voltage generator 54 as a reference input, thereby comparing both of the inputs. The ramp waveform is a waveform of which a voltage changes in an inclined state (stepwise) with the lapse of time. For example, an output of the comparator 51 is in a first state (for example, high level) when the reference voltage $V_{ref}$ becomes higher than the analog signal. On the other hand, when the reference voltage $V_{ref}$ is equal to or lower than the analog signal, the output thereof is in a second state (for example, low level). The output signal of the comparator 51 becomes a pulse signal having the width of a pulse corresponding to the magnitude of the level of the analog signal.

For example, an up/down counter is used as the counter portion 52. The clock CK is applied to the counter portion 52 at the same timing as the supply start timing of the reference voltage $V_{ref}$ to the comparator 51. The counter portion 52 which is an up/down counter performs a down count or an up count being synchronized with the clock CK, thereby measuring the period of the width of a pulse of the output pulse from the comparator 51, that is, the comparison period from the beginning of a comparison operation to the ending of the comparison operation. During the measuring operation, regarding the reset level $V_{Reset}$ and the signal level $V_{Sig}$ which are sequentially read out from the sensors 40, the counter portion 52 performs a down-count with respect to the reset level $V_{Reset}$, and performs an up-count with respect to the signal level $V_{Sig}$. Then, it is possible to obtain a difference between the signal level $V_{Sig}$ and the reset level $V_{Reset}$ on account of the operations of the down-count and up-count. As a result, in addition to the AD conversion processing, correlated double sampling (CDS) processing is performed in the AD converter 50. Here, the "CDS processing" indicates processing for eliminating fixed pattern noise typical of the sensor such as a threshold variation of the amplification transistor 44 or reset noise of the sensor 40 by obtaining the difference between the signal level $V_{Sig}$ and the reset level $V_{Reset}$. Thus, the result of the count (count value) by the counter portion 52 becomes a digital value (image data) in which an analog signal is digitized.

Figure 3:
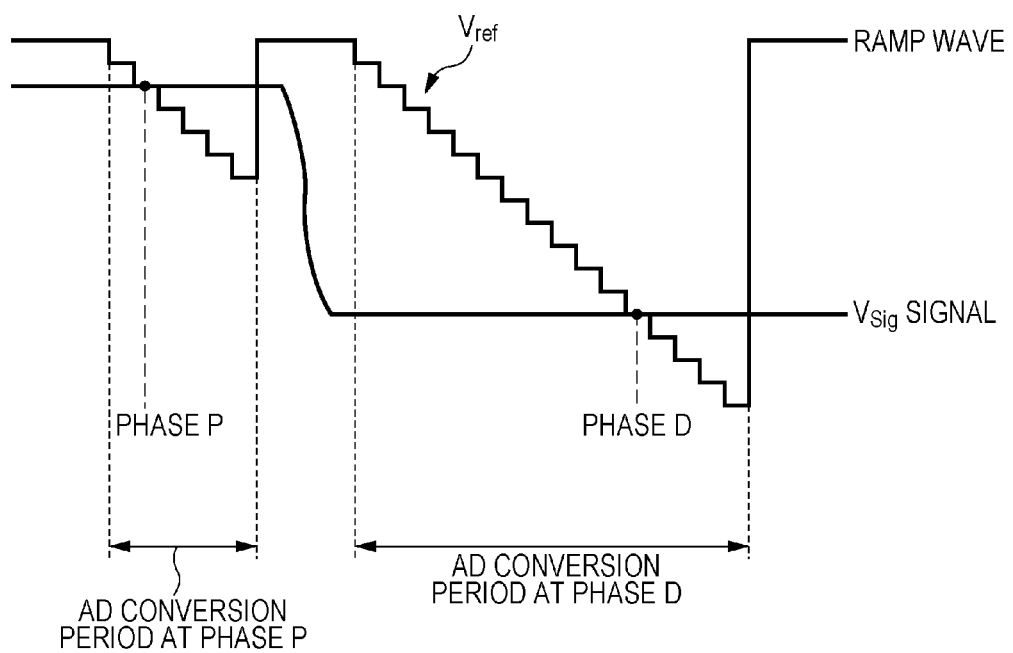
FIG. 3 is a timing chart for illustrating an operation of a single slope-type analog-digital converter in the electronic device of Example 1.

Moreover, another example of the timing chart of the single slope-type analog-digital converter will be illustrated in FIG. 3. In the comparators 51 which are arranged for each column, an analog signal (signal level $V_{Sig}$) from the sensor 40 is compared with a reference signal $V_{ref}$ which changes stepwise. In this case, the levels of the analog signal (signal level $V_{Sig}$) and the reference signal $V_{ref}$ intersect with each other, and then, the count is performed in the counter portion 52 by using a reference clock PLLCK until the output of the comparator 51 is inverted. Accordingly, the analog signal is converted into a digital signal (that is, subjected to the AD conversion). The counter portion 52 has the down counter. The AD conversion is performed twice for one reading out of the analog signal. In other words, the AD conversion of the sensor 40 at the reset level (phase P) is performed for the first time. In the reset level phase P, variations of each sensor are included. For the second time, the analog signals obtained from each sensor 40 is read out to the signal line 26 (phase D), thereby executing the AD conversion. Since the phase D also includes the variations of each sensor, it is possible to realize the processing of the correlated double sampling (CDS) by executing (phase D level-phase P level).

A specific configuration example of the signal processing portion 31 in the electronic device 10A of Example 1 is illustrated in the block diagram of FIG. 4. The signal processing portion 31 includes the data latch portion 55 and the parallel/serial conversion portion 56 in addition to the AD converter 50, and have a pipelined configuration in which image data digitized in the AD converter 50 is subjected to pipeline transferring to the memory portion 32. In this case, the signal processing portion 31 performs digitization processing by the AD converter 50 during one horizontal period, and performs the processing in which the digitized image data is transferred to the data latch portion 55 during the next one horizontal period. Here, the data latch portion 55 latches the digitized image data in the AD converter 50. The parallel/serial conversion portion 56 converts the image data output from the data latch portion 55 from the parallel data to the serial data. Meanwhile, in the memory portion 32, a column decoder/sense amplifier 39 is provided as a peripheral circuit thereof. The row decoder 37 (refer to FIG. 2) designates a row address with respect to the memory portion 32. In contrast, the column decoder designates a column address with respect to the memory portion 32. The sense amplifier amplifies a feeble voltage which is read out from the memory portion 32 through a bit line, to a level which can be handled as a digital level. The image data read out through the column decoder/sense amplifier 39 is output to the outside of the second semiconductor chip 30 through the data processing portion 33 and an interface portion 38. In the drawing, the "parallel/serial conversion portion" is expressed as "parallel/serial conversion portion". The parallel/serial conversion portion 56 and the column decoder/sense amplifier 39 are not illustrated in FIG. 2.

In the above description, there is provided one AD converter 50 for the column parallel. However, without being limited thereto, it is possible to provide two or more of the AD converters 50 so as to perform the digitization processing in parallel in two or more of the AD converters 50. In this case, two or more of the AD converters 50 may be arranged in an extending direction of the signal line 26 of the sensor portion 21, that is, being divided on both the upper and lower sides of the sensor portion 21. When providing two or more of the AD converters 50, it is preferable to provide two (two systems) or more of the data latch portion 55, the parallel/serial conversion portion 56, the memory portion 32, and the like to correspond thereto. As described above, in the electronic device in which two systems of the AD converter 50 and the like are provided, for example, row scanning is performed by two sensor rows as a unit. The analog signal of each sensor 40 in the sensor row on one side is read out on one side in the vertical direction of the sensor portion 21, and the analog signal of each sensor 40 in the sensor row on the other side is read out on the other side in the vertical direction of the sensor portion 21 respectively. In this manner, the digitization processing may be performed in parallel in two AD converters 50. The succeeding signal proceeding is also performed in parallel. As a result, compared to a case where the scanning is performed by one sensor row as a unit, it is possible to realize high-speed reading out of the image data.

In this manner, since the electronic device 10A of Example 1, the solid-state imaging device in which the first semiconductor chip 20 and the second semiconductor chip 30 are laminated may have a minimal size (area) as long as the sensor portion 21 can be formed as the first semiconductor chip 20 therein, not only the size (area) of the first semiconductor chip 20 but also the size of the chip in its entirety can be minimized. Moreover, since a process suitable for producing the sensor 40 can be applied to the first semiconductor chip 20, and a process suitable for producing various circuits can be applied to the second semiconductor chip 30 respectively, it is possible to achieve optimization for the processes when producing the electronic device 10A. The analog signal is transmitted from the first semiconductor chip 20 side to the second semiconductor chip 30 side. On the other hand, the portion of the circuit performing the analog-digital processing is provided within the same substrate (the second semiconductor chip 30), the synchronization is performed between the circuit on the first semiconductor chip 20 side and the circuit on the second semiconductor chip 30 side, and the controlling is performed, thereby making it possible to realize the high-speed processing.

A circuit operation of the electronic device 10A of Example 1 will be described using the timing chart in FIG. 5. Here, in the electronic device 10A of Example 1, digitized image data is transferred to the memory portion 32 at a first speed which is faster than a frame rate. The memory portion 32 retains the transferred image data. The data processing portion 33 reads out the image data from the memory portion 32 at a second speed which is slower than the first speed. The control portion 34 performs controlling to stop an operation of the current source 35 which is connected to the signal line 26 and to stop at least an operation of the AD converter 50 when reading out the image data from the memory portion 32. The control portion 34 stops the operation of the current source 35 and the operation of the AD converter 50 by vertical synchronizing signal as a unit.

In other words, in the signal processing portion 31 of the electronic device 10A of Example 1, the digitized image data is transferred to the memory portion 32 at the first speed which is faster than the frame rate. Then, the transferred image data is retained in the memory portion 32. Moreover, the image data is read out from the memory portion 32 at the second speed which is slower than the first speed by the data processing portion 33. Furthermore, the control portion 34 performs the controlling stopping the operation of the current source 35 which is connected to the signal line 26 and to stop at least the operation of the AD converter 50 when reading out the image data from the memory portion 32. In this manner, it is possible to realize the high-speed reading out which is faster than the frame rate by transferring (so-called high-speed transferring) the image data to the memory portion 32 at the first speed which is faster than the frame rate. Moreover, it is possible to realize the low power consumption as much as the amount by which the operation speed slowed, by performing the reading out of the image data from the memory portion 32 at the second speed which is slower than the first speed (so-called low speed reading out). In addition, electricity can be reduced as much as the amount by which the current source 35 and the AD converter 50 are supposed to consume during the stop period by performing so-called intermittent drive stopping the operation of the current source 35 and at least the operation of the AD converter 50 when reading out the image data from the memory portion 32, and thus, the low power consumption can be further achieved.

Specifically, first, the analog signal is read out at a reading out speed faster than the frame speed, for example, at a high reading out speed of 240 fps from the each sensor 40 of the sensor portion 21 on the first semiconductor chip 20 side through the rolling reading out which is performed under a rolling shutter. The analog signal read out through the rolling reading out is transmitted from the first semiconductor chip 20 to the signal processing portion 31 on the second semiconductor chip 30 side through the via portions $23_1$ and $23_2$.

Subsequently, in the signal processing portion 31, the analog signal is digitized by the AD converter 50. Then, the image data digitized in the AD converter 50 is subjected to the pipeline transferring to the memory portion 32, thereby being stored in the memory portion 32. In this case, in the signal processing portion 31, the digitization processing is performed by the AD converter 50 during one horizontal period, and the pipeline transferring to the memory portion 32 is performed during the next one horizontal period. The speed transferring the image data to the memory portion 32 after being subjected to the digitization processing is a reading out speed through the rolling reading out, that is, 240 fps. Therefore, in the signal processing portion 31, the image data digitized in the AD converter 50 is transferred to the memory portion 32 at a speed (first speed) faster than the frame rate.

Incidentally, since exposure timing in one image differs by each sensor or by each line (row) in the rolling reading out performed under the rolling shutter, there is an occurrence of distortion (hereinafter, may also be referred to as the "rolling distortion"). In contrast, in Example 1, the analog signal is read out from each of the sensors 40 through the high-speed reading out which is faster than the frame rate, and the digitized image data is subjected to the high-speed transferring to the memory portion 32 at the first speed which is faster than the frame rate, thereby being stored. In this manner, synchronization of the image data can be achieved by storing the image data in the memory portion 32 temporarily, and thus, it is possible to prevent the occurrence of the rolling distortion.

The image data stored in the memory portion 32 is read out by the data processing portion 33 through the column decoder/sense amplifier 39 at the reading out speed of the second speed which is slower than the first speed, for example, 80 fps, thereby being output to the outside of the second semiconductor chip 30 through the interface portion 38. In this manner, the low power consumption can be achieved as much as the amount by which the operation speed slowed, by performing the reading out of the image data from the memory portion 32 at the second speed which is slower than the first speed (so-called low speed reading out).

Figure 5:
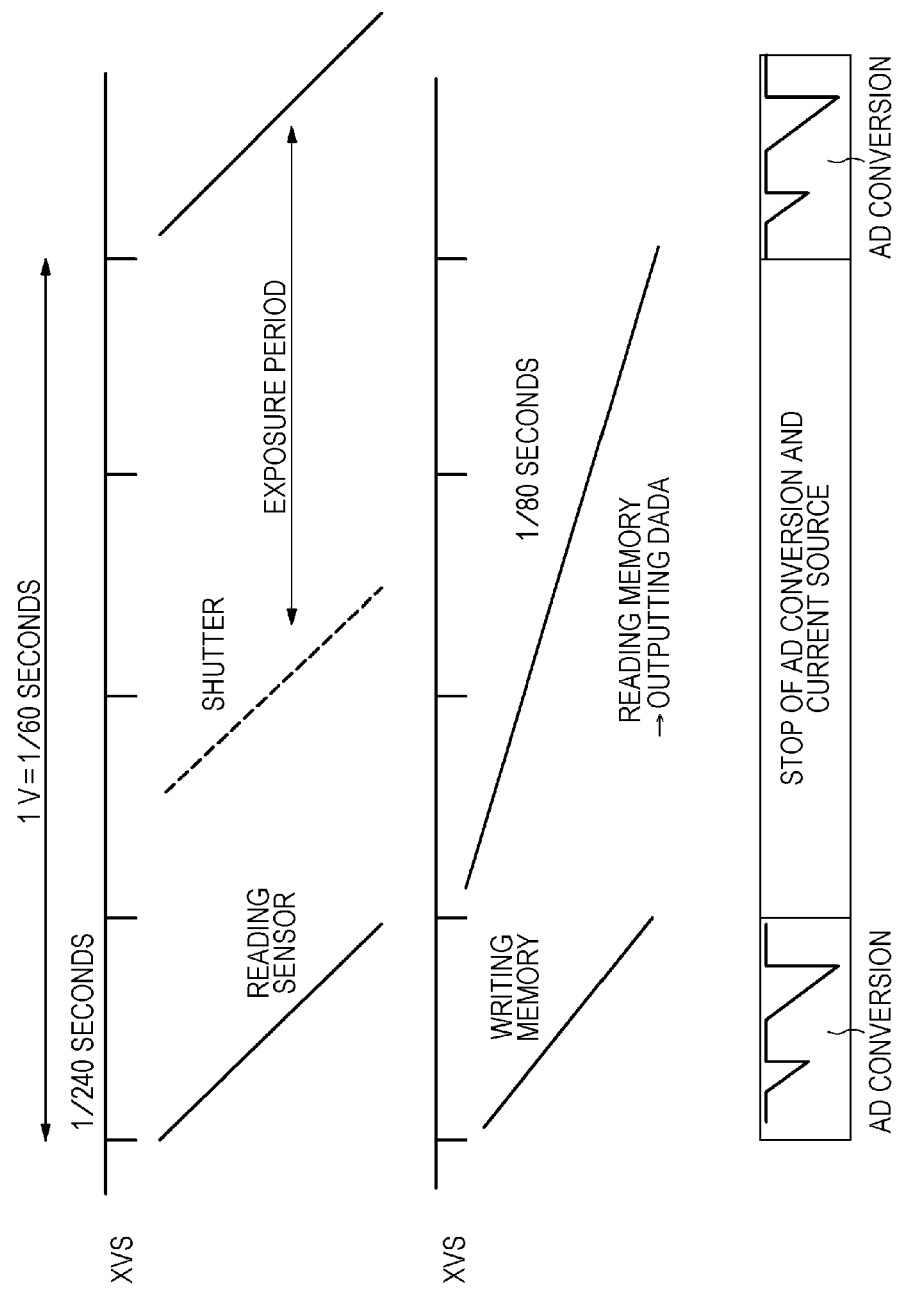
FIG. 5 is a timing chart for illustrating a circuit operation in the electronic device of Example 1.

As it is obvious from the timing chart in FIG. 5, the reading out of the image data from the memory portion 32 is performed during the exposure period. For example, according to a configuration in the related art disclosed in Japanese Unexamined Patent Application Publication No. 2004-64410, image data is in a standby state after being stored in a memory portion, and then, imaging starts thereafter. Therefore, it is difficult to perform real-time imaging. In contrast, in Example 1, the reading out of the image data from the memory portion 32 is performed during the exposure period, and thus, it is possible to perform the real-time reading out of the image data of moving pictures and still images.

As the memory portion 32, various types of memory can be used regardless of non-volatile or volatile. For example, it is possible to make a refresh operation be no longer necessary in which the volatile memory (for example, DRAM) takes approximately 50 milliseconds to perform the processing from the beginning of the writing of the image data in the memory portion 32 to the completing of the reading out of the image data by the data processing portion 33 at a speed of equal to or faster than 20 fps. Meanwhile, in the CMOS image sensor which is currently used, the AD conversion and the data outputting are performed through the pipeline transferring at approximately several microseconds. The writing speed in DRAM is equal to or less than the transferring speed equivalent thereto, that is, equal to or less than several microseconds. Therefore, it is possible to perform from the reading out of the analog signal to the writing of the image data of the memory portion 32 in such a pipeline configuration illustrated in FIG. 4. Specifically, the digitization processing is executed in the AD converter 50 during one horizontal period (XHS), and the digital data (image data) is transferred to the data latch portion 55 during the next one horizontal period, thereby being stored in the data latch portion 55. Thereafter, the image data is converted from the parallel signal to the serial signal in the parallel/serial conversion portion 56, thereby being written in the memory portion 32 and the row decoder 37 designates the row address and the column decoder of the column decoder/sense amplifier 39 designates the column address. In other words, after the image data is subjected to the AD conversion in parallel in the AD converter 50 and is latched in the data latch portion 55, and the image data is written in parallel in the memory portion 32, thereby realizing the pipeline transferring. In addition to the pipeline transferring in which the image data can be written from the data latch portion 55 to the memory portion 32 during one horizontal period, it is possible to adopt a method of pipeline transferring in which the image data is stored in the data latch portion 55, memory writing is performed during the next one horizontal period, and the digital data (image data) of the next row is stored in the data latch portion 55.

In order to achieve more enhanced low power consumption, Example 1 adopts a configuration of "standby during the frame period" in which the operation of the current source 35 that is connected to each signal line 26 and at least the operation of the AD converter 50 are stopped, for example, by vertical synchronizing signal XVS as a unit when reading out the image data from the memory portion 32. Here, the expression "when reading out the image data from the memory portion 32" can be referred to as the time after the image data is stored in the memory portion 32 at a high speed through the pipeline transferring, or can be referred to as "during the exposure period". There is a technology in the related art in which power supply to an analog front end circuit including an AD converter is shut down to be in the standby state during the imaging (exposure) period in order to achieve the low power consumption (for example, refer to Japanese Unexamined Patent Application Publication No. 2006-81048). According to this technology disclosed in the publication, since the standby state continues from the ending of the reading out of the analog signal to the beginning of the exposure, it is difficult to perform the high-speed driving. Moreover, the stop period varies in accordance with the exposure time, thereby being limited in suppressing the power supply from varying or an effect of the low power consumption. In contrast, in Example 1, as illustrated in the timing chart of FIG. 5, for example, 240 fps is set as one vertical period (a mutual period of the vertical synchronizing signals XVS), and an operation is performed through a sensor operation by one frame during four vertical periods [1V=1/60 (sec)]. Then, during three vertical periods after reading out of the analog signal, the operation of the current source 35 and at least the operation of the AD converter 50 which are used when reading out the analog signal are stopped. In this manner, without depending on the exposure period, the circuit operation is stopped while being synchronized with the vertical synchronizing signal XVS (by vertical synchronizing signal XVS as a unit), thereby making design of the power supply easy. The stopping of the operation of the current source 35 and at least the operation of the AD converter 50 are executed under the controlling by the control portion 34.

Figure 6:
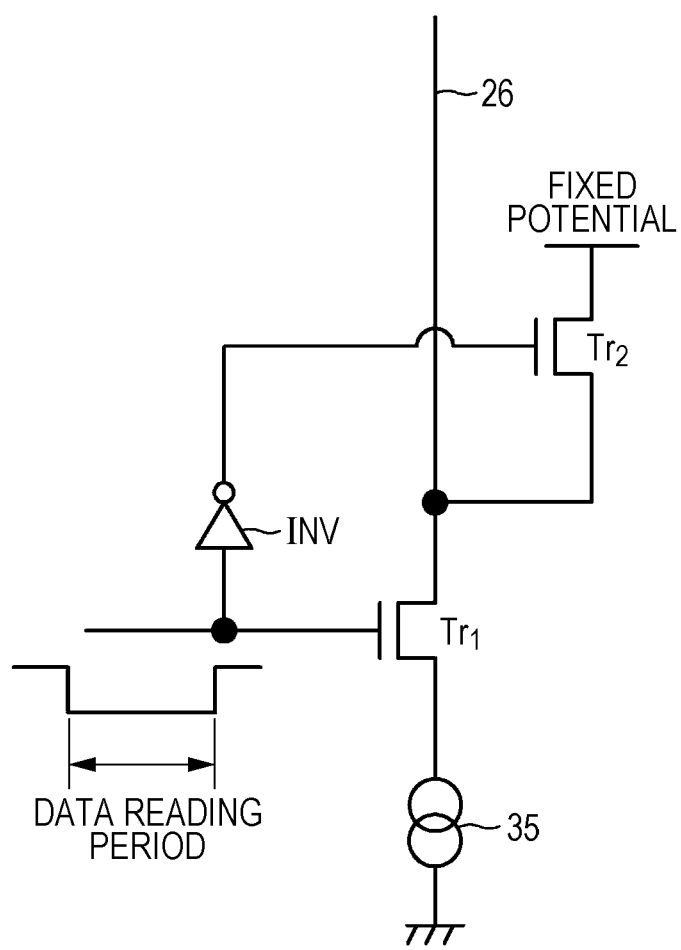
FIG. 6 is a circuit diagram illustrating an example of a circuit configuration for cutting off passage of a current between a signal line and a current source when stopping an operation of the current source in the electronic device of Example 1.

In Example 1, the sensor 40 is reset (shutter operation) after the high-speed rolling reading out at 240 fps, thereby starting the exposure. During the exposure period, each operation of the current source 35 and the AD converter 50 can be stopped. Accordingly, each operation of the current source 35 and the AD converter 50 is stopped during the period from the beginning of the reading out of the image data from the memory portion 32 of the current frame to the beginning of the reading out of the analog signal from the sensor 40 of the next frame, and thus, the power consumption can be reduced as much as the amount by which the current source 35 and the AD converter 50 are supposed to consume during the stop period thereof. The stopping of the operation of the current source 35 can be executed by blocking (cutting) the current path between the signal line 26 and the current source 35 under controlling of the control portion 34. Specifically, for example, as illustrated in FIG. 6, a transistor $Tr_1$ is inserted between the signal line 26 and the current source 35, and the transistor $Tr_1$ is caused to be in a non-conduction state due to a control signal at low level so that the operation of the current source 35 can be stopped. Here, when stopping the operation of the current source 35, it is preferable not only to block the current path between the signal line 26 and the current source 35 but also to apply the fixed potential to the signal line 26. Specifically, for example, as illustrated in FIG. 6, a transistor $Tr_2$ is connected between the signal line 26 and the fixed potential and the transistor $Tr_2$ is caused to be in the conduction state by the inversion control signal of the control signal via an inverter INV, and thus, the fixed potential can be applied to the signal line 26. As described above, the fixed potential is applied to the signal line 26 when stopping the operation of the current source 35 in order to eliminate influence of the sensor 40 to the FD portion 46 caused by the signal line 26 being in a floating state. In other words, when the signal line 26 is in a floating state and the electrical potential of the signal line 26 becomes unstable, for example, the unstableness of the electrical potential thereof may vary the electrical potential of the FD portion 46 due to the coupling of the amplification transistor 44 by parasitic capacitance thereof. It is preferable to apply the fixed potential to the signal line 26 in order to eliminate such influence to the FD portion 46.

Depending on the set exposure time, the shutter operation may straddle between the first vertical period (XVS 1) and the next vertical period (XVS 2). In such a case, it is preferable to control the stopping of the operation of the current source 35 after the shutter operation. As described above, when the stopping of the operation of the current source 35 is performed after the shutter operation, it is possible to prevent the influence of the standby operation of the current source 35, that is, the unstableness of the power supply potential or the unstableness of the electrical potential of the signal line 26. Moreover, when a shutter starts during the next vertical period (XVS 2), there is no influence of the standby operation of the current source 35.

Figure 7:
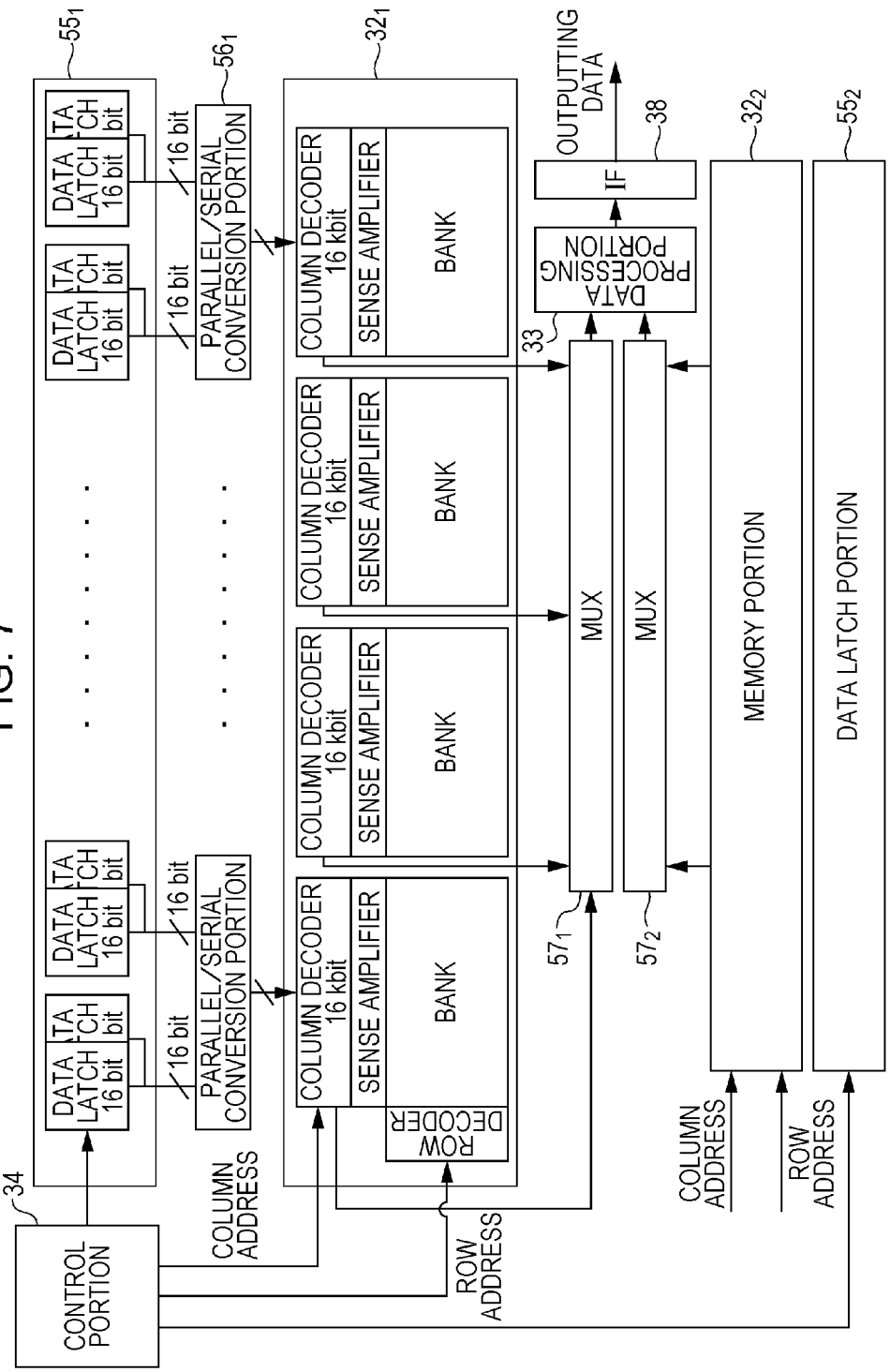
FIG. 7 is a block diagram for illustrating an operation in which image data is stored from a data latch portion to a memory portion and the image data is output from the memory portion in the electronic device of Example 1.

Subsequently, an operation of storing the image data from the data latch portion 55 to the memory portion 32 and outputting the image data from the memory portion 32 will be described using FIG. 7. In FIG. 7, there is exemplified a case of providing two systems of the AD converter 50 and the circuit portion accompanied thereby, that is, the circuit portion such as the data latch portions 55 ($55_1$, $55_2$) or the memory portion 32 ($32_1$, $32_2$). However, the same thing can be basically applied to a case of one system.

The image data after being subjected to the AD conversion is latched in the data latch portion 55. The latched image data is cached to the column decoder by the parallel/serial conversion portion 56 as much as 16 kilobits by 128 bits as a unit, for example. Subsequently, the image data is stored in the memory portion 32 by utilizing the sense amplifier. In FIG. 7, the memory portion 32 includes four banks. However, it is merely an example, and thus, it is preferable to determine the number of banks so as to be able to store the image data by sensor row as a unit.

Example 1 adopts the pipeline configuration in which the writing of the image data of each sensor 40 is performed in parallel to the rolling reading out so that it is possible to complete the storing of the image data from the data latch portion 55 to the memory portion 32 during one vertical period. After ending the writing of the image data in the memory portion 32, as described above, each operation of the current source 35 and the AD converter 50 is stopped and the reading out of the image data from the memory portion 32 starts.

Regarding the reading out of the image data from the memory portion 32, the image data is output from the interface portion 38 while rearrangement or composition of the image data is performed by the multiplexer (MUX) 57 ($57_1$, $57_2$) and the data processing portion 33 as the low breakdown voltage transistor system circuit during three vertical periods (80 fps in Example 1) of the exposure time. Since the image data is not output from the memory portion 32 when writing the image data in the memory portion 32, it is possible to achieve the reduction of the power consumption through a method such as fixing the output of the interface portion 38. Specifically, for example, the low power consumption can be achieved by stopping the clock which is applied to the output portion of the interface portion 38.

Figure 8:
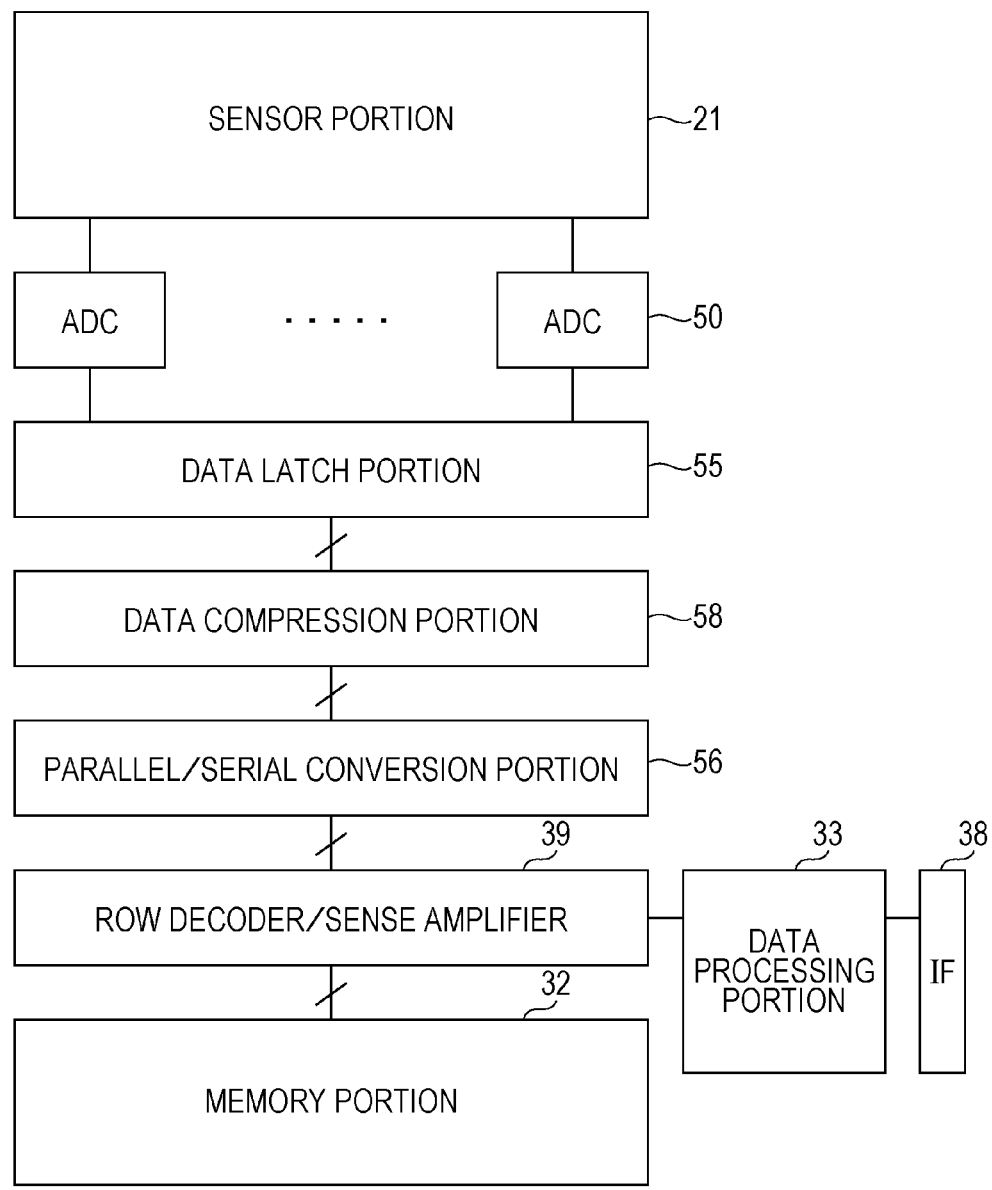
FIG. 8 is a block diagram illustrating another specific example of a configuration of the signal processing portion in the electronic device of Example 1.

FIG. 8 is a block diagram illustrating another example of a configuration of the signal processing portion in the electronic device 10A of Example 1. In this example, the signal processing portion 31 has the data compression portion 58 as the low breakdown voltage transistor system circuit in addition to the AD converter 50, the data latch portion 55, and the parallel/serial conversion portion 56. The signal processing portion 31 has a configuration in which the image data digitized in the AD converter 50 is subjected to the pipeline transferring to the memory portion 32. In this case, the signal processing portion 31 performs the digitization processing during one horizontal period by the AD converter 50, and transfers the digitized image data to the data latch portion 55 during the next one horizontal period.

For example, the data compression portion 58 is provided between the data latch portion 55 and the parallel/serial conversion portion 56, compresses the image data output from the data latch portion 55, and supplies the image data to the parallel/serial conversion portion 56. As a method of compressing the data compression portion 58, for example, differential pulse-code modulation (DPCM) can be exemplified. In this manner, memory capacity of the memory portion 32 can be decreased by providing the data compression portion 58 between the data latch portion 55 and the memory portion 32, compressing the data in the data compression portion 58, and storing the compressed image data in the memory portion 32. Then, it is possible to reduce the layout area of the second semiconductor chip 30 where the signal processing portion 31 is mounted, by decreasing the capacity of the memory portion 32.

Hereinafter, the lamination structure in which the AD converter 50 and the circuit portion accompanying thereof are provided in multiple systems, for example, two systems, and the analog signals of each sensor 40 in two sensor rows are subjected to the signal processing in parallel, that is, the lamination structure of the first semiconductor chip 20 and the second semiconductor chip 30 will be described.

Figure 9:
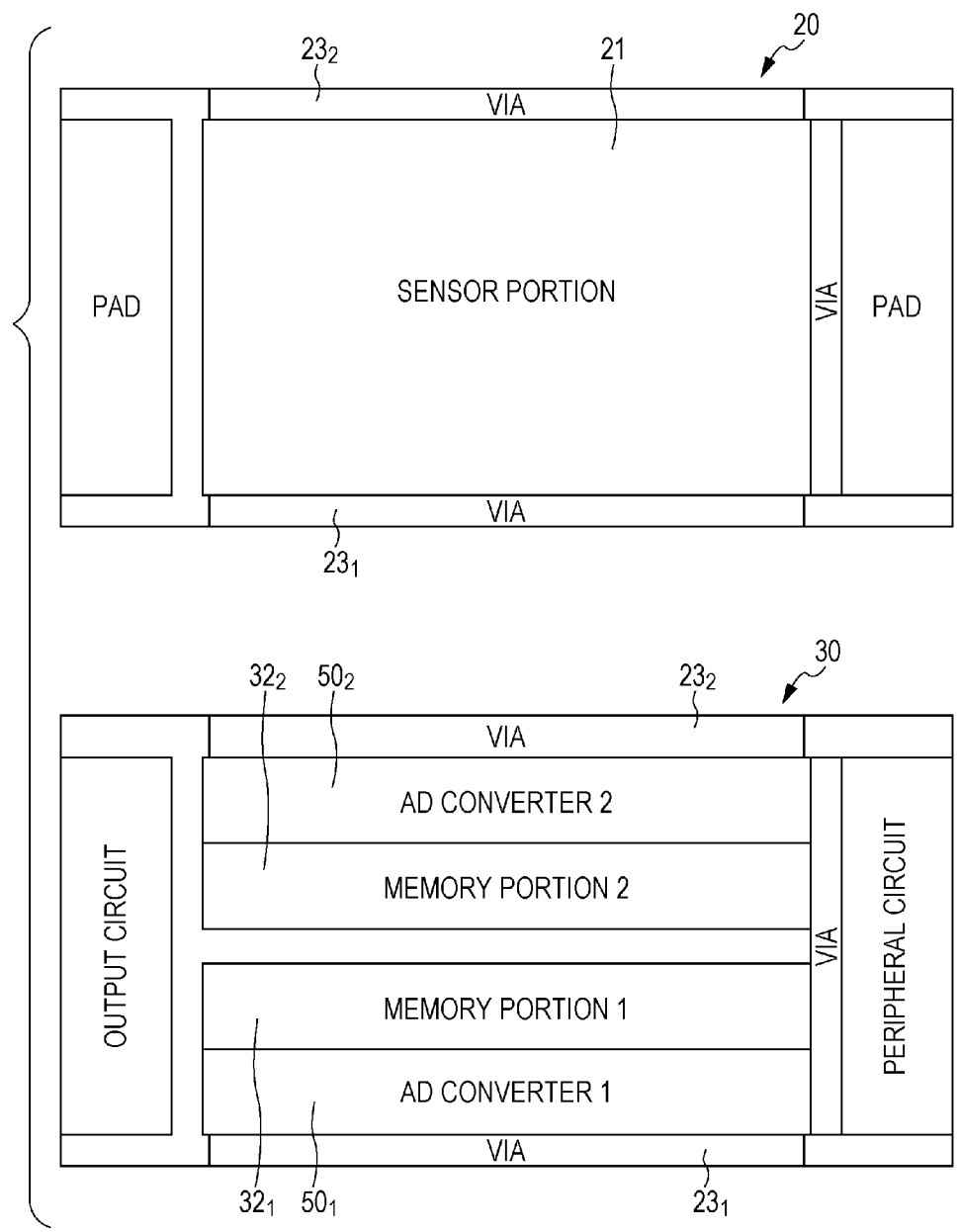
FIG. 9 is a layout diagram illustrating Layout Example 1A having a lamination structure when there are provided two systems of the analog-digital converters and accompanying circuit portions thereof.

As illustrated in FIG. 9, when the AD converter 50 and the circuit portion accompanying thereof are provided in two systems, for example, the analog signals of each sensor 40 in two sensor rows are read out on both sides of the extending direction of the signal line 26 of the sensor portion 21, that is, on both the upper and lower sides of the sensor portion 21. Then, the signal processing of the digitization is performed in parallel in the AD converters 50.

The high breakdown voltage transistor system circuit in the second semiconductor chip 30 and the sensor portion 21 in the first semiconductor chip 20 planarly overlap with each other. In the second semiconductor chip 30, the shading region (not illustrated) is formed above the high breakdown voltage transistor system circuit which faces the sensor portion 21 of the first semiconductor chip 20. The comparator 51 which configures the AD converter 50, the ramp voltage generator (reference voltage generator) 54, the current source 35, the decoder 36, and the interface (IF) portion 38 in the signal processing portion 31 provided in the second semiconductor chip 30 correspond to the high breakdown voltage transistor system circuit. On the other hand, the counter portion 52 which configures the AD converter 50, the data latch portion 55, the parallel/serial conversion portion 56, the memory portion 32, the data processing portion 33 (including the image signal processing portion), the control portion 34 (including the clock supply portion and the timing control circuit connected to the AD converter 50), and the row decoder 37 in the signal processing portion 31 provided in the second semiconductor chip 30 correspond to the low breakdown voltage transistor system circuit. Then the comparator 51 configuring the AD converter 50, the ramp voltage generator (reference voltage generator) 54 in the signal processing portion 31 provided in the second semiconductor chip 30, and the sensor portion 21 in the first semiconductor chip 20 planarly overlap with each other. For example, the counter portion 52 configuring the AD converter 50, the data latch portion 55, the parallel/serial conversion portion 56, and the memory portion 32, the data processing portion 33 (including the image signal processing portion), the control portion 34 (including the clock supply portion and the timing control circuit connected to the AD converter 50), the current source 35, the decoder 36, the row decoder 37, and the interface (IF) portion 38 also planarly overlap with the sensor portion 21 in the first semiconductor chip 20. In other words, the portions which do not overlap with the sensor portion 21 are the via portions $23_1$ and $23_2$, and the pad portions $22_1$ and $22_2$.

Incidentally, as is in the related art disclosed in Japanese Unexamined Patent Application Publication No. 2004-64410, when the memory portion is arranged on the same substrate (chip) as the sensor portion, it is necessary to arrange the AD converters and the like on the upper and lower sides of the sensor portion, and thus, it is also necessary for the memory portion to be divided into the upper and lower sides. In this case, as a layout distance of the output portion of the memory portion, it is necessary to have a distance of approximately (the size of the sensor portion in the vertical direction+the size of the memory portion in the vertical direction) so that the layout arrangement of a data output portion is separately configured, thereby making the chip size large. In the clock synchronization method such as low voltage differential signaling (LVDS), it is necessary to have the clock in a separate system, thereby leading to an increase of the number of channels of the signal processing chip.

In contrast, in Example 1, the first semiconductor chip 20 in which the sensor portion 21 is formed and the second semiconductor chip 30 in which the AD converter 50, the memory portion 32, the data processing portion 33, the control portion 34, and the like are formed are laminated in the lamination structure. Therefore, in accordance with the arrangement of AD converters $50_1$ and $50_2$ on both the upper and lower sides of the second semiconductor chip 30 (may also be referred to as both the upper and lower sides of the sensor portion 21), the memory portions $32_1$ and $32_2$ can be arranged while being adjacent to each other. In this manner, the data output portion (data output channel) of the memory portions $32_1$ and $32_2$ can be collectively configured since the memory portions $32_1$ and $32_2$ can be arranged while being adjacent to each other. Accordingly, the image data can be output through the same output portion so that it is enough to have one pair of the clock synchronizing signal. Thus, it is possible to prevent the increase of the number of the channels of the signal processing chip in the succeeding stage. The control portion 34 may be provided in an empty space between the memory portion $32_1$ and the memory portion $32_2$, and the like.

In Layout Example 1A illustrated in FIG. 9, a case where the AD converter 50 and the circuit portion accompanying thereof are provided in two systems is exemplified for the description. However, the same thing can be applied to the case in which three or more systems are provided so as to enhance the degree of the parallel reading out of the analog signal from the sensor portion 21. For example, a layout for columns when providing the AD converter 50 and the circuit portion accompanying thereof in four systems will be described hereinafter.

Figure 10:
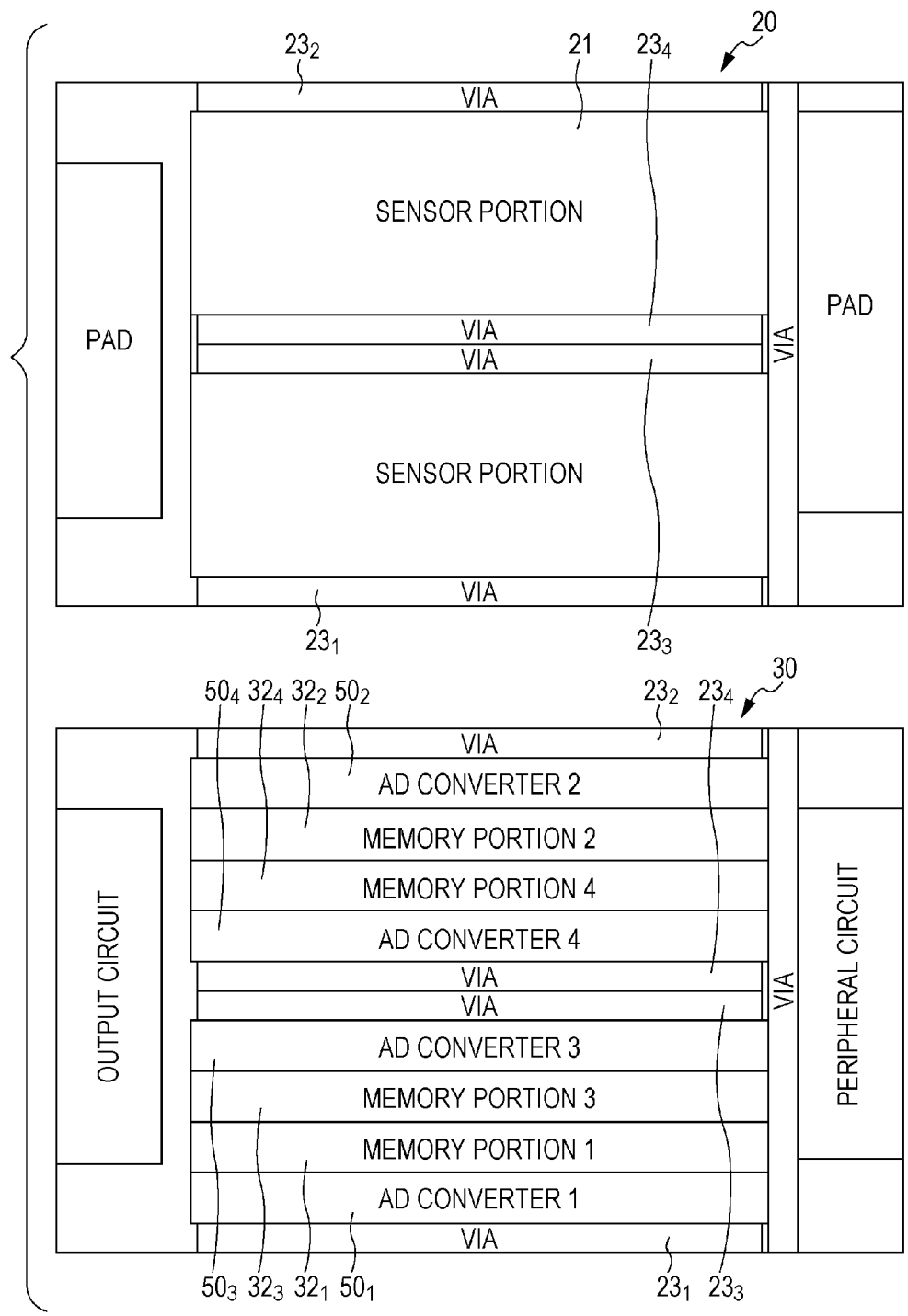
FIG. 10 is a layout diagram illustrating Layout Example 1B having the lamination structure when there are provided four systems of the analog-digital converters and the accompanying circuit portions thereof.

FIG. 10 illustrates a layout diagram of Layout Example 1B having the lamination structure in which the AD converter 50 and the circuit portion accompanying thereof are provided in four systems. In Layout Example 1B, the via portion is provided in two system at an intermediate portion of the sensor portion 21 in the vertical direction, and the analog signal of each sensor 40 of four sensor rows are simultaneously read out on the second semiconductor chip 30 side through via portions $23_1$ and $23_2$ in two systems on both the upper and lower sides of the sensor portion 21, and via portions $23_3$ and $23_4$ in two system at the intermediate portion. Then, four AD converters $50_1$, $50_2$, $50_3$, and $50_4$ are respectively arranged in the vicinity of the via portions $23_1$, $23_2$, $23_3$, and $23_4$ on the second semiconductor chip 30 side. The memory portions $32_1$ and $32_3$ are arranged between the AD converter $50_1$ and the AD converter $50_3$, and the memory portions $32_2$ and $32_4$ are arranged between the AD converter $50_2$ and the AD converter $50_4$ while being adjacent to each other. In this manner, even when the AD converter 50 and the circuit portion accompanying thereof are provided in four systems, the memory portions $32_1$ and $32_3$ and the memory portions $32_2$ and $32_4$ can be respectively arranged while being adjacent to one another. As a result, in Layout Example 1B as well, it is possible to acquire the same operation and effect as those of Layout Example 1A illustrated in FIG. 9.

Figure 11:
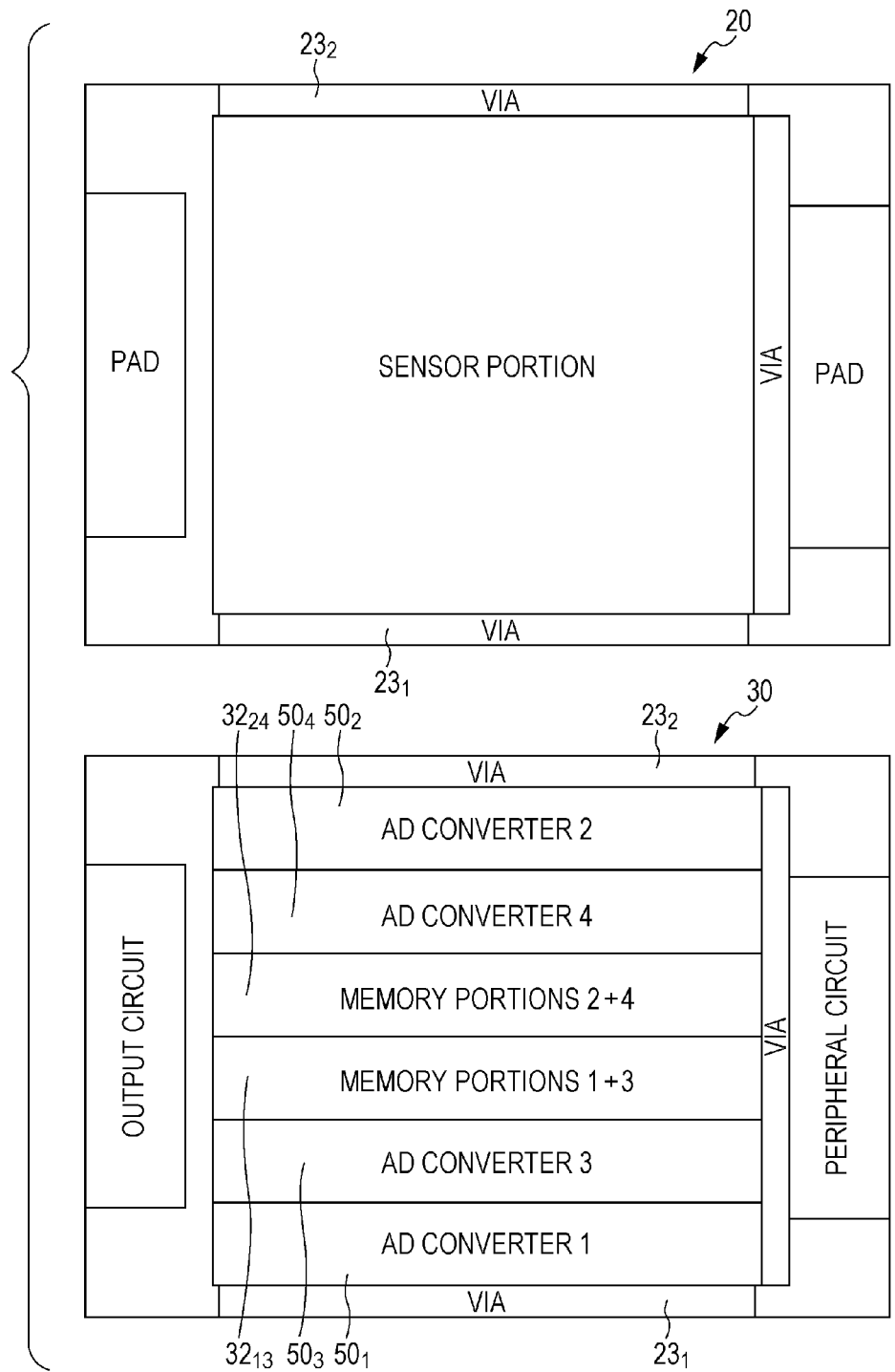
FIG. 11 is a layout diagram illustrating Layout Example 1C having the lamination structure when there are provided four systems of the analog-digital converters and the accompanying circuit portions thereof.

FIG. 11 illustrates a layout diagram of Layout Example 1C having the lamination structure in which the AD converter 50 and the circuit portion accompanying thereof are provided in four systems. Similar to the case of Layout Example 1A, Layout Example 1C illustrated in FIG. 9 has the configuration in which the via portions $23_1$ and $23_2$ are provided in two system on both the upper and lower sides of the sensor portion 21. On the second semiconductor chip 30 side, two AD converters $50_1$ and $50_3$ are respectively arranged while being adjacent to each other in the vicinity of the via portion $23_1$ on one side, and two AD converters $50_2$ and $50_4$ are respectively arranged while being adjacent to each other in the vicinity of the via portions $23_2$ on the other side. Then, a memory portion $32_{13}$ corresponding to the AD converters $50_1$ and $50_3$, and a memory portion $32_{24}$ corresponding to the AD converters $50_2$ and $50_4$ are respectively arranged between the AD converter $50_3$ and the AD converter $50_4$ while being adjacent to each other. Thus, in the case of Layout Example 1C, the memory portion $32_{13}$ and the memory portion $32_{24}$ can be arranged while being adjacent to each other. As a result, in Layout Example 1C as well, it is possible to acquire the same operation and effect as those of Layout Example 1A illustrated in FIG. 9.

In the electronic device of Example 1, at least a portion of the signal processing portion 31 has the depletion-type field effect transistor, and/or at least a portion of the low breakdown voltage transistor system circuit has the depletion-type field effect transistor, and thus, it is possible to achieve the low power consumption in the electronic device in its entirety. As a result, it is possible to suppress the performance deterioration of the sensor caused by thermal noise.

According to the electronic device 10A of Example 1, the high-speed transferring with respect to the memory portion 32 can be realized. The high-speed reading out of the image data can be realized with the lower power consumption by performing the low-speed reading out through the intermittent drive stopping the operation of the current source 35 and the AD converter 50 when reading out the image data from the memory portion 32. In the signal processing portion 31, without being limited to the AD converter 50, it is possible to achieve the still lower power consumption by stopping the operations of other circuit portions. The channels of the interface portion 38 can be decreased and processing speed of the signal processing block (for example, DSP) in the succeeding stage can be slowed by making the reading out speed, that is, the output rate of the image data by the data processing portion 33 be slower than the transferring speed of the image data to the memory portion 32. Accordingly, it is possible to contribute to the low power consumption of the system in its entirety including the signal processing block in the succeeding stage. Furthermore, the first semiconductor chip 20 and the second semiconductor chip 30 are in the lamination structure, and the circuit on the first semiconductor chip 20 side and the circuit on the second semiconductor chip 30 side are synchronized under the controlling of the control portion 34 so that the image data after being subjected to the AD conversion can be subjected to the pipeline transferring to the memory portion 32, thereby making the design of the synchronization easy. Since the image data is read out from the memory portion 32 during the exposure period, it is possible to perform the real-time reading out of the image data of moving pictures and still images, compared to the technology in the related art in which the image data is in the standby state after being stored in the memory portion, and then, imaging starts thereafter. Accordingly, it is possible to perform real-time imaging. Since the memory capacity of the memory portion 32 can be decreased when the data compression portion 58 is provided between the data latch portion 55 and the memory portion 32 so as to perform the data compression in the data compression portion 58 to store the data in the memory portion 32, it is possible to decrease the layout area of the second semiconductor chip 30. Moreover, it is possible to further improve the rolling distortion by providing the AD converter 50 and the circuit portion accompanying thereof in two or more systems, and performing the pipeline transferring of the image data after being subjected to the AD conversion to the memory portion 32.

In some cases, the comparator 51 may be disposed in the first semiconductor chip 20, or the comparator 51 and the ramp voltage generator (reference voltage generator) 54 may be disposed in the first semiconductor chip 20. The decoder 36 may be disposed in the first semiconductor chip 20. The semiconductor device (FET) configuring the counter portion 52 and the clock supply portion have a depletion-type field effect transistor.

Example 2

Figure 12:
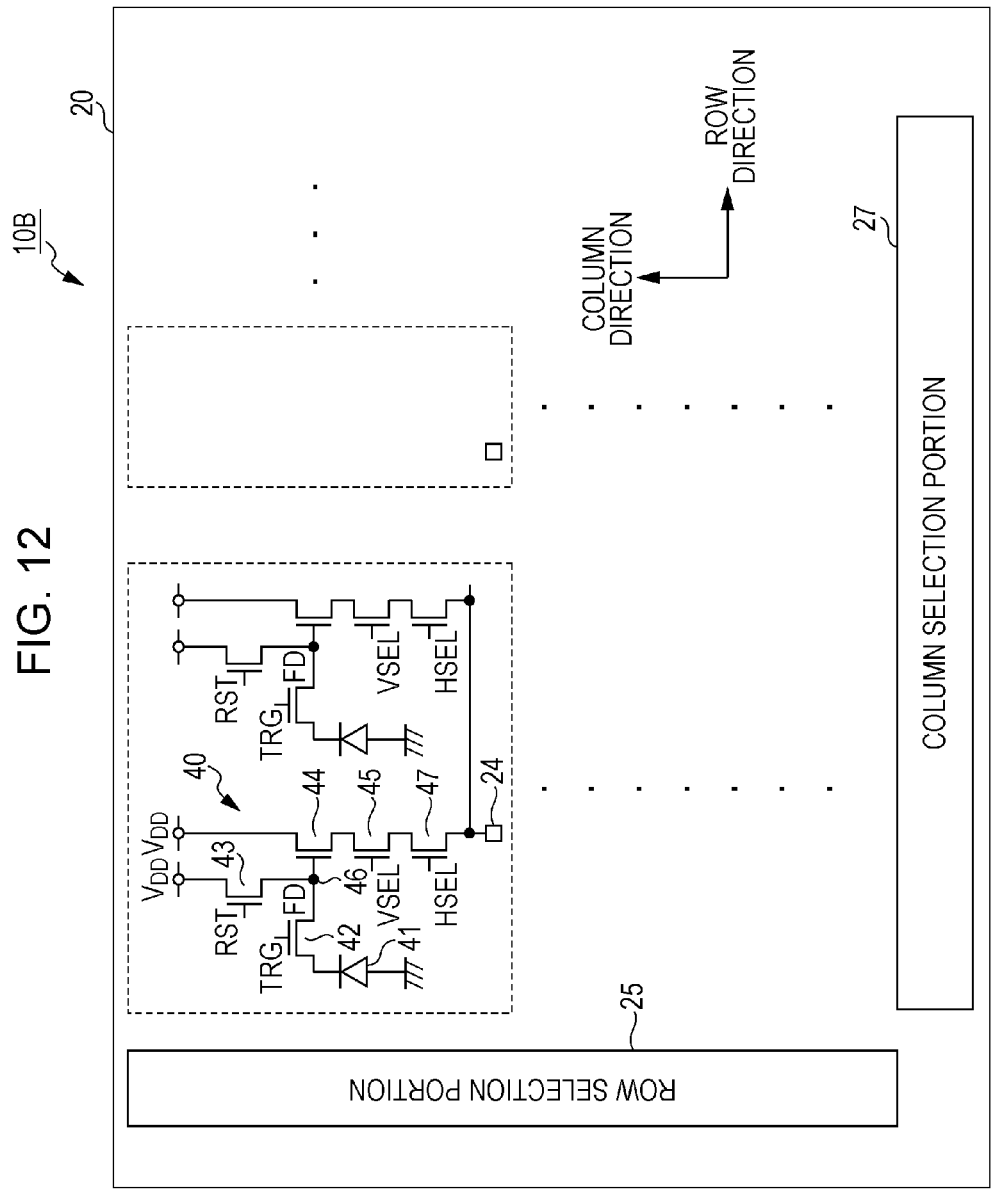
FIG. 12 is a circuit diagram illustrating a specific configuration of a circuit on the first semiconductor chip side in an electronic device of Example 2.
Figure 13:
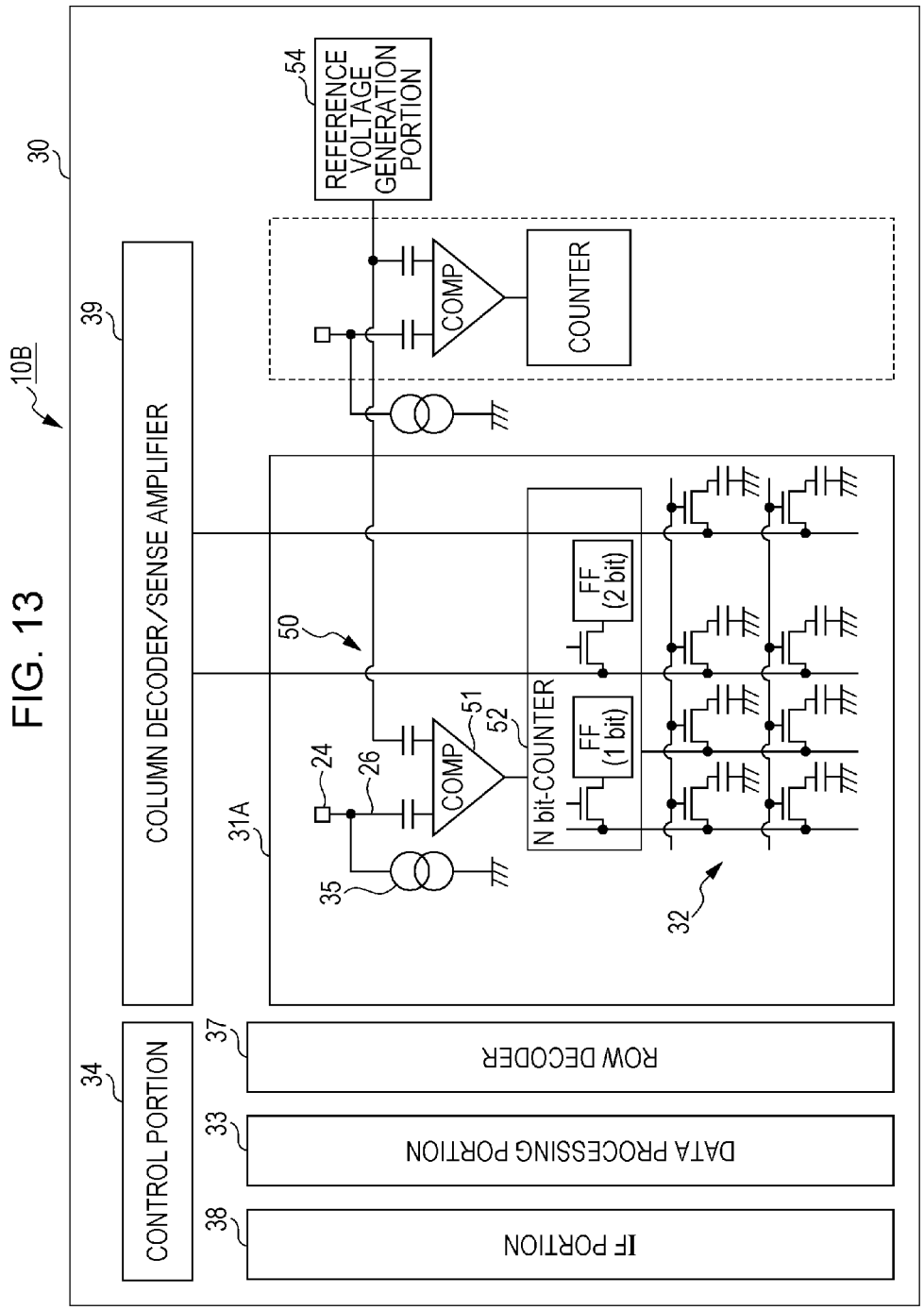
FIG. 13 is a circuit diagram illustrating a specific configuration of a circuit on the second semiconductor chip side in the electronic device of Example 2.

Example 2 is a modification of Example 1. FIG. 12 illustrates a specific configuration of a circuit in an electronic device 10B of Example 2 on the first semiconductor chip side, and FIG. 13 illustrates a specific configuration of a circuit in an electronic device 10B of Example 2 on the second semiconductor chip side. In Example 2, the sensors in predetermined number are set as a unit. The current source 35 connected to the signal line 26, the AD converter 50 and the memory portion 32 are provided for each unit (sensor unit). The signal processing portion 31 performs the signal processing in parallel by sensor unit with respect to the analog signal which is read out from each sensor 40 in the sensor unit.

In this manner, in the electronic device (solid-state imaging device) 10B of Example 2, the sensors 40 in predetermined number of the sensor portion 21 are set as a sensor unit (group). The analog signal is read out from each sensor 40 for each sensor unit, and then, the read out analog signal is subjected to the signal processing including the AD conversion in parallel by sensor unit. In other words, in contrast with the electronic device (solid-state imaging device) 10A of Example 1 adopts a column parallel AD conversion method in which the analog signal is subjected to the AD conversion in parallel by sensor column as a unit, the electronic device 10B of Example 2 adopts a pixel parallel (sensor parallel) AD conversion method in which the sensors 40 in predetermined number are set as one sensor unit so as to perform the AD conversion in parallel by sensor unit. When the sensors in predetermined number are set as one sensor unit, as an example, the multiple sensors which belong in the same sensor row and adjacent to one another may be collectively set as one sensor unit, or the multiple sensors which are adjacent to one another vertically and transversely may be collectively set as one sensor unit. Without being limited to the configuration in which analog signal is read out by sensor unit while having the multiple sensors as one sensor unit, ultimately, it is possible to read out the analog signal by each sensor as a unit.

In the configuration of Example 2, it is necessary to provide a connection portion 24 connecting the sensor portion 21 on the first semiconductor chip 20 side and the signal processing portion 31 on the second semiconductor chip 30 side for each sensor unit (or by sensor as a unit). The connection portion 24 which conducts the electrical connection between the semiconductor chips can be realized based on an existing inter-wiring joining technology such as TC(S)V. The analog signal which is read out for each sensor unit (or by sensor as a unit) is transmitted from the first semiconductor chip 20 side to the second semiconductor chip 30 through the connection portion 24 provided for each sensor unit (or by sensor as a unit).

Since Example 2 adopts the configuration of the pixel parallel (sensor parallel) AD conversion, as illustrated in FIG. 12, in addition to the sensor portion 21 and the row selection portion 25, the column selection portion 27 is provided on the first semiconductor chip 20 side. The column selection portion 27 selects each sensor 40 of the sensor portion 21 by sensor unit as a unit in an array direction (row direction) of the sensor column based on the address signal which is applied from the second semiconductor chip 30 side. Here, the row selection portion 25 and the column selection portion 27 are provided on the first semiconductor chip 20 side. However, the row selection portion 25 and the column selection portion 27 can be provided on the second semiconductor chip 30 side.

The sensor 40 has two selection transistors 45 and 47 in addition to the transfer transistor 42, the reset transistor 43, and the amplification transistor 44. Both of the two selection transistors 45 and 47 are connected in series with respect to the amplification transistor 44. The selection transistor 45 on one side is driven by a row selection signal VSEL which is applied from the row selection portion 25. The selection transistor 47 on the other side is driven by a column selection signal HSEL which is applied from the column selection portion 27. Under driving by the row selection portion 25 and the column selection portion 27, selection scanning is performed for each sensor unit, and multiple analog signals in the sensor unit are transmitted to the second semiconductor chip 30 side through one connection portion 24, and thus, the analog signals are read out from the multiple sensors in the sensor unit in a predetermined order. Then, on the second semiconductor chip 30 side, the analog signal which is read out for each sensor unit having the sensors 40 in predetermined number is subjected to the signal processing regarding the multiple sensors 40 in the sensor unit in a predetermined order (order of reading out of analog signal).

In accordance with the configuration in which the sensors 40 in predetermined number are unitized (grouped) as a unit, and the connection portion 24 is provided for each sensor unit, as illustrated in FIG. 13, the signal line 26 linked to the connection portion 24 is provided on the second semiconductor chip 30. The signal line 26 is connected to the current source 35, the AD converter 50, and the memory portion 32. A circuit portion (referred to as a "unit circuit portion 31A") which includes the signal line 26, the current source 35, the AD converter 50, the memory portion 32, and the like is provided for each sensor unit having the sensors in predetermined number as a unit. A DRAM can be exemplified as the memory portion 32 without being particularly limited thereto. In other words, similar to Example 1, the memory portion 32 may be a volatile memory or a non-volatile memory.

In the column parallel AD conversion method described in Example 1, the AD conversion is performed during the horizontal period (XHS), thereby outputting the image data. Incidentally, in order to read out the image data at a higher frame rate, it is necessary to increase the number of sensors which simultaneously perform the AD conversion. Then, in order to increase the number of sensors which simultaneously perform the AD conversion, it is necessary to adopt the AD conversion processing having the multiple sensors 40 as one sensor unit in pixel parallel (sensor parallel), not in column parallel. If the reading out speed can be increased by the pixel parallel (sensor parallel) AD conversion, the stop period of the AD converter 50 can be extended as much as thereof, thereby making the lower power consumption possible. As an example, the sensor is read out at the reading out speed of 960 fps (reading out of the analog signal), and the image data is output from the memory portion 32 at a speed of 64 fps, and thus, the operation period of the AD converter 50 can be set equal to or less than one tenth of the output period of the image data.

Figure 14:
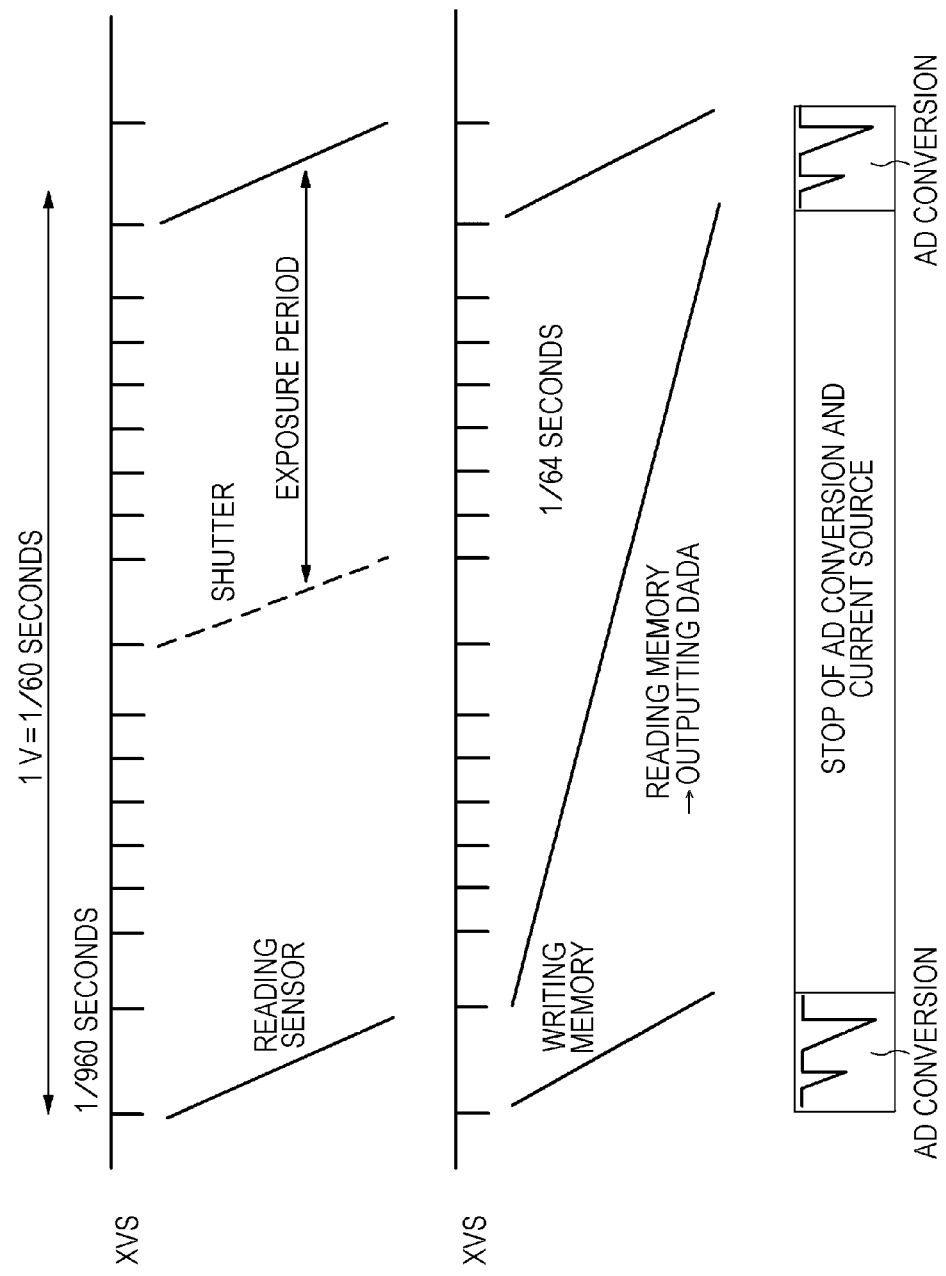
FIG. 14 is a timing chart for illustrating the circuit operation in the electronic device of Example 2.

Subsequently, a circuit operation of the electronic device 10B of Example 2 will be described using the timing chart in FIG. 14.

In order to read out the analog signal at the reading out speed of 960 fps, for example, regarding each sensor 40 of the sensor portion 21, one sensor unit is configured to have approximately 250 sensors 40, for example, (16 sensors)×(16 sensors). When the AD conversion time in the AD converter 50 is set to four microseconds, it is possible to read out the analog signals of approximately 250 sensors 40 within a time equal to or shorter than one millisecond. However, the numeric value exemplified herein is an example, and the configuration is not limited to the numeric value thereof. In one sensor unit having (16 sensors)×(16 sensors), the selection of the sensors 40 is performed through designating the address by the row selection signal VSEL applied from the row selection portion 25 and the column selection signal HSEL applied from the column selection portion 27. Then, the analog signals read out from the sensors 40 in the sensor unit which are selected by the row selection signal VSEL and the column selection signal HSEL are subjected to the AD conversion in the AD converter 50.

When performing the AD conversion, for example, the CDS processing is performed by the down-count with respect to the reset level $V_{Reset}$ and the up-count with respect to the signal level $V_{Sig}$ in the counter portion 52. The image data after being subjected to the CDS processing is written in the memory portion 32 while the row decoder 37 designates the row address, and the column decoder of the column decoder/sense amplifier 39 designates the column address. The row selection portion 25 and the column selection portion 27 perform the selection scanning for each sensor unit while performing the selection scanning of the sensors 40 in parallel in predetermined order for each sensor unit with respect to the multiple sensors 40 in the selected sensor unit. As the selection of the sensors 40 in the sensor unit, the selection by a raster scan method can be exemplified. Thereafter, the selection of the sensor and the AD conversion are performed through the raster scan method by the row selection signal VSEL and the column selection signal HSEL with respect to the sensors 40 remaining in the sensor unit, there by storing the image data after the CDS processing. Regarding the image data stored in the memory portion 32, the reading out is performed through the column decoder/sense amplifier 39, and thus, it is possible to output (read out) the image data at a low speed.

Similar to the electronic device (solid-state imaging device) 10A of Example 1, the controlling is performed stopping the operation of the current source 35 and at least the operation of the AD converter 50 when reading out the image data from the memory portion 32. Here, since the electronic device 10B of Example 2 adopts the pixel parallel (sensor parallel) AD conversion method, it is possible to increase the reading out speed of the analog signal. Accordingly, the stop period of the AD converter 50 can be extended, and thus, it is possible to achieve the lower power consumption.

Figure 15:
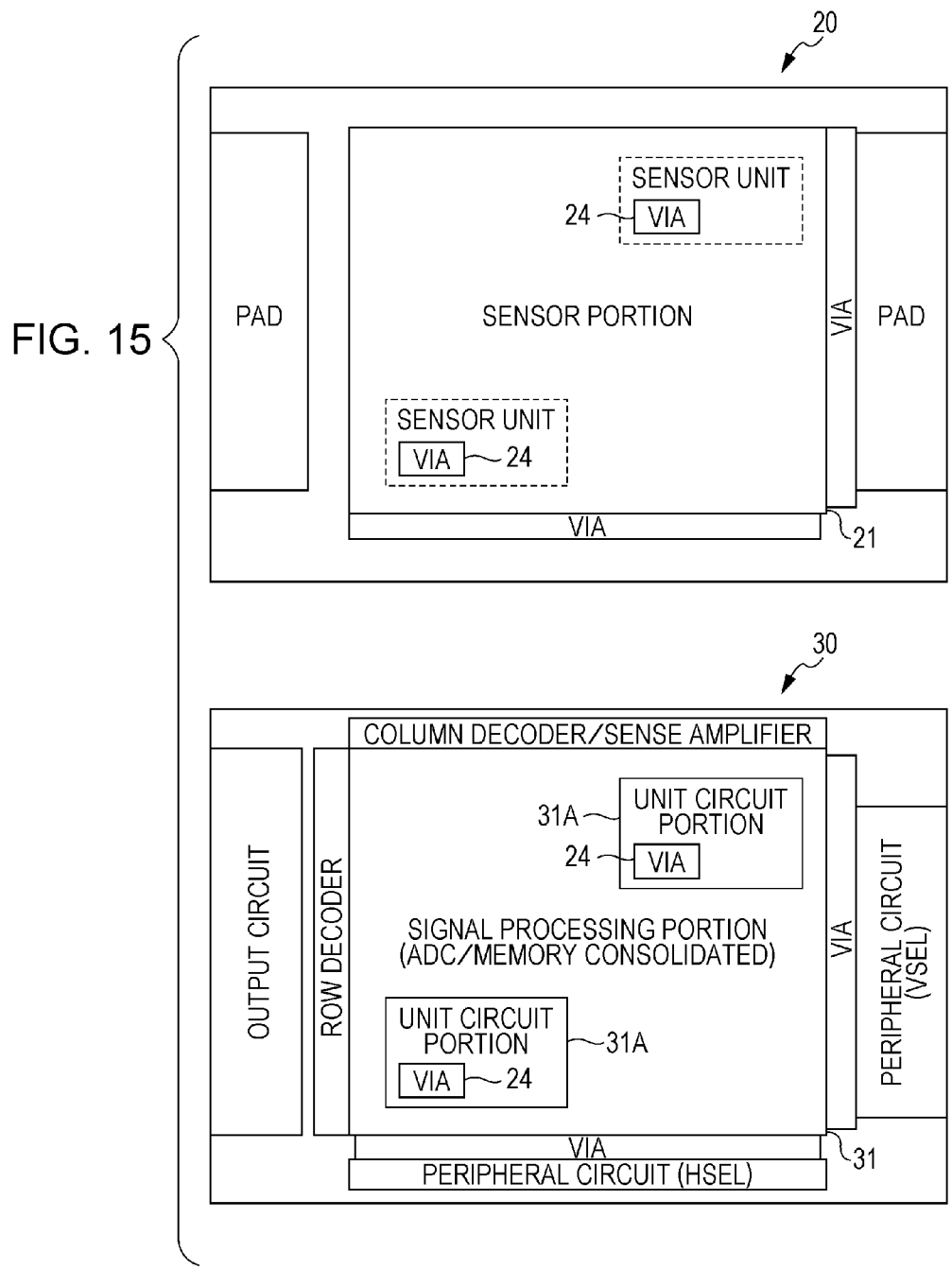
FIG. 15 is a layout diagram illustrating Layout Example 2 having the lamination structure in the electronic device of Example 2.

FIG. 15 illustrates a layout diagram of Layout Example 2 having the lamination structure in the electronic device 10B of Example 2. As illustrated in FIG. 15, in the sensor portion 21 of the first semiconductor chip 20, the sensor units having the sensors 40 in predetermined number as a unit are two-dimensionally arrayed in rows and columns, and the connection portion 24 is formed for each sensor unit. Meanwhile, in the signal processing portion 31 of the second semiconductor chip 30, the circuit portion (unit circuit portion 31A) including the AD converter 50, the memory portion 32, and the like are provided in accordance with the sensor unit of the sensor portion 21, and the connection portion 24 is formed for each unit circuit portion 31A in accordance with the sensor unit.

In FIG. 12, a case where the row selection portion 25 and the column selection portion 27 are provided on the first semiconductor chip 20 side is exemplified. However, as illustrated in Layout Example 2, it is possible to provide the peripheral circuits (HSEL and VSEL) on the second semiconductor chip 30 side. Such a configuration has an advantage in that more area than that of the first semiconductor chip 20 can be used as the region for the sensor portion 21.

According to the electronic device 10B of Example 2 described above, basically, in addition to the operation and the effect in the electronic device 10A of Example 1, the following operation and the effect can be achieved. In other words, since the reading out speed of the analog signal can be increased by adopting the pixel parallel (sensor parallel) AD conversion method, it is possible to extend the stop period of the AD converter 50. Therefore, it is possible to achieve still lower power consumption compared to the column parallel AD conversion method.

Example 3

Figure 16:
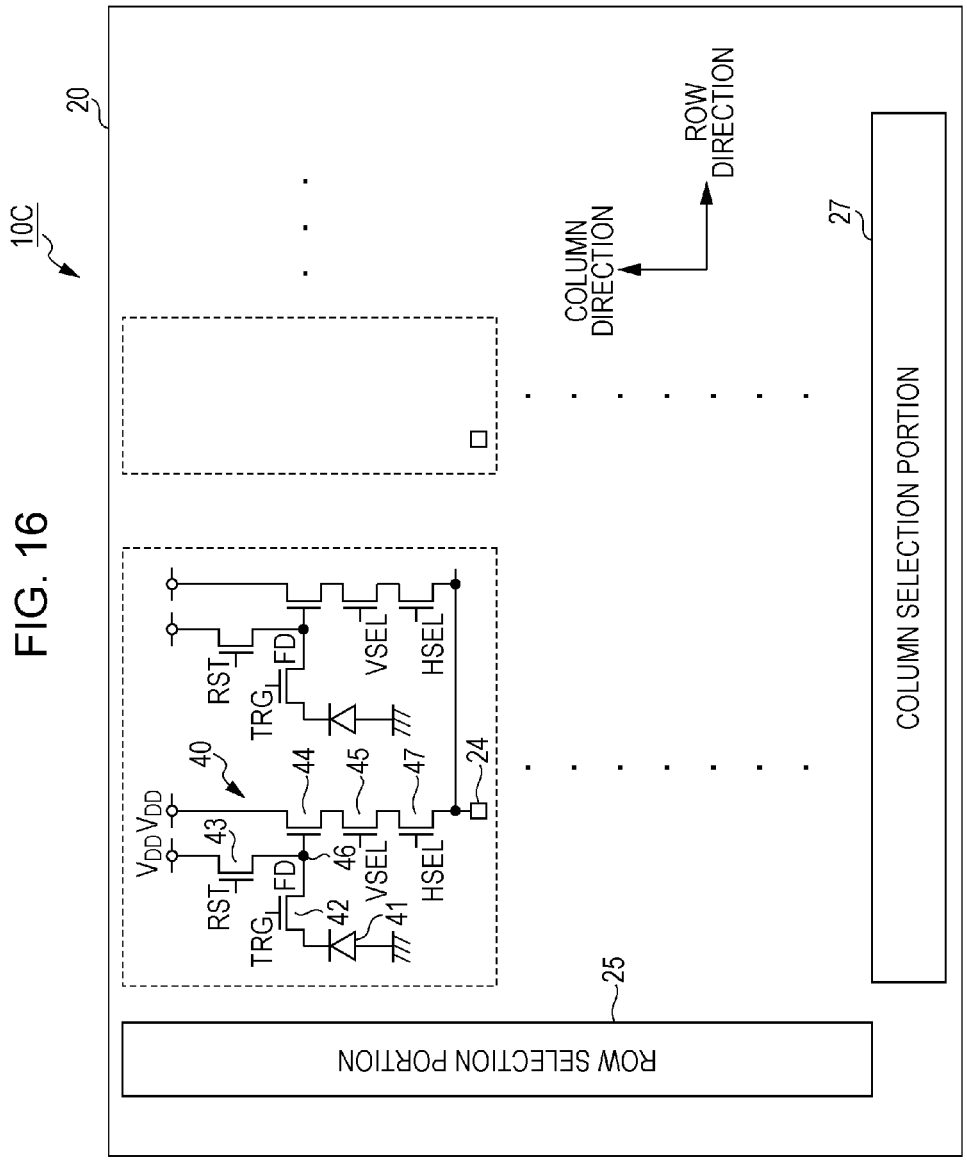
FIG. 16 is a circuit diagram illustrating a specific configuration of a circuit on the first semiconductor chip side in an electronic device of Example 3.
Figure 17:
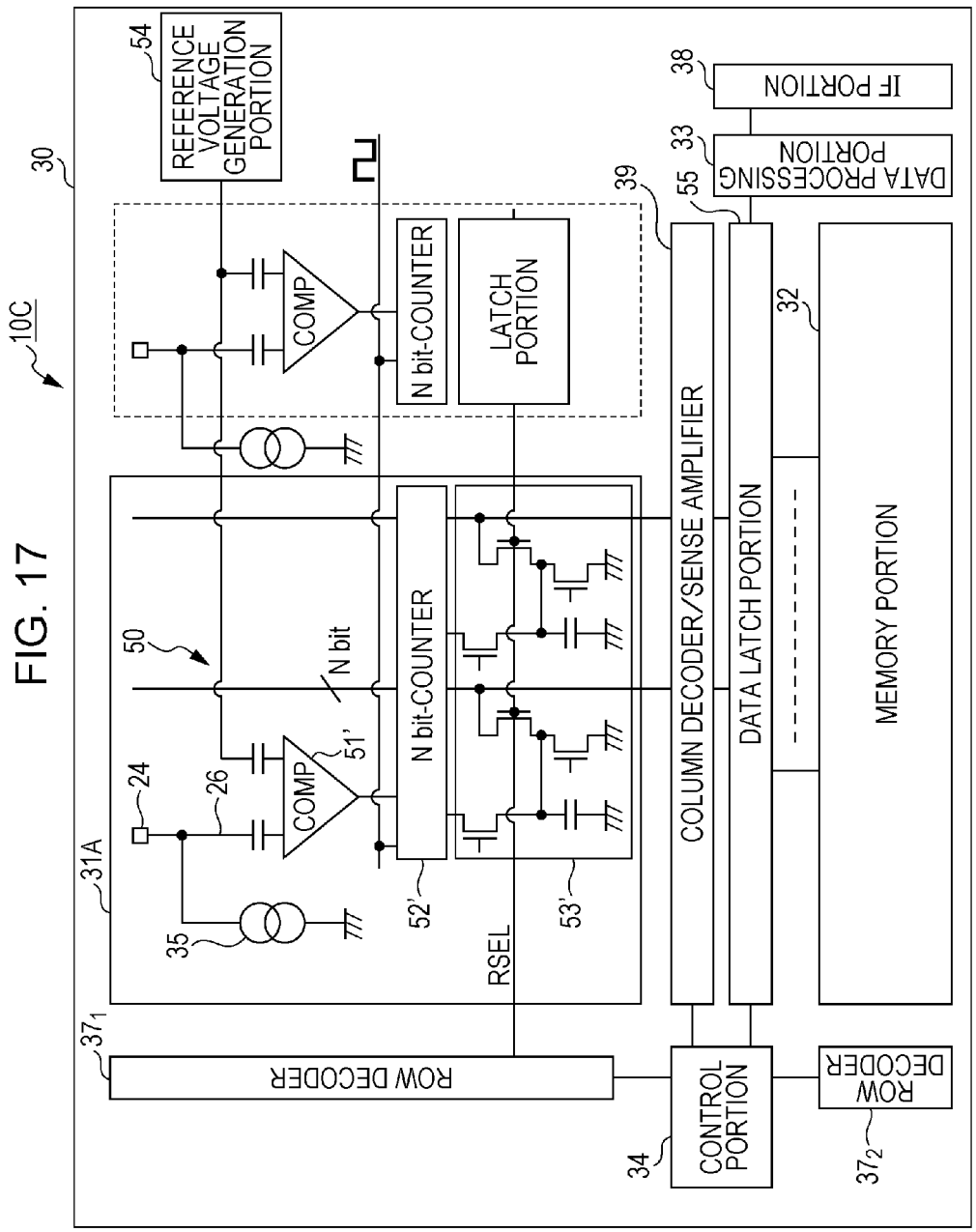
FIG. 17 is a circuit diagram illustrating a specific configuration of a circuit on the second semiconductor chip side in the electronic device of Example 3.

Example 3 is a modification of Example 2. FIG. 16 illustrates a specific configuration of the circuit in an electronic device (solid-state imaging device) 10C of Example 3 on the first semiconductor chip side, and the FIG. 17 illustrates a specific configuration thereof on the second semiconductor chip side.

Similar to the electronic device 10B of Example 2, the electronic device 10C of Example 3 also adopts the pixel parallel (sensor parallel) AD conversion method. In other words, in the electronic device 10C of Example 3 as well, the sensors 40 in predetermined number of the sensor portion 21 are set as a unit. Analog signals are read out from each sensor 40 for each sensor unit, and the read out analog signal is subjected to the signal processing including the AD conversion in parallel for each sensor unit. However, the electronic device 10C of Example 3 differs from the electronic device 10B of Example 2 in the following points. In other words, in the electronic device 10B of Example 2, the AD converter 50 and the memory portion 32 are provided in the unit circuit portion 31A, that is, the AD converter 50 and the memory portion 32 are consolidated, but in the electronic device 10C of Example 3, the memory portion 32 is provided outside the unit circuit portion 31A.

In Example 3, the sensors 40 are unitized in predetermined number as a unit, and the connection portion 24 is provided for each sensor unit. Then, as illustrated in FIG. 17, on the second semiconductor chip 30, there is provided the signal line 26 connected to the connection portion 24. The current source 35 is connected to the signal line 26. Moreover, the AD converter 50 is provided for each signal line 26. The AD converter 50 has a comparator (COMP) 51', a counter portion 52' of Nbit (N is an integer equal to or more than 2), and a latch portion 53'. The latch portion 53' in the AD converter 50 includes a unit circuit (latch circuit) of Nbit, is subjected to the AD conversion by the comparator 51' and the counter portion 52', and latches the digital data (image data) which is subjected to the CDS processing by the operation of up/down count of the counter portion 52' for one sensor.

As the row decoder 37, there are provided a row decoder $37_1$ which selects the latch portion 53' and a row decoder $37_2$ which selects each cell of the memory portion 32 by row as a unit.

Hereinafter, a circuit operation of the electronic device (solid-state imaging device) 10C of Example 3 will be described.

Regarding one sensor 40 in the sensor unit selected through the address designation by the row selection signal VSEL and the column selection signal HSEL, the analog signal is subjected to the AD conversion in the AD converter 50, and the image data obtained through the CDS processing by the operation of up/down count of the counter portion 52' is latched in the latch portion 53'. Then, the image data which is latched in the latch portion 53' is selected by a selection signal $R_{SEL}$ applied from the row decoder $37_1$ so as to be sequentially read out by the sense amplifier of the column decoder/sense amplifier 39. Thereafter, an operation of writing in the memory portion 32 through the data latch portion 55 is simultaneously performed by the multiple sensors 40, thereby performing a pipeline operation. In this manner, the sensor selection and the operation of the AD conversion is performed by the raster scan method, and the operation of writing the image data after being subjected to the CDS processing in the counter portion 52' in the memory portion 32 through the latch portion 53' and the sense amplifier of the column decoder/sense amplifier 39.

In place of the AD conversion by one sensor as a unit, it is possible to increase the reading out speed by arranging the multiple AD converters 50 and making the analog signals be simultaneously read out from two or more of the multiple sensors 40. Regarding the latch portion 53', when it is difficult to arrange the unit circuit (latch circuit) as many as Nbit for the counter portion 52', the unit circuit is arranged by bit in number which is smaller than the Nbit as a unit. The writing may be performed in the memory portion 32 by reading out through the sense amplifier of the column decoder/sense amplifier 39 after performing the selection by the selection signal $R_{SEL}$ by bit in number as a unit. Accordingly, the sensor unit can be configured by fewer sensors, thereby making it possible to achieve an advantage of the increased reading out speed.

Regarding the image data stored in the memory portion 32, the image data can be output (read out) at a low speed by performing the reading out through the data latch portion 55 and the column decoder/sense amplifier 39. Similar to the electronic devices (solid-state imaging devices) 10A and 10B of Example 1 and Example 2, when reading out the image data from the memory portion 32, the controlling is performed to stop the operation of the current source 35 and at least the operation of the AD converter 50 when reading out the image data from the memory portion 32. Here, in the electronic device 10C of Example 3 as well, similar to the electronic device 10B of Example 2, the pixel parallel (sensor parallel) AD conversion method is adopted, and thus, it is possible to increase the reading out speed of the analog signal. Accordingly, the stop period of the AD converter 50 can be extended, and thus, it is possible to achieve the lower power consumption.

Figure 18:
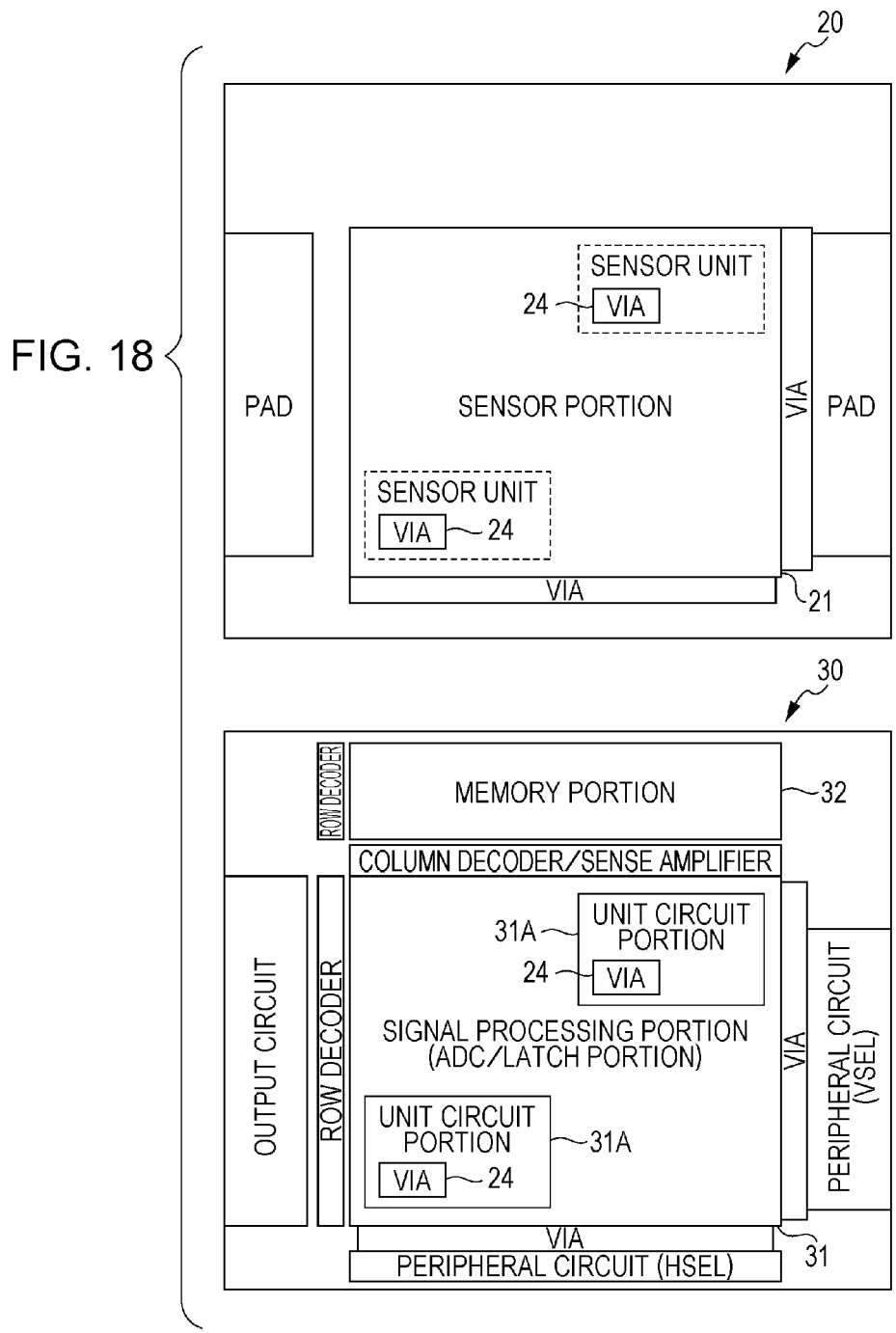
FIG. 18 is a layout diagram illustrating Layout Example 3A having the lamination structure in the electronic device of Example 3.

FIG. 18 illustrates a layout diagram of a layout example of the lamination structure in the electronic device (solid-state imaging device) 10C of Example 3. As illustrated in FIG. 18, in the sensor portion 21 of the first semiconductor chip 20, the sensor units having the sensors 40 in predetermined number as a unit are two-dimensionally arrayed in rows and columns, and the connection portion 24 is formed for each sensor unit. Meanwhile, in the second semiconductor chip 30, the circuit portion (unit circuit portion 31A) including the AD converter 50 and the like is provided in accordance with the sensor unit of the sensor portion 21, and the connection portion 24 is formed for each unit circuit portion 31A in accordance with the sensor unit. Moreover, the memory portion 32 is provided outside the forming region of the unit circuit portion 31A. In FIG. 16, a case where the row selection portion 25 and the column selection portion 27 are provided on the first semiconductor chip 20 side is exemplified. However, as illustrated in Layout Example 3A of FIG. 18, it is possible to provide the peripheral circuits (HSEL and VSEL) on the second semiconductor chip 30 side. Such a configuration has an advantage in that more area than that of the first semiconductor chip 20 can be used as the region for the sensor portion 21.

Figure 19:
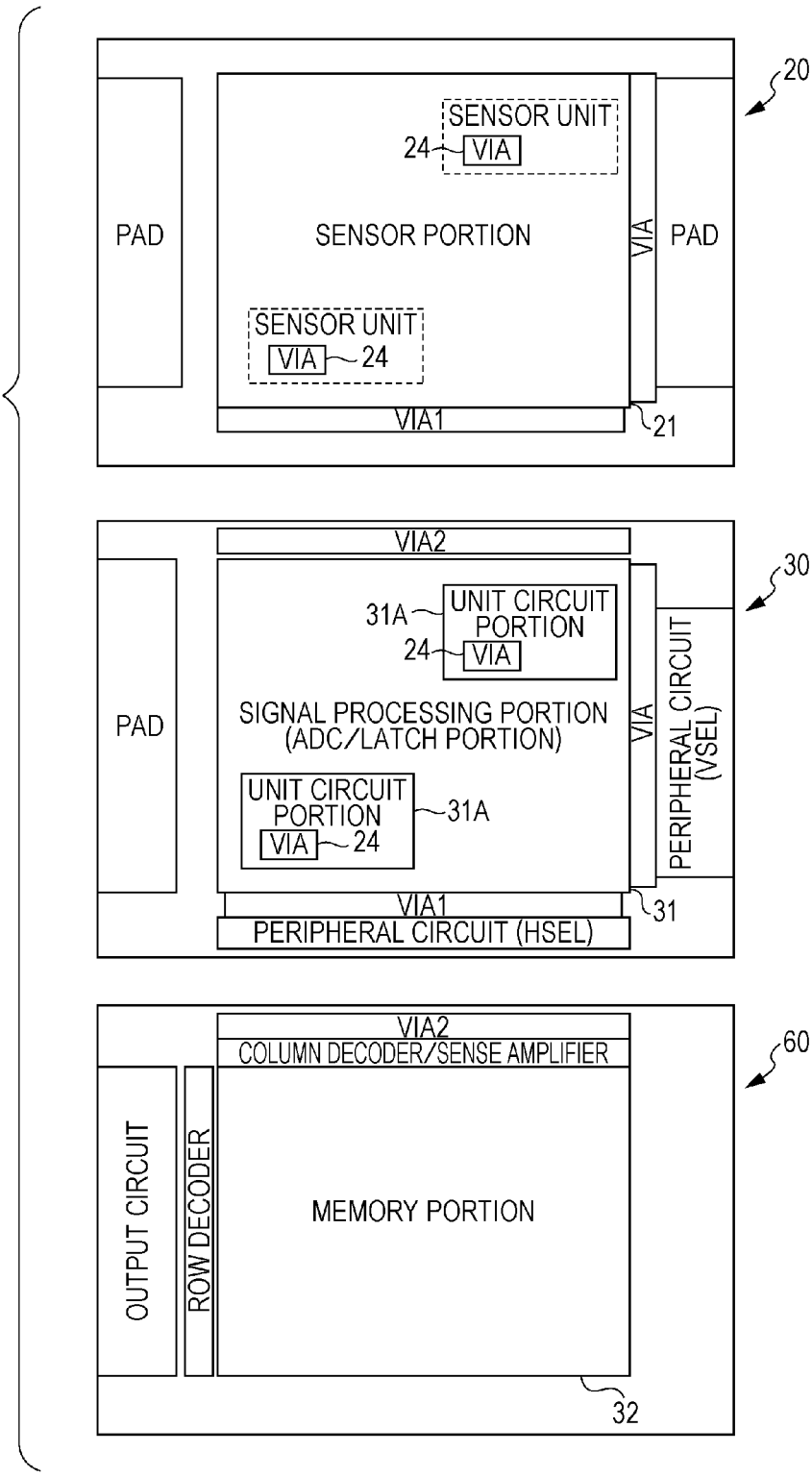
FIG. 19 is a layout diagram illustrating Layout Example 3B having the lamination structure in the electronic device of Example 3.

FIG. 19 illustrates a layout diagram of another layout example of the lamination structure in the electronic device (solid-state imaging device) 10C of Example 3.

In Layout Example 3A illustrated in FIG. 18, in contrast with the two-layered lamination structure of the first semiconductor chip 20 and the second semiconductor chip 30 in which two semiconductor chips 20 and 30 are laminated, in Layout Example 3B illustrated in FIG. 19, there is provided the three-layered lamination structure of the first semiconductor chip 20, the second semiconductor chip 30, and third semiconductor chip 60 in which three semiconductor chips are laminated. However, the configuration is not limited to the three-layered lamination structure, and it is possible to configure to have the lamination structure of four layers or more. As illustrated in FIG. 19, in Layout Example 3B, the sensor portion 21 is disposed in the first semiconductor chip 20, the circuit portion (unit circuit portion 31A) including the AD converter 50 and the like is disposed in the second semiconductor chip 30, and the memory portion 32 is disposed in the third semiconductor chip 60, thereby laminating the third semiconductor chip 60, the second semiconductor chip 30, and the first semiconductor chip 20. The order in the lamination of the first semiconductor chip 20, the second semiconductor chip 30, and the third semiconductor chip 60 is arbitrary. However, it is preferable for the second semiconductor chip 30 in which the peripheral circuits including the control portion 34 are mounted to be placed in the middle of the lamination in that the first semiconductor chip 20 and the third semiconductor chip 60 which are the controlling subjects of the control portion 34 are respectively positioned in immediately above and immediately below the second semiconductor chip 30.

As is in Layout Example 3B, the memory portion 32 is provided in another semiconductor chip which is separate from the second semiconductor chip 30 in which the circuit portion including the AD converter 50 and the like, and the peripheral circuit including the control portion 34 are provided, that is, in the third semiconductor chip 60. Accordingly, compared to Layout Example 3A in which the memory portion 32 is provided in the second semiconductor chip 30, it is possible to decrease the area of the chip. In this respect, it is obvious from the contrast between FIGS. 18 and 19. In this case, it is possible to consider causing the connection portion to connect the second semiconductor chip 30, in which the circuit portion and the like including the AD converter 50 and the like are mounted, and the third semiconductor chip 60 in which the memory portion 32 and the like are mounted. The connection portion which conducts the electrical connection between the semiconductor chips can be realized based on an existing interwire joining technology such as TC(S)V.

According to the electronic device (solid-state imaging device) 10C of Example 3 described above, similar to the electronic device (solid-state imaging device) 10B of Example 2, the reading out speed of the analog signal can be increased by adopting the pixel parallel (sensor parallel) AD conversion method, it is possible to extend the stop period of the AD converter 50. Therefore, it is possible to achieve still lower power consumption compared to the electronic device (solid-state imaging device) 10A of Example 1 adopting the column parallel AD conversion method. In the electronic device 10C of Example 3, the memory portion 32 is provided outside the unit circuit portion 31A instead of the form in which the AD converter 50 and the memory portion 32 are consolidated in the unit circuit portion 31A as is in the electronic device 10B of Example 2, and thus, it is possible to easily take countermeasures even when there is a difficulty in well separation between the analog circuit such as a DRAM and the memory portion 32.

Example 4

Figure 20:
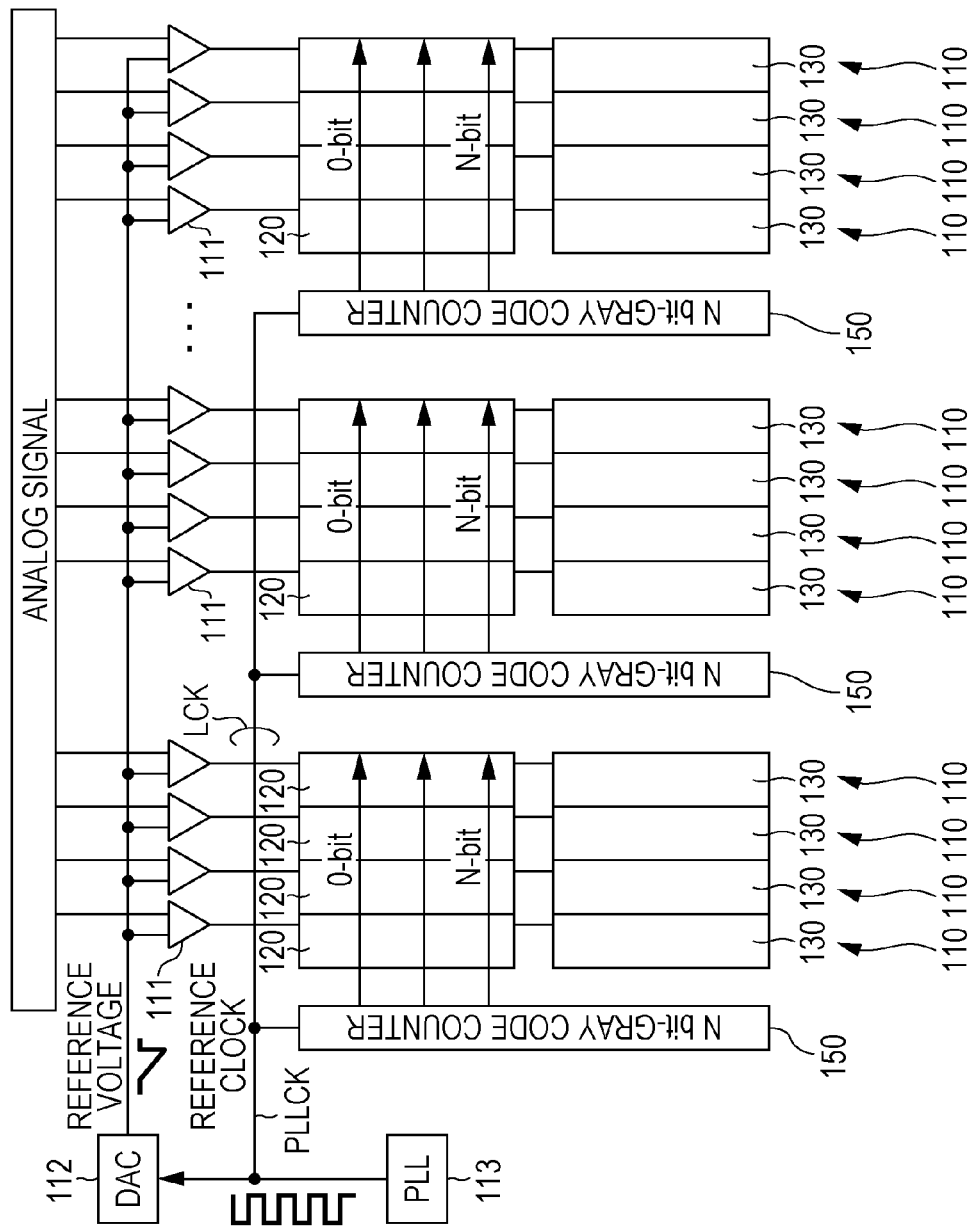
FIG. 20 is a view illustrating a basic configuration example of the analog-digital converter including gray code counters in an electronic device of Example 4.
Figure 21:
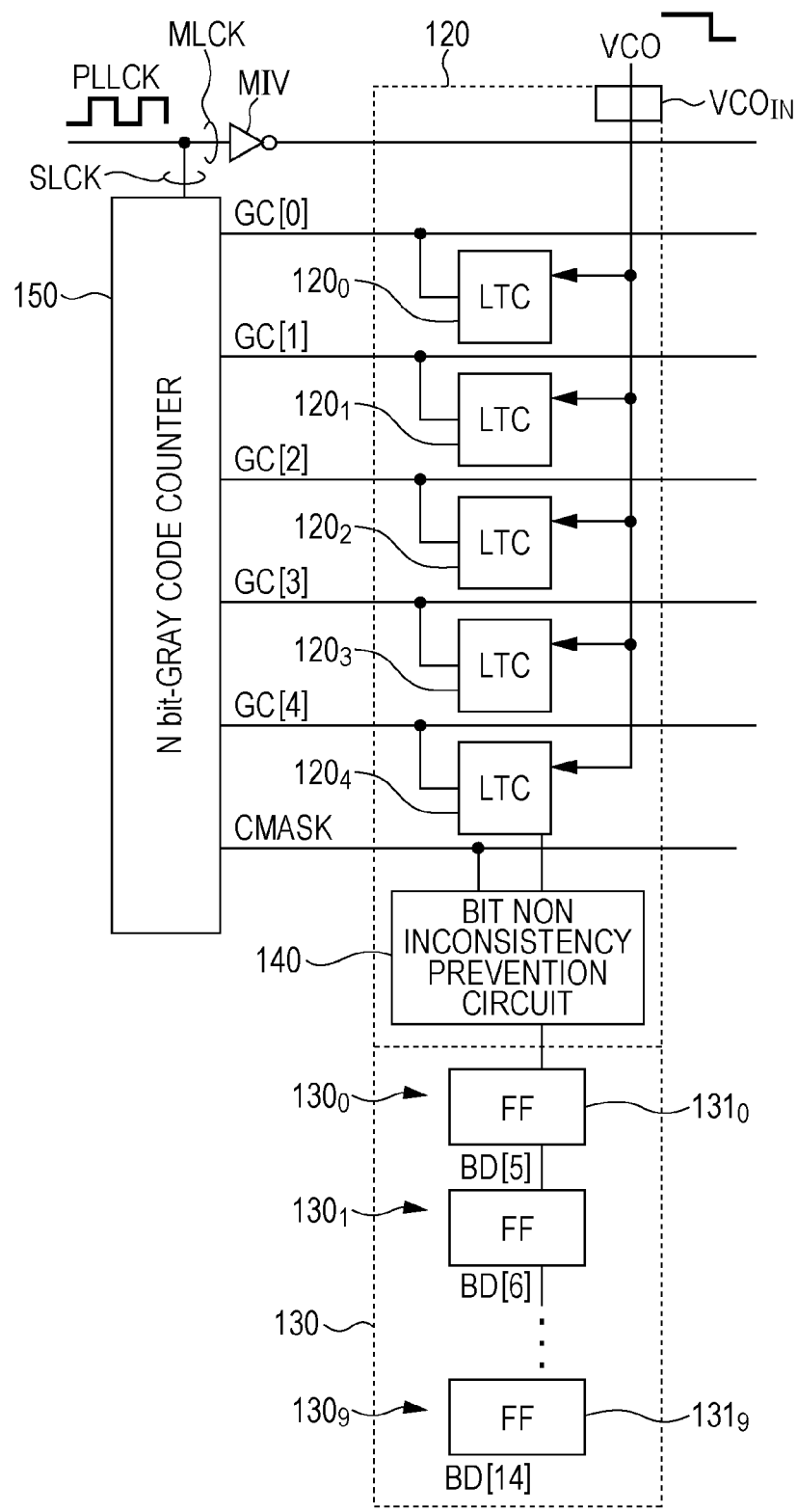
FIG. 21 is a view illustrating outputs of the gray code counter, and a basic arrangement relationship between lower bit latch portions and upper bit counter portions in the electronic device of Example 4.
Figure 22:
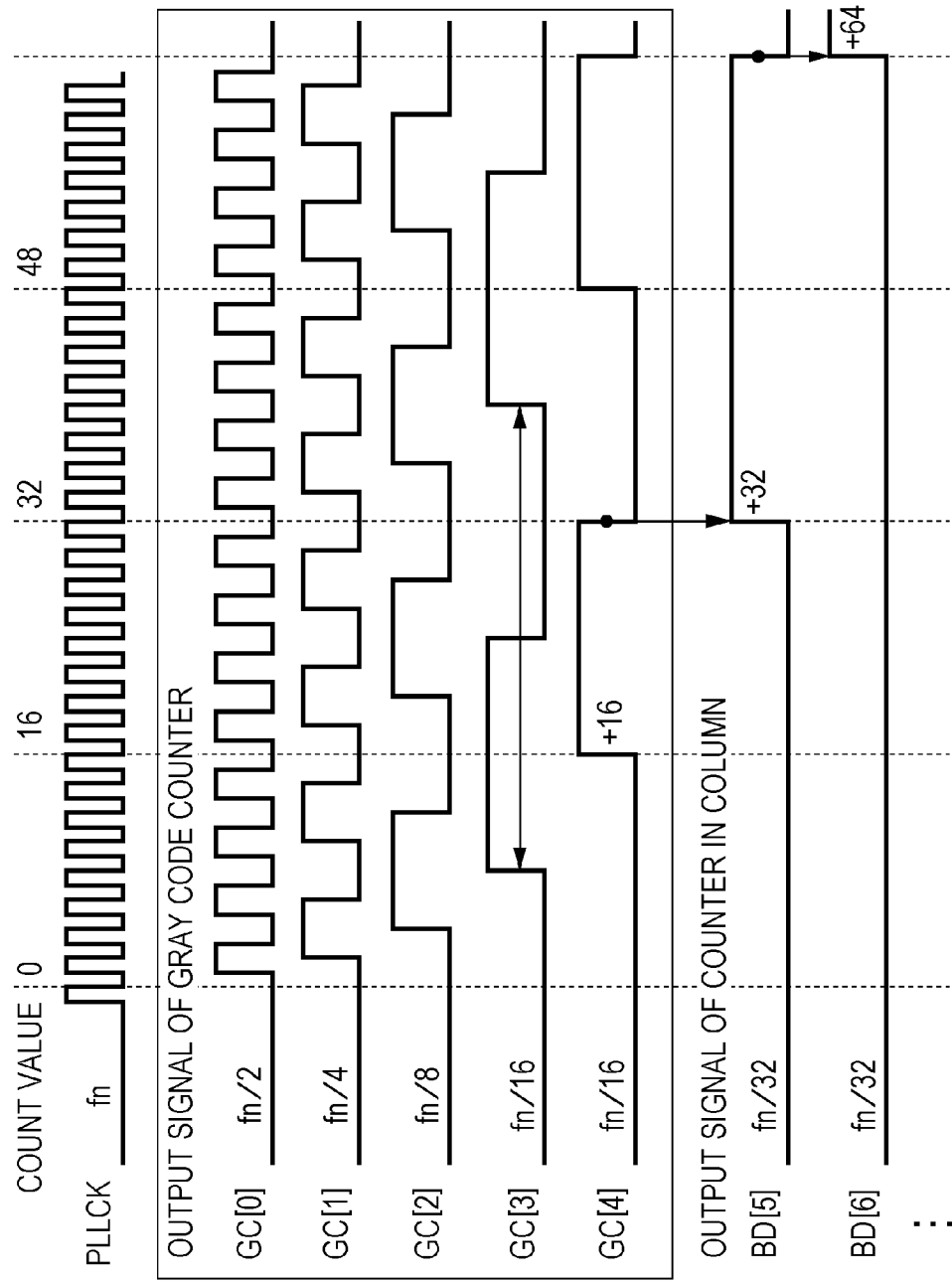
FIG. 22 is a view illustrating examples of gray codes latched in the lower bit latch portions and an output of each counter of the upper bit counter portions in the electronic device of Example 4.

Example 4 is a modification of Examples 1 to 3. Incidentally, in the AD converter, the power consumption of the counter of a lower side bit occupies most of the power consumption of the AD converter. Therefore, in Example 4, the analog-digital converter includes the gray code counter. Here, an AD converter 110 which performs the comparison processing for each column, the latch operation of the lower side bit, and the count operation of an upper side bit is arranged in each column. FIGS. 20 and 21 illustrate basic configuration diagrams of the AD converter 110. FIG. 22 illustrates examples of gray codes latched in a lower bit latch portion, and outputs each counter of an upper bit counter.

The AD converter 110 has a comparator 111, a lower bit latch circuit 120 for lower Nbits, an upper bit counter portion 130 for upper Mbits, and a bit inconsistency prevention circuit 140 (refer to FIG. 21). In the AD converter 110, a gray code counter 150 which functions as a code conversion counter is arranged. In this manner, the AD converter 110 of Example 4 is an AD converter for the lower side Nbits and the upper side Mbits. Specifically, N=5 and M=10, for example. Then, the output of the AD converter 110 is transmitted out to the data latch portion 55. The lower bit latch portion 120, the upper bit counter portion 130, the bit inconsistency prevention circuit 140, and the gray code counter 150 respectively have the depletion-type field effect transistors.

In each AD converter 110, the count operation of the lower side bit in each column is not performed. The output of the Nbit gray code counter 150 which is individually arranged in the multiple columns and performs the count being synchronized with the reference clock PLLCK is latched in each column, thereby determining the AD conversion value. The reference clock PLLCK generated in a PLL circuit 113 of the clock supply portion is input to the gray code counter 150 only. Therefore, it is possible to lessen the wiring load and increase the operation frequency. Since the count operation of the lower side bit for each column is not performed, the power consumption can be minimized. Regarding the upper side bit, the count operation is performed using an Nth-bit code (clock) of the output of the gray code counter. Accordingly, correlated double sampling (CDS) processing can be performed. Regarding the latched lower side bit, it is possible to perform so-called vertical (V) direction addition in each column by arranging an adder and the like in each column. In the AD converter 110 of Example 4, the power consumption can be decreased to approximately one-eighth compared to the AD converter by the full bit counter method having simultaneous time resolution.

The gray code counter 150 performs the count operation upon reception of the reference clock PLLCK of a frequency fn (MHz), for example, which is generated in the PLL circuit 113 of the clock supply portion, thereby generating gray codes GC [0] to GC [4] of Nbit (N=5) based on the divided frequency. The gray code GC of Nbit is formed as a code in which a level transition between a logic [0] and a logic [1] occurs in only one bit. Specifically, the gray code counter 150 generates the least significant gray code GC [0] of the frequency (fn/2), the gray code GC [1] of the frequency (fn/4), the gray code GC [2] of the frequency (fn/8), the gray code GC [3] of the frequency (fn/16), and the most significant gray code GC [4], thereby supplying the gray codes to the lower bit latch portion 120. The gray code counter 150 generates binary codes PG [0] to PG [4] at falling edges of the reference clock PLLCK. Then, each bit is resynchronized by the clock CK having the same frequency as the reference clock PLLCK, and the inversion signal XCK thereof, thereby outputting the gray codes GC [0] to GC [4]. The gray code counter 150 has a function of generating a carry mask signal CMASK which is used in the bit inconsistency prevention circuit 140, and the function will be described later.

The comparator 111 compares the reference voltage $V_{ref}$ which is generated in the ramp voltage generator (reference voltage generator) 112, and the analog signal. For example, the comparator 111 outputs an output signal VCO at a high level until the reference signal $V_{ref}$ and the analog signal match each other. When the reference signal $V_{ref}$ and the analog signal match each other, the level of the output signal VCO is inverted from the high level to the low level.

The latch operation of the gray codes GC [0] to GC [4] in the lower bit latch portion 120 is triggered by the inversion of the output level of the output signal VCO of the comparator 111. In other words, the lower bit latch portion 120 has a function to latch the gray codes GC [0] to GC [4] generated in the gray code counter 150 triggered by the output of the comparator 111 inverted to the low level. As illustrated in FIG. 21, the lower bit latch portion 120 arranged in each column has lower bit latch circuits (LTC) $120_0$, $120_1$, $120_2$, $120_3$, and $120_4$ in which each gray codes GC [0] to GC [4] are latched, and an input portion (VCO input portion) $VCO_{IN}$ to which the output of the comparator 111 is input. Here, the lower bit latch circuit $120_0$, the lower bit latch circuit $120_1$, the lower bit latch circuit $120_2$, the lower bit latch circuit $120_3$, and the lower bit latch circuit $120_4$ respectively take the gray code GC [0], the gray code GC [1], the gray code GC [2], the gray code GC [3], and the gray code GC [4] from the gray code counter 150, thereby perform the latching. Then, the output of the highest lower bit latch circuit $120_4$ is supplied to the lowest counter $130_0$ of the upper bit counter portion 130 for upper Mbits through the bit inconsistency prevention circuit 140. Each of the lower bit latch circuits $120_0$ to $120_4$ outputs the latch data at the time of the phase P to a signal processing circuit 160 (refer to FIG. 26) through a data transfer line (not illustrated) to be subjected to the CDS processing. Then, the data processing of the phase P is performed in the signal processing circuit 160 included in the AD converter 110.

Counters (binary counters) $130_0$ to $130_9$ of Mbit (in Example 4, M=10) are connected in cascade to the upper bit counter portion 130. The counters $130_0$ to $130_9$ respectively are the up/down (U/D) counters. The upper bit counter portion 130 performs the count operation upon the reception of the latch output of the highest lower bit latch circuit $120_4$ of the lower bit latch portion 120. In other words, as illustrated in FIG. 22, in the upper bit counter portion 130, the lowest counter $130_0$ starts the count at a falling timing of the gray code GC [4] latched in the highest lower bit latch circuit $120_4$ of the lower bit latch portion 120. Subsequently, the counter $130_1$ in the succeeding stage starts the count at the falling timing of the output signal of the counter $130_0$ in the preceding stage. Thereafter, similarly, the counter operation is performed at the falling timing of the output signal of the preceding counter.

Figure 23:
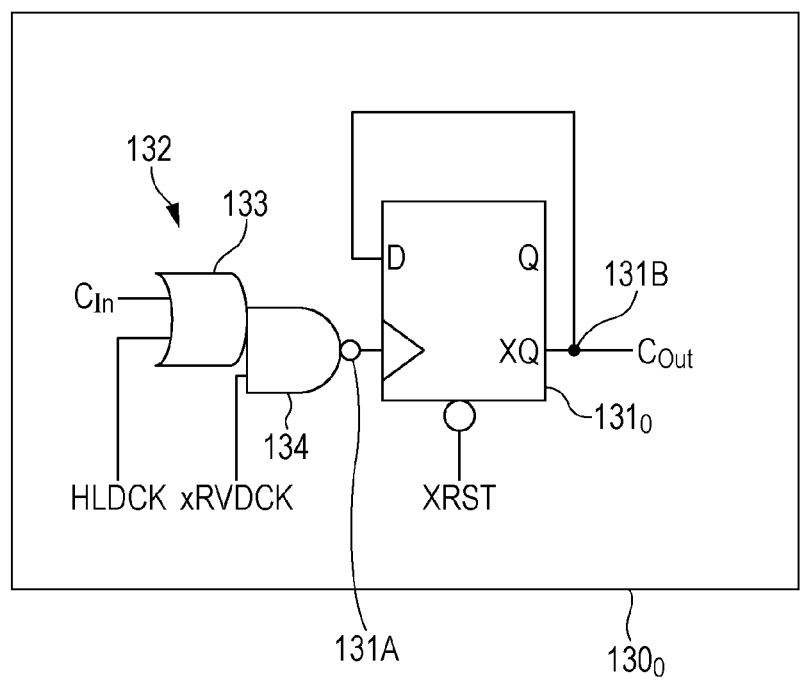
FIG. 23 is a view illustrating a configuration example of the counter configuring the upper bit counter portion in the electronic device of Example 4.

FIG. 23 illustrates a configuration diagram of the counter $130_0$ included in the upper bit counter portion 130. The counter $130_0$ has a flip-flop $131_0$ and an ORNAND gate 132 which is arranged in the clock input stage of the flip-flop $131_0$. A carry-out $C_{Out}$ of the preceding stage is input to a first input terminal of an OR gate 133 of an ORNAND gate 132 as a carry-in $C_{In}$ (clock input), thereby supplying a first external control signal HLDCK to a second input terminal. The output of the OR gate 133 is supplied to the first input terminal of a NAND gate 134. A second external control signal xRVDCK is supplied to the second input terminal. The output portion of the NAND gate 134 is connected to a node 131A of the flip-flop $131_0$. When the output of the ORNAND gate 132 is in the low level, the latch data of an output node 131B of the flip-flop $131_0$ is supplied to a Q input side. On the other hand, when the output of the ORNAND gate 132 is in the high level, the latch data of the output node 131B becomes an inversion level of the Q input side level. The counter $130_0$ having such a configuration has a data inversion function during the switching of the phase P and the phase D.

Figure 24:
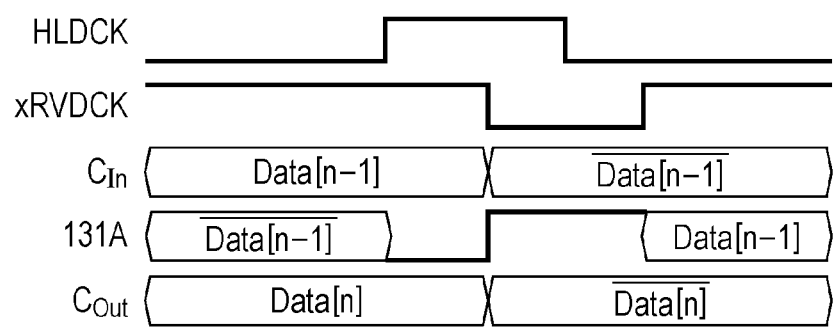
FIG. 24 is a view illustrating a function of data inversion when switching a phase P and a phase D in the counter illustrated in FIG. 23.

The data inversion function during the switching of the phase P and the phase D in the counter $130_0$ illustrated in FIG. 23 will be described based on FIG. 24. In the counter $130_0$, the data inversion in all the bits can be realized by directly controlling the clock line of each bit from outside, and forcedly adding rising (rise)/falling (fall) edge which is necessary for the count operation (data inversion) only, and once. In this case, the level of the node 131A can be switched from the low level to the high level by switching the second external control signal xRVDCK from the high level to the low level while maintaining the first external control signal HLDCK at a high level. Thus, the data can be inverted.

Figure 25:
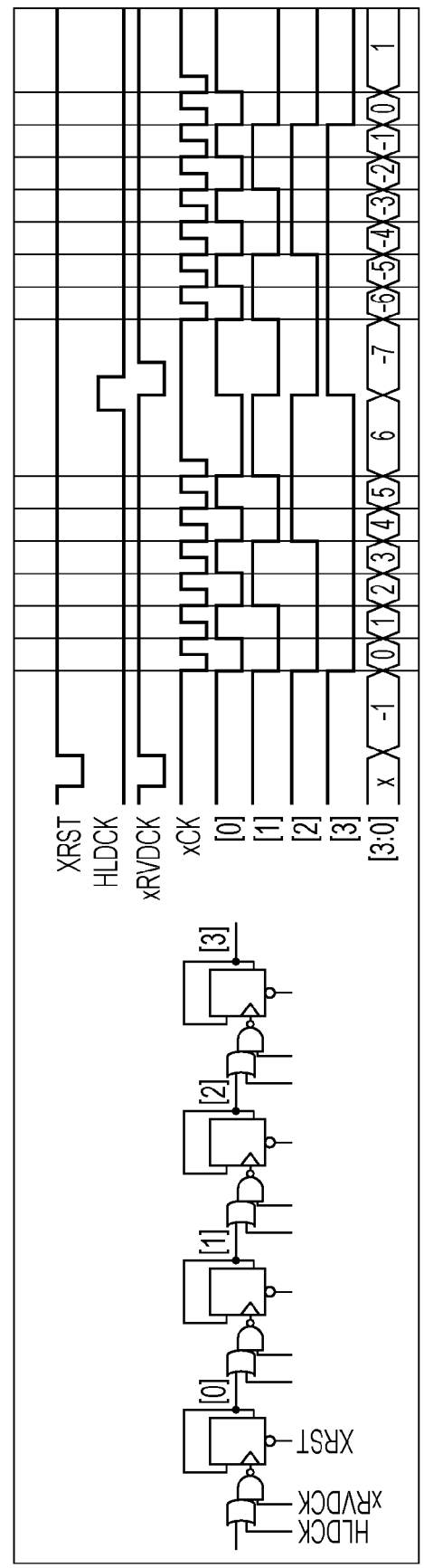
FIG. 25 is a view illustrating an example of a timing chart including a state transition of output data when four counters are in cascade connection.

FIG. 25 illustrates an example of the timing chart including the state transition of the output data when four counters are connected in cascade. In the example, the operation of count-up is performed. After the count value becomes "6", the second external control signal xRVDCK is switched from the high level to the low level while maintaining the first external control signal HLDCK at the high level, thereby performing the data inversion. Accordingly, the data is switched to the down count from "-7". In this manner, the upper bit counter portion 130 has a function to perform the CDS processing in each column. Therefore, in each AD converter 110, the latched data (gray code data) of the gray code GC [0] to GC [4] of the lower Nbit (N=5) is output to the data transfer line. Regarding the upper Mbit (M=10) as well, the data (binary data) subjected to the CDS processing by the upper bit counter portion 130 is output to the data transfer line. Then, the data is supplied to the signal processing circuit 160 through the data transfer line, and then, the overall CDS processing is performed in the signal processing circuit 160.

Figure 26:
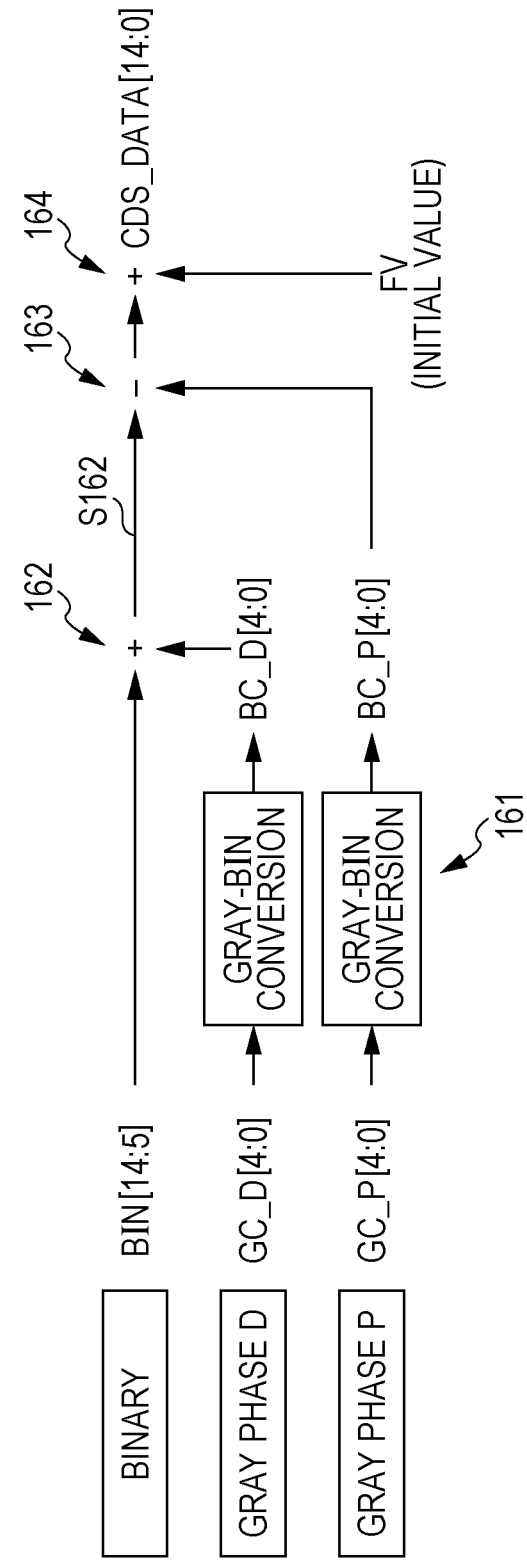
FIG. 26 is a view illustrating arithmetic processing of correlated double sampling of the signal processing circuit in the electronic device of Example 4.
Figure 27:
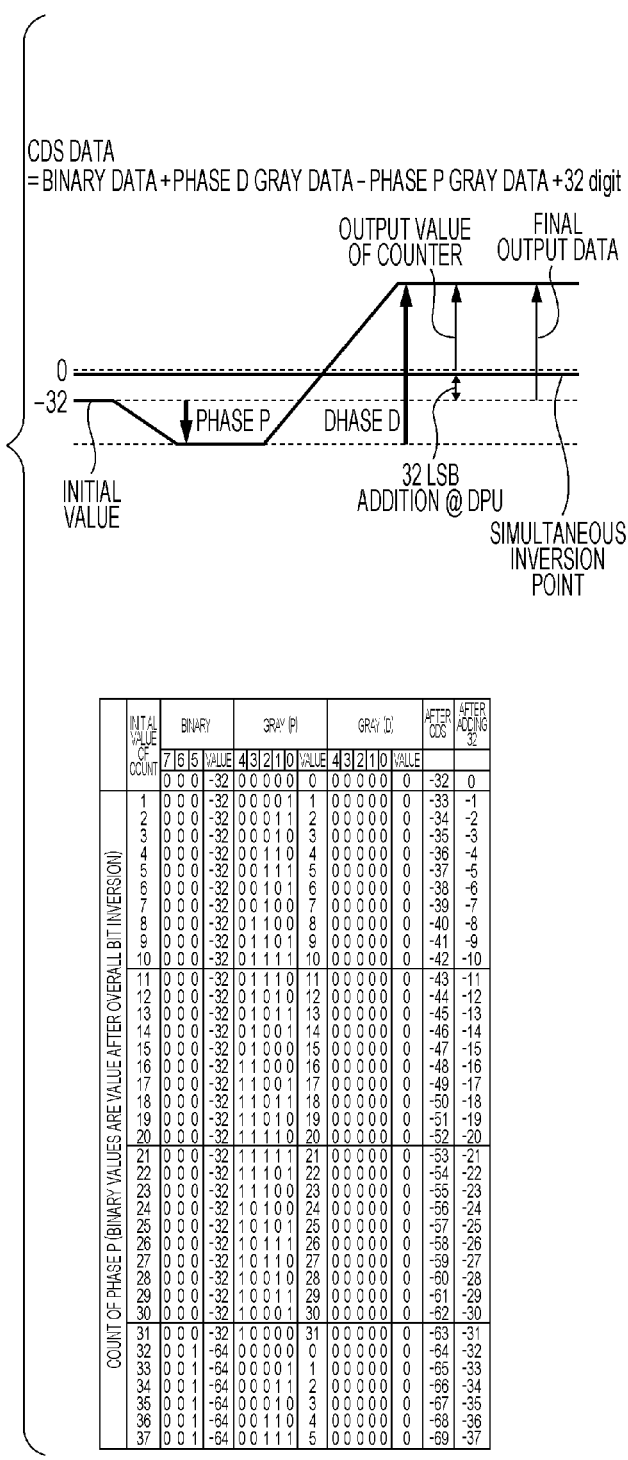
FIG. 27 is a view illustrating a specific example arithmetic processing of correlated double sampling of binary data and the gray code in the electronic device of Example 4.

FIG. 26 schematically illustrates CDS arithmetic processing in the signal processing circuit 160, and FIG. 27 illustrates a specific example of the CDS arithmetic processing of the binary data and the gray code data. As illustrated in FIG. 26, an upper bit BIN [14:5], a gray code GC_P [4:0] of the phase P, and a gray code GC_D [4:0] of the phase D which are pieces of binary data subjected to the CDS processing in advance are basically input to the signal processing circuit 160. The signal processing circuit 160 has a conversion circuit 161 to convert from the gray code to the binary code. The conversion circuit 161 converts the gray code GC_P [4:0] of the phase P into a binary code BC_P [4:0], and converts the gray code GC_D [4:0] of the phase D into the binary code BC_D [4:0]. Then, in the addition portion 162 included in the signal processing circuit 160, the upper bit BIN [14:5] and the binary code BC_D [4:0] of the phase D are added. Subsequently, in a subtraction portion 163 included in the signal processing circuit 160, the binary code BC_P [4:0] of the phase P is subtracted from the addition result 5162 of the addition portion 162. Moreover, in an addition portion 164, the initial value FV (32 in Example 4) is added to the subtraction result of the subtraction portion 163, thereby obtaining the data CDS_DATA [14:0] subjected to the CDS calculation in its entirety.

In the example illustrated in FIG. 27, the counts of the phase P and the phase D are performed from a reset initial value −32, and the CDS calculation of the lower gray code is eventually performed in the signal processing circuit (DPU) 160. The arithmetic expression can be indicated as follows:

CDS data=(binary data)+(gray data of phase $D$)− (gray data of phase $P$)+32 digits that is,

CDS_DATA[14:0]=BIN[14:5]+BC_D[4:0]−BC_P[4: 0]+32

Figure 28:
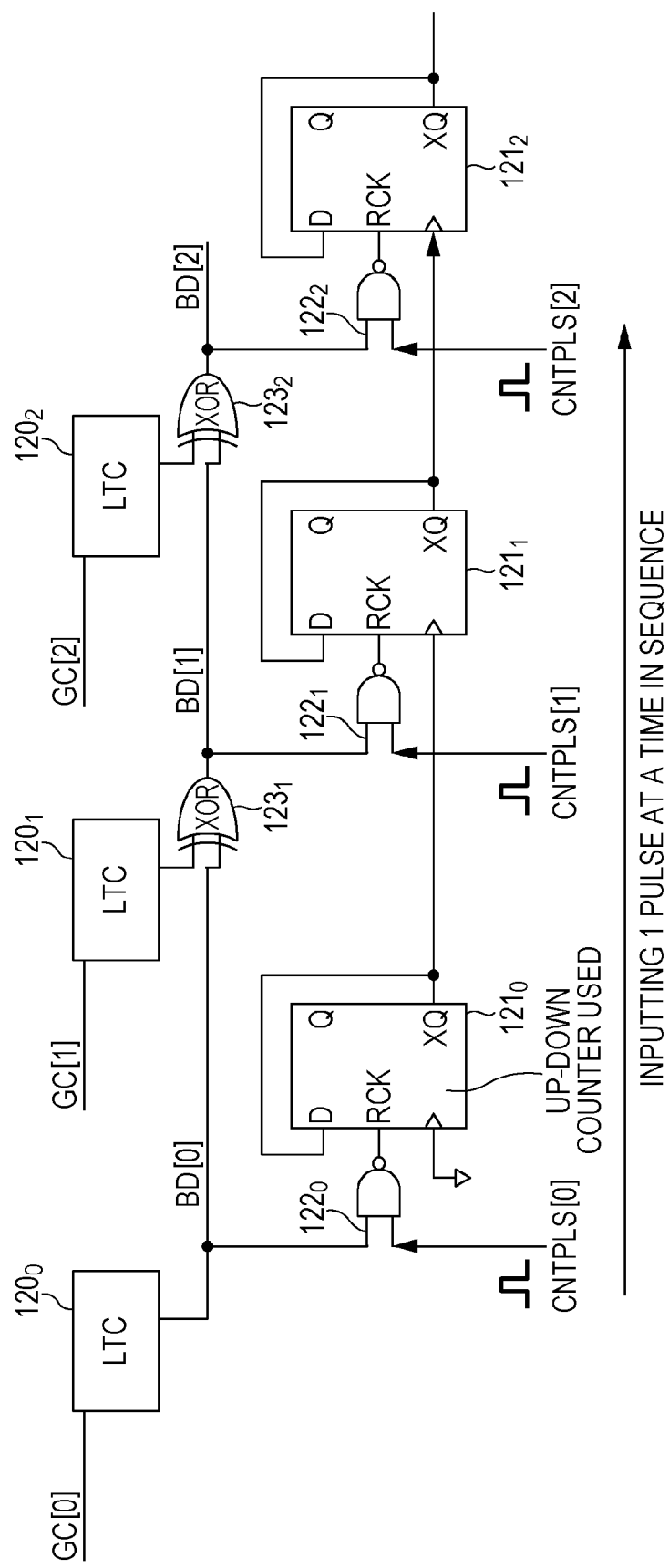
FIG. 28 is a circuit diagram illustrating a configuration example of a correlated double sampling processing portion which performs processing of the correlated double sampling by adding latch data of the lower bit latch portion within a column.

It is possible to perform the CDS arithmetic processing by performing the addition processing of the latch data of the lower bit latch circuits $120_0$ to $120_4$ in column. FIG. 28 illustrates a circuit diagram of a configuration example of the processing portion which performs the CDS arithmetic processing by performing the addition processing of the latch data of the lower bit latch circuit in column. In the following description, the description will be given regarding the lower bit latch circuits $120_0$ to $120_2$ among the lower bit latch circuits $120_0$ to $120_4$. However, the same thing can be applied to the lower bit latch circuits $120_3$ to $120_4$.

A processing portion has flip-flops $121_0$, $121_1$, and $121_2$ as up/down counters in addition to the lower bit latch circuits $120_0$ to $120_2$. The processing portion also has dual input NAND gates $122_0$, $122_1$, and $122_2$, and EXOR gates $123_1$ and $123_2$ as code conversion circuits. In the processing portion, the gray code GC [0] which is latched in the lower bit latch circuit $120_0$ the lowest thereamong is handled as the binary code BD [0] as it is. The binary code BD [0] the lowest thereamong is supplied to the first input terminal of the NAND gate $122_0$. A pulse signal CNTPLS [0] is supplied to the second input terminal of the NAND gate $122_0$. The output terminal of the NAND gate $122_0$ is connected to the terminal RCK of the flip-flop $121_0$. Then, an inversion output terminal XQ of the flip-flop $121_0$ is connected to its own data input terminal D and the clock terminal of the flip-flop $121_1$ in the succeeding stage. The flip-flop 1210 outputs a carry when the latch data becomes [1] from [0].

The lower side bits excluding the lowest bit are converted into the binary codes BD [1] to BD [4] by being subjected to the exclusive-OR (EXOR) between the gray code GC latched in its own stage and the binary code BD in the preceding stage. In other words, the gray code GC [1] latched in the lower bit latch circuit $120_1$ is subjected to the EXOR with the binary code BD [0] of the preceding stage at the EXOR gate $123_1$, thereby being converted into the binary code BD [1]. The binary code BD [1] is supplied to the first input terminal of the NAND gate $122_1$. The pulse signal CNTPLS [1] is supplied to the second input terminal of the NAND gate $122_1$. The output terminal of the NAND gate $122_1$ is connected to the terminal RCK of the flip-flop $121_1$. Then, the inversion output terminal XQ of the flip-flop $121_1$ is connected to its own data input terminal D and the clock terminal of the flip-flop $121_1$ in the succeeding stage. The flip-flop $121_1$ outputs a carry when the latch data becomes [1] from [0].

The gray code GC [2] latched in the lower bit latch circuit $120_2$ is subjected to the EXOR with the binary code BD [1] of the preceding stage at the EXOR gate $123_2$, thereby being converted into the binary code BD [2]. The binary code BD [2] is supplied to the first input terminal of the NAND gate $122_2$. The pulse signal CNTPLS [2] is supplied to the second input terminal of the NAND gate $122_2$. The output terminal of the NAND gate $122_2$ is connected to the terminal RCK of the flip-flop $121_2$. Then, the inversion output terminal XQ of the flip-flop $121_2$ is connected to its own data input terminal D and the clock terminal of the flip-flop $121_2$ in the succeeding stage. The flip-flop $121_2$ outputs a carry when the latch data becomes [1] from [0]. Thereafter, the similar processing is performed in the stages of the lower bit latch circuits $120_3$ and $120_4$.

The pulse signals CNTPLS [0], [1], [2], [3], and [4] are sequentially input one pulse at a time.

In the AD converter 110, the bit inconsistency prevention circuit 140 which prevents inconsistency of bits is arranged between the highest lower bit latch circuit $120_4$ and the lowest counter $130_0$ of the upper bit counter portion 130. The bit inconsistency prevention circuit 140 is arranged on account of the following reason. In other words, in a compound counter method of the gray code and the binary code, when the data is latched at a change-point timing of the highest bit GC [4] of the gray code, there may be an occurrence of a so-called metastable state. The occurrence of the metastable state causes the inconsistency of the data between the highest gray code data GD [4] of the gray codes and the lowest bit data BD [5] of the binary codes, thereby resulting in a possibility of an occurrence of the erroneous count.

Figure 29A:
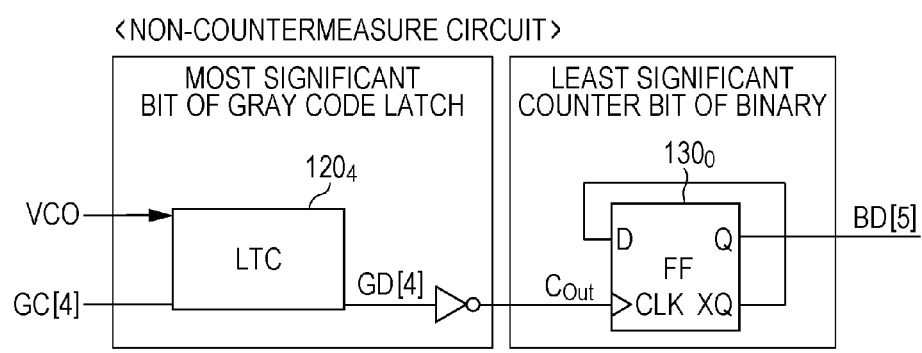
FIGS. 29A and 29B are views illustrating a configuration and a timing chart when a bit inconsistency prevention circuit is not arranged.
Figure 29B:
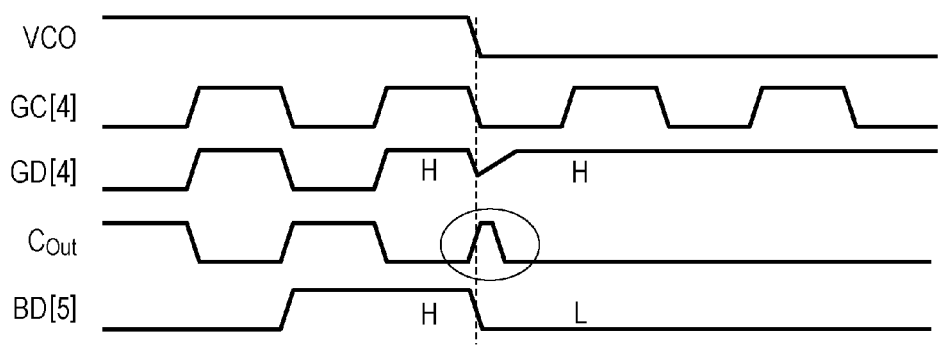

In this regard, a description will be given in association with FIGS. 29A and 29B. Here, the FIGS. 29A and 29B are diagrams illustrating a configuration and a timing chart when the bit inconsistency prevention circuit is not arranged. As is in FIG. 29A, when the bit inconsistency prevention circuit is not arranged, if the data is latched in a falling change-point of the gray code GC [4], the metastable state occurs depending on the timing thereof. Accordingly, consistency between the gray code data GD [4] and the binary data BD [5] is not achieved, and thus, there may be an occurrence of data jumping of 32 digits. In other words, as illustrated in FIG. 29B, even though the gray code data GD [4] does not fall, the carry ($C_{Out}$) is generated, and the upper binary bit BD [5] is inverted. As a result, the data jumping occurs.

Figure 30A:
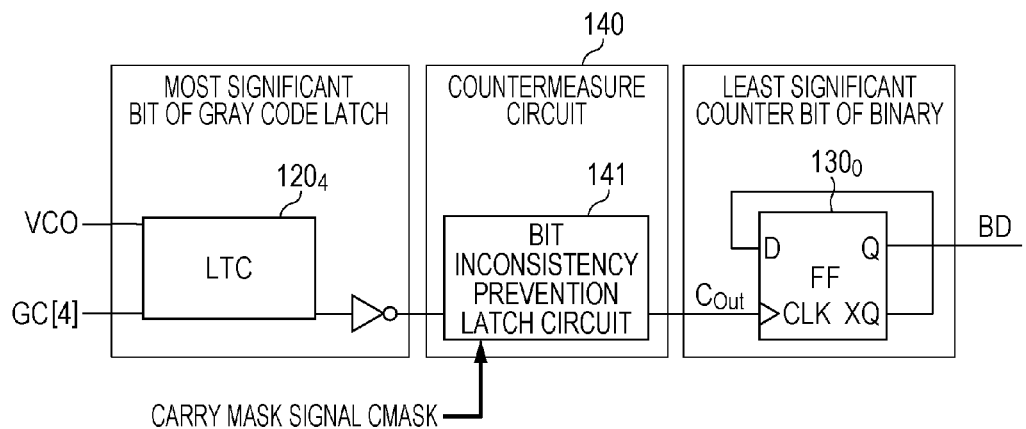
FIGS. 30A and 30B are views illustrating a configuration and a timing chart when the bit inconsistency prevention circuit is arranged.
Figure 30B:
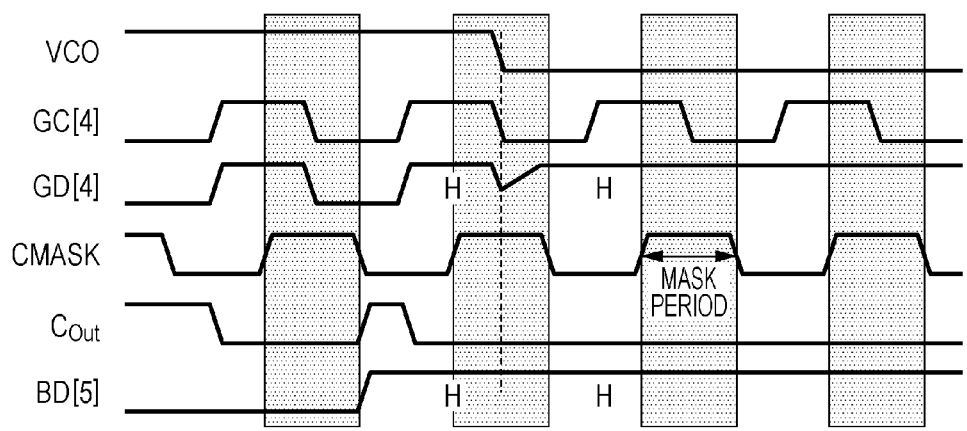

FIGS. 30A and 30B illustrate a configuration and a timing chart when the bit inconsistency prevention circuit 140 is arranged. In the bit inconsistency prevention circuit 140, as illustrated in 30B, the carry ($C_{Out}$) generated during the falling of the gray code data GD [4] is temporarily subjected to a mask by the carry MASK signal CMASK. Then, the carry $C_{Out}$ is output by the value of the gray code data GD [4] after releasing the mask. In this manner, a code latch error can be prevented by introducing the bit inconsistency prevention circuit 140 the carry mask CMASK.

The bit inconsistency prevention circuit 140 has a latch circuit 141 for preventing bit inconsistency. The carry mask signal CMASK is supplied to the latch circuit 141 for preventing bit inconsistency. The latch circuit 141 for preventing bit inconsistency masks (stops for a predetermined period) the output of the carry $C_{Out}$ of the corresponding gray code data GD [4], when the carry mask signal CMASK is retained in the high level. Then, with the lapse of predetermined time, when the carry mask signal CMASK is switched to the low level, thereby outputting the carry $C_{Out}$. In this manner, the output of the highest lower bit latch circuit $120_4$ is supplied to the lowest counter $130_0$ of the upper bit counter portion 130 for upper Mbits after the output thereof is stopped for a predetermined period through the bit inconsistency prevention circuit 140.

FIG. 31 illustrates a waveform chart for illustrating a carry mask signal in Example 4. It is necessary that the carry mask signal CMASK becomes a signal to be in the high level at the falling timing of the most significant bit of the gray codes (GC). When the gray code has Nbit, it is possible to use the bit located one lower than the most significant bit (Nth-bit), that is, an inversion signal of (N−1)th-bit as the carry mask signal CMASK. This condition is effective regardless of the value of N. In Example 4, a signal equivalent to the inversion signal of the gray code GC [3] is adopted as the carry mask signal CMASK.

Figure 32:
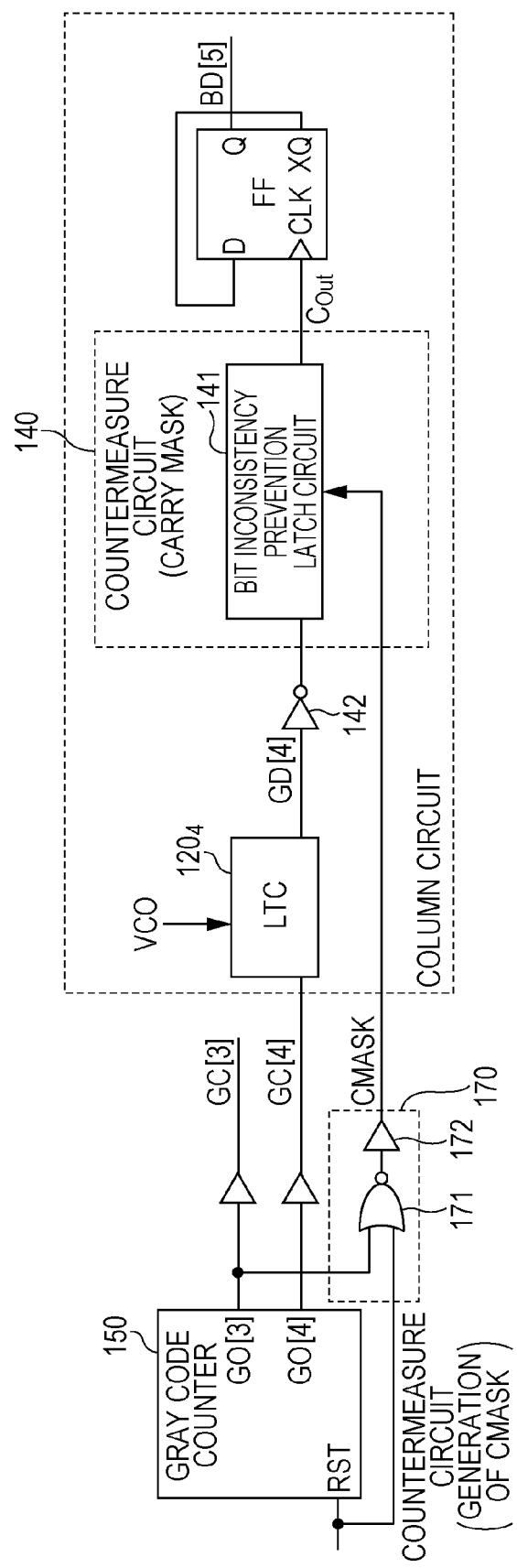
FIG. 32 is a view illustrating a configuration example of a processing portion including a carry mask signal generation circuit and the bit inconsistency prevention circuit.

FIG. 32 illustrates a configuration example of a carry mask signal generation circuit 170 included in the AD converter 110 and the AD converter including the bit inconsistency prevention circuit 140. The carry mask signal generation circuit 170 has a NOR gate 171 and a buffer 172. In the NOR gate 171, bit of the gray code GC [3] located one lower than the most significant bit (Nth-bit) is supplied to the first input terminal, and the reset signal is supplied to the second input terminal. In this manner, the carry mask signal CMASK is generated as a signal equivalent to the inversion signal of the gray code GC [3]. In the configuration of FIG. 32, the bit inconsistency prevention circuit 140 has an inverter 142 which is connected to a supply line of the carry mask signal CMASK in series. An inversion signal XCMASK of the carry mask signal CMASK can be obtained by the output of the inverter 142, and the carry mask signal CMASK having the same phase as the gray code GC [3] by the output of the inverter 142. In this manner, in the vicinity of the falling edge of the gray code GC [4] in which the metastable state may occur, the carry is masked to the succeeding stage by the carry mask signal CMASK, and the carry is generated by the value of the gray code data GD [4] when releasing the mask. It is possible to prevent the occurrence of the metastable state by adjusting the data latch timing without providing the bit inconsistency prevention circuit 140.

Figure 33:
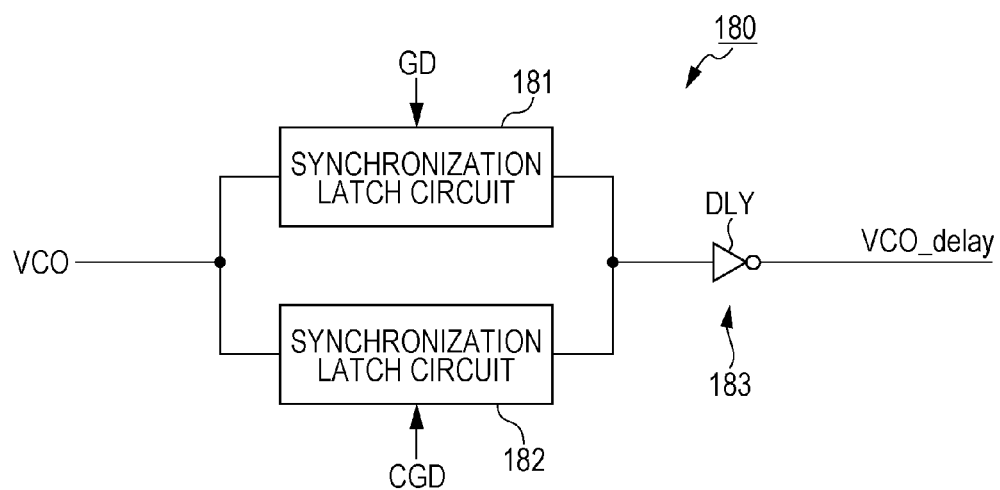
FIG. 33 is a view illustrating a configuration example of a data latch timing adjustment circuit.
Figure 34:
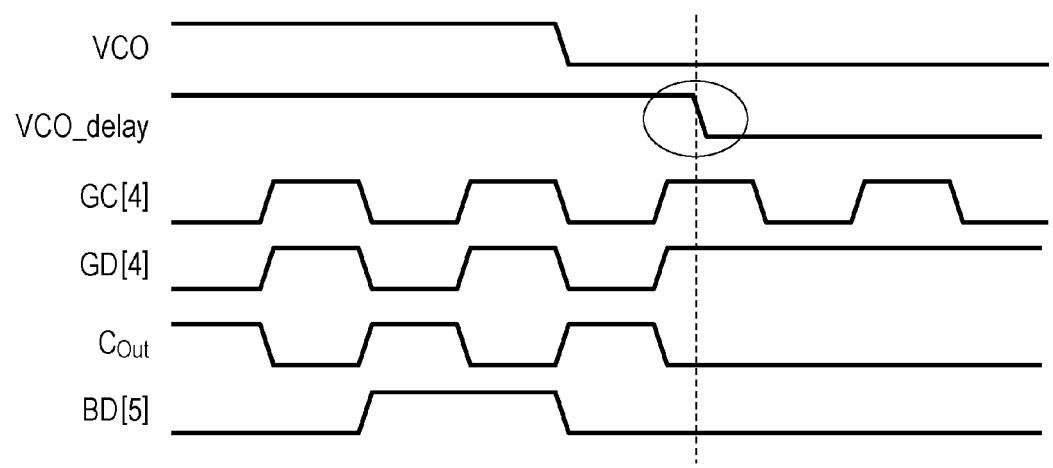
FIG. 34 is a view illustrating a timing chart of the data latch timing adjustment circuit illustrated in FIG. 33.

FIG. 33 illustrates a configuration example of a data latch timing adjustment circuit 180 included in the AD converter 110, and FIG. 34 illustrates the timing chart of the circuit in FIG. 33. The data latch timing adjustment circuit 180 is arranged in a VCO input portion $VCO_{IN}$, for example. The data latch timing adjustment circuit 180 causes an output signal VCO of the comparator 111 which is used in the latch operation in the highest lower bit latch circuit $120_4$ to be synchronized with the level of the gray code data GD, that is, the signal of the latch node of the lower bit latch circuit $120_4$. Then, the data latch timing adjustment circuit 180 has a function to delay the signal VCO synchronized with the gray code data GD so as not to perform the latch by timing in accordance with the gray code GC, thereby supplying to the lower bit latch circuit $120_4$. The data latch timing adjustment circuit 180 includes synchronization latch circuits 181 and 182, and a delay portion 183. The synchronization latch circuit 182 has a function to be synchronized with the gray code data GD, to latch the signal VCO, and to output the same. When the synchronization latch circuit 181 is outputting the signal VCO, the output of the synchronization latch circuit 182 is retained in high impedance (Hi-Z). Similarly, when the synchronization latch circuit 182 is outputting the signal VCO, the output of the synchronization latch circuit 181 is retained in high impedance (Hi-Z). The delay portion 183 delays the signal VCO which is synchronized with the gray code data in the synchronization latch circuits 181 and 182, and delayed so as not to perform the latch by timing in accordance with the gray code GC, thereby supplying to the lower bit latch circuit $120_4$. The delay portion 183 is formed by one or multiple delay elements DLY, and an amount of delay of the signal VCO is adjusted in accordance with the number of elements or the delay value of the delay element.

In this manner, a synchronization delay latch signal (VCO_delay) which is synchronized with the gray code by the data latch timing adjustment circuit 180 and to which the delay is applied is used as a latch signal so as not to perform the data latch at the timing of the change-point of the bit. Therefore, as illustrated in FIG. 34, it is possible to prevent the occurrence of the metastable state. In the data latch timing adjustment circuit 180, the synchronization latch circuits 181 and 182 are provided in parallel because the AD converter 110 operates by the resolution of a half-cycle period of the clock. In other words, in order to maintain the resolution, the synchronization latch circuits 181 and 182 are provided in parallel to acquire the synchronization latch so as to be in parallel at the timing of rising and falling of the gray code data.

Example 5

Example 5 is a modification of Examples 1 to 4. In an electronic device of Example 5, an analog-digital converter includes a successive approximation-type analog-digital converter.

Figure 35:
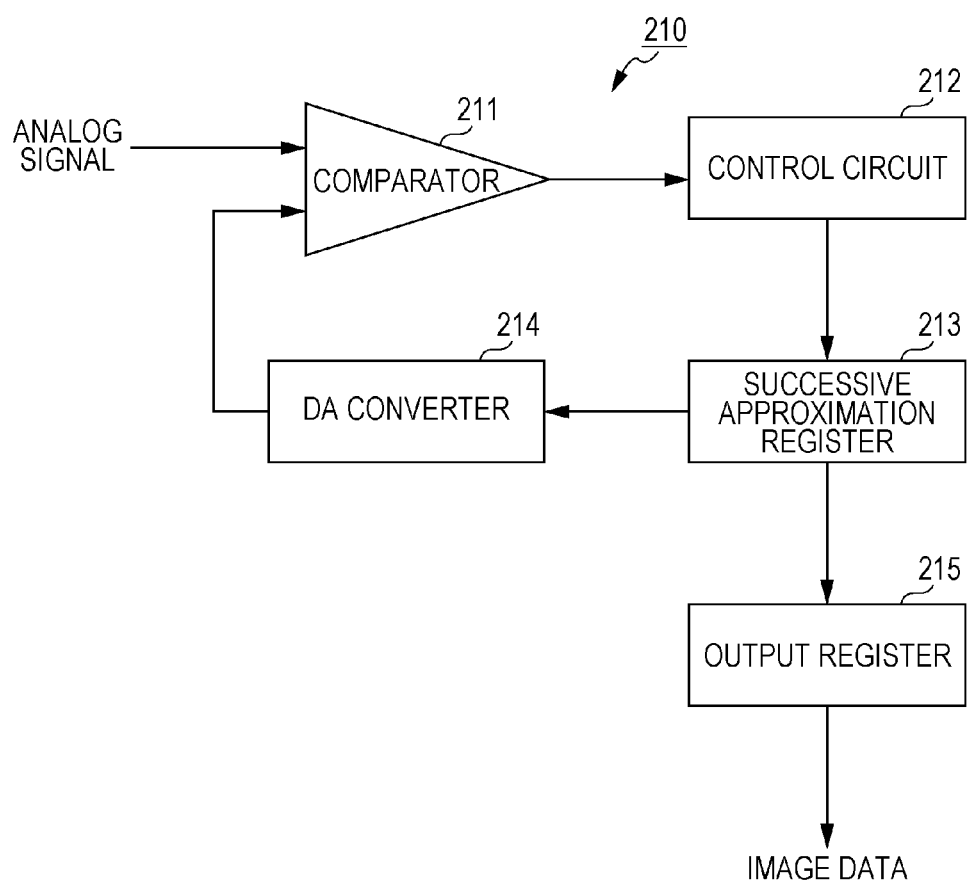
FIG. 35 is a circuit diagram illustrating a configuration of a successive approximation-type analog-digital converter in an electronic device of Example 5.

FIG. 35 illustrates a scheme of the AD converter of a successive approximation type. An AD converter 210 includes a comparator 211, a control circuit 212 including a successive approximation clock generator (not illustrated), a successive approximation register 213, a digital-analog converter (DA converter) 214, and an output register 215. Here, a circuit other than the comparator 211 and the digital-analog converter (DA converter) 214, that is, a control circuit 212 including the successive approximation clock generator, and a semiconductor device (FET) including the successive approximation register 213 and the output register 215 has the depletion-type field effect transistor.

The control circuit 212 controls values to be set to the successive approximation register 213 of Nbits (N: natural number) based on a comparison result of the comparator 211. The comparator 211 compares an analog signal from the sensors 40 and a signal voltage which can be obtained when the DA converter 214 converts the digital value of the successive approximation register 213 into an analog value, thereby outputting the comparison result indicating a magnitude correlationship therebetween to the control circuit 212. The control circuit 212 performs the comparison for each bit from the upper bit toward the lower bit of the successive approximation register 213, thereby converting the analog signal into a digital value through N times of the comparison by changing the set value of the successive approximation register 213 in accordance with the obtained comparison result.

For example, when the value of N is "8", the control circuit 212 initially sets only the seventh bit of the successive approximation register 213 to "1", and then, the control circuit 212 compares an analog signal voltage value and an analog signal (signal level $V_{Sig}$) corresponding to the digital value thereof using the comparator 211. When the obtained comparison result indicates that the output voltage of the DA converter 214 is greater than the signal level $V_{Sig}$, the control circuit 212 changes the seventh bit of the successive approximation register 213 to "0". If not, the control circuit 212 allows the seventh bit of the successive approximation register 213 to remain "1" and stores the value of the seventh bit in the output register 215. Thereafter, in procedures similar to that of the seventh bit, with respect to each bit until reaching the bit of the zeroth-bit, the bit is initially set to "1", and each bit is appropriately reset to "0" in accordance with the comparison result output from the comparator 211, similar to the case of the seventh bit. When the comparison is performed for eight bits in this manner, it is possible to obtain a result in which the analog signal is converted into a digital value in the successive approximation register 213. Then, the output (the digital value stored in the output register 215) of the AD converter 210 is sent out to the data latch portion 55. The conversion speed of the AD converter 210 illustrated in FIG. 35 ranges approximately from 1 microsecond to hundreds of microseconds, thereby having the conversion speed slower than the single slope-type analog-digital converter illustrated in Examples 1 to 3. However, it is possible to make the circuit size small.

Example 6

Figure 36A:
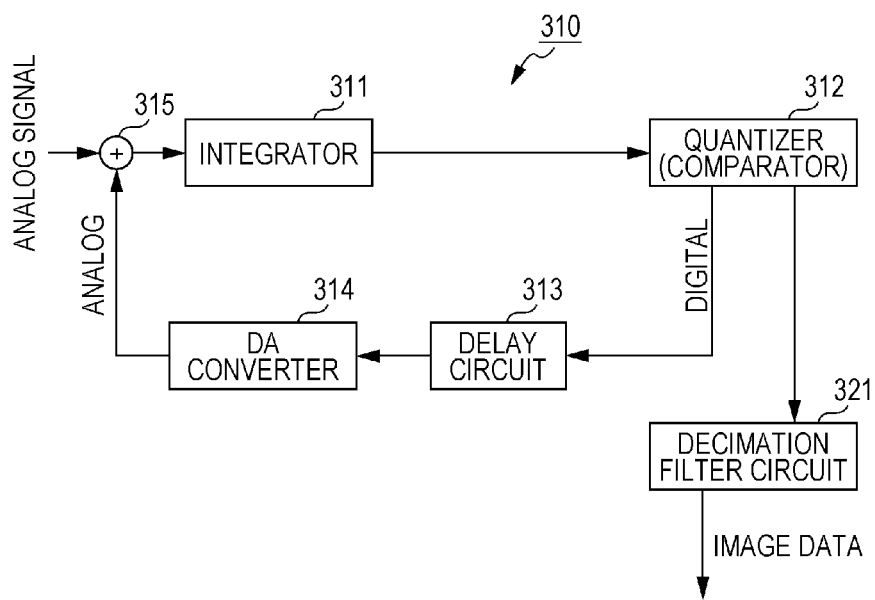
FIGS. 36A and 36B are circuit diagrams illustrating configurations of a delta-sigma modulation-type (A modulation-type) analog-digital converter in an electronic device of Example 6.

Example 6 is also a modification of Examples 1 to 4. In an electronic device of Example 6, an analog-digital converter includes a delta-sigma modulation-type (ΔΣ modulation-type) analog-digital converter (hereinafter, referred to as ΔΣ AD converter) 310. FIG. 36A illustrates a basic configuration of the ΔΣ AD converter 310. Here, in the ΔΣ AD converter, a semiconductor device (FET) including a circuit other than an integrator 311 and a digital-analog converter (DA converter) 314 has the depletion-type field effect transistor.

The ΔΣ AD converter 310 includes at least the integrator 311, a quantizer (comparator) 312, a delay circuit 313, the digital-analog converter (DA converter) 314 forming a portion of a feedback system, and a adder 315 which functions as an input portion and has a level shift function. In the ΔΣ AD converter 310, an analog signal from the sensor 40 is caused to pass through the integrator 311 and the quantizer 312 so as to be 1 bit data, thereby being output to a decimation circuit (decimation filter circuit) 321. In the decimation circuit (decimation filter circuit) 321, the 1 bit data is multiplied in bits, and the number "1" is subjected to digital addition for each time slot, basically.

Figure 36B:
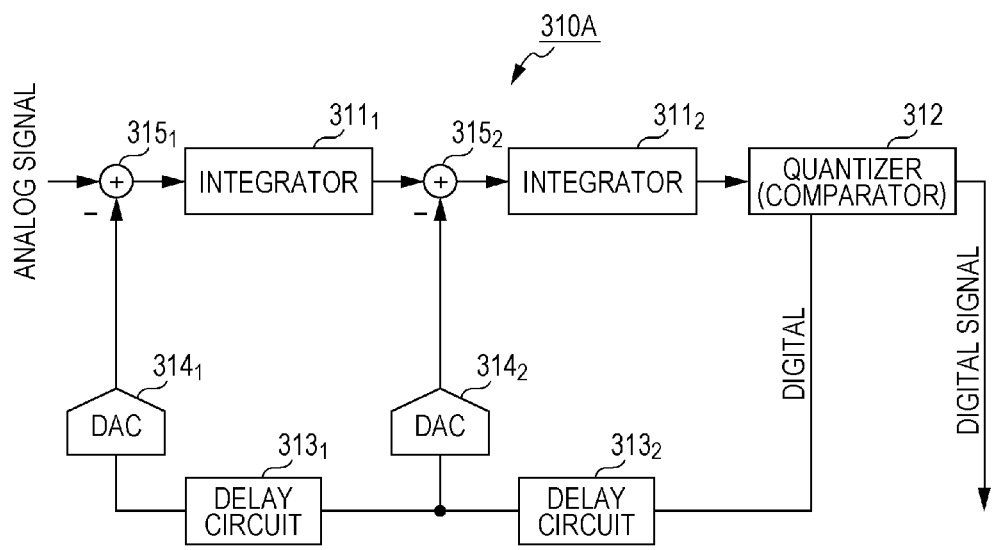

In FIG. 36A, an example of a first ΔΣ AD converter 310 is illustrated. However, n-th, for example, as illustrated in FIG. 36B, it is desirable to apply a second ΔΣ AD converter 310A. In the example illustrated in FIG. 36B, as the decimation filter circuit, a second decimation filter circuit is applied. However, as the decimation filter circuit, it is possible to apply a third decimation filter circuit. As illustrated in FIG. 36B, the second ΔΣ AD converter 310A is configured to be an incremental ΔΣ AD converter, and includes two integrators $311_1$ and $311_2$ as ΔΣ modulators, two delay circuits $313_1$ and $313_2$, two DA converters $314_1$ and $314_2$, and two adders $315_1$ and $315_2$.

Example 7

The solid-state imaging device, for example, to which the electronic device described in Examples 1 to 6 is applied can be used as an imaging portion (image fetching portion) thereof in general electronic devices (electronic equipment) such as an imaging apparatus such as a digital still camera and a video camera, portable terminal equipment such as a portable telephone including an imaging function, and a copying machine using the solid-state imaging device in an image reading portion. There may be a case where the imaging apparatus is formed in a module shape to be mounted on an electronic device, that is, a camera module.

Figure 37:
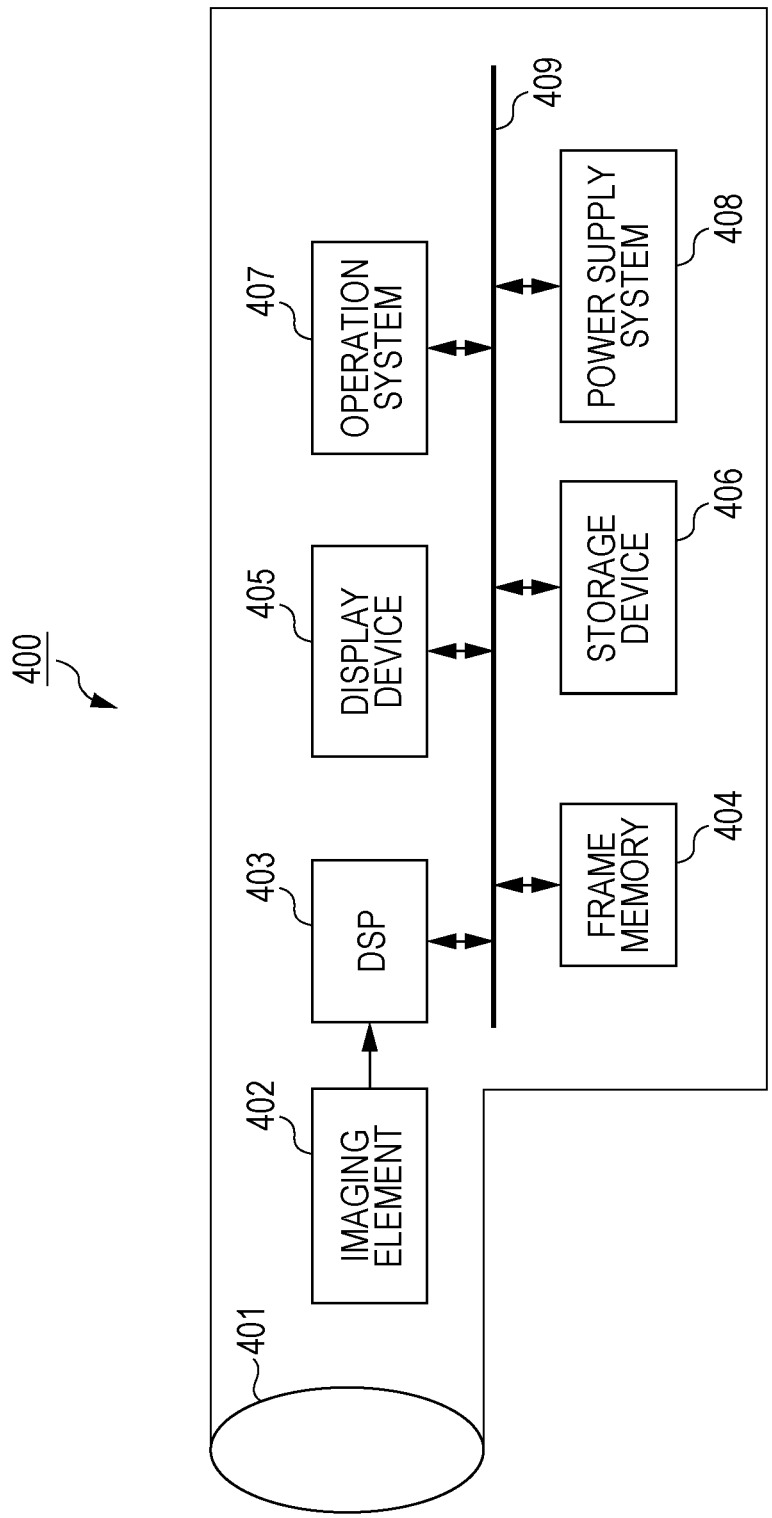
FIG. 37 is a block diagram illustrating a configuration example of an imaging apparatus which is an example of the electronic device according to an embodiment of the present disclosure.

FIG. 37 illustrates a block diagram describing a configuration example of an imaging apparatus (camera apparatus) which is an example of the electronic device of the present disclosure. However, an imaging device 400 which is the electronics device of Example 7 has an optical system including a lens group 401 and the like, an imaging element 402, a DSP circuit 403 which is a camera signal processing portion, a frame memory 404, a display device 405, a recording device 406, an operation system 407, a power supply system 408, and the like. The DSP circuit 403, the frame memory 404, the display device 405, the recording device 406, the operation system 407, and the power supply system 408 are configured to be connected to one another through a bus line 409.

The lens group 401 takes incident light (image light) from an imaging subject so as to image on an imaging plane of an imaging element 402. The imaging element 402 converts a quantity of light of the incident light imaged on the imaging plane by the lens group 401 into an electrical signal which is output as a pixel signal (analog signal). The display device 405 includes a panel-type display device such as a liquid crystal display device and an organic electro luminescence (EL) display device, and displays moving pictures and still images imaged by the imaging element 402. The recording device 406 records the moving pictures and the still images imaged by the imaging element 402 in a recording medium such as a memory card, a video tape, or a digital versatile disk (DVD). The operation system 407 issues operational commands regarding various functions which the imaging device 400 has, in response to the operation of a user. The power supply system 408 appropriately supplies various power sources which serve as an operational power source for the DSP circuit 403, the frame memory 404, the display device 405, the recording device 406, and the operation system 407 with respect to these supplying subjects.

Such an imaging device 400 is applied to a video camera, a digital still camera, and a camera module for mobile equipment such as a portable telephone. In the imaging device 400, as the imaging element 402, it is possible to use electronic devices (solid-state imaging devices) in various Examples described above which can be realized the high-speed reading of image data (digital data) in lower power consumption. Accordingly, it is possible to greatly contribute to the low power consumption of the imaging device 400.

Example 8

In Example 8, various field effect transistors including the depletion-type field effect transistor will be described.

When the depletion-type field effect transistor is a semiconductor device (referred to as "SOI-type semiconductor device") having a SOI structure, the SOI-type semiconductor device is broadly divided into two structures. In other words, one of the structures is a complete depletion-type SOI structure (refer to FIG. 38A) of which depletion layer that is induced to a channel forming region (also referred to as a body portion) immediately below a gate electrode during an operation of the SOI-type semiconductor device reaches the interface between an insulating layer and a SOI layer. The other structure is a partial depletion-type SOI structure (refer to FIG. 38B) in which the depletion layer does not reach the interface between the insulating layer and the SOI layer having a neutral region left behind.

Figure 38A:
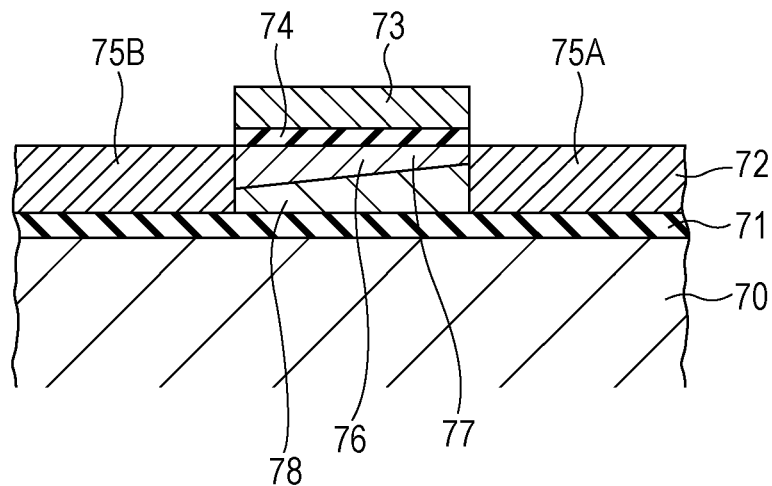
FIGS. 38A and 38B respectively illustrate schematically partial cross-sectional views of a depletion-type field effect transistor having a complete depletion-type SOI structure and the depletion-type field effect transistor having a partial depletion-type SOI structure.
Figure 38B:
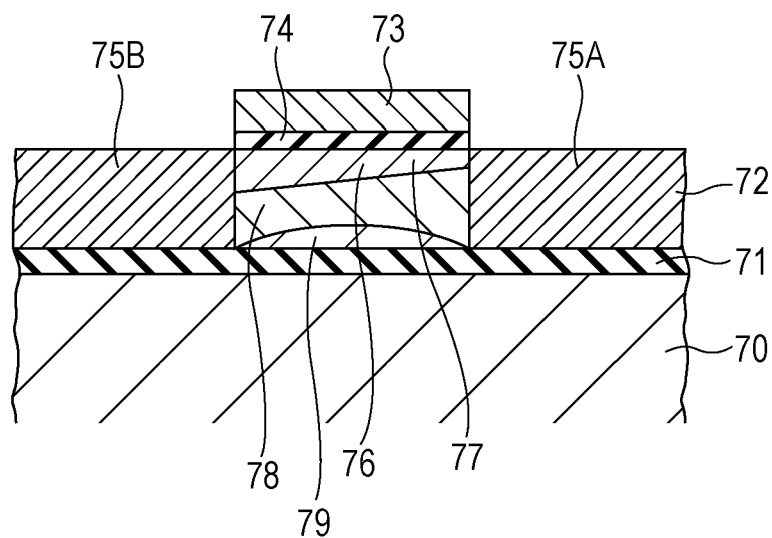

As illustrated in FIGS. 38A and 38B, for example, the SOI-type semiconductor device is formed in a SOI substrate which is formed based on a smart cut method and a substrate laminating technology, a SOI substrate which is formed based on a separation by implantation of oxygen (SIMOX) method, and a SOI substrate in which an insulating layer is formed on a surface of the silicon semiconductor substrate and a silicon layer is formed on the insulating layer. Here, the SOI substrate has a configuration and a structure in which a silicon semiconductor substrate 70, an insulating layer 71 made of $SiO_2$, and a silicon layer (SOI layer) 72 are laminated. The SOI-type semiconductor device includes, in addition to the silicon layer, a drain region 75A, a source region 75B, a channel forming region 76 which is a region of the semiconductor layer 72 interposed between the drain region 75A and the source region 75B, and a gate electrode 73 which is provided facing the channel forming region 76 through a gate insulating layer 74.

Here, in the semiconductor device having the complete depletion-type SOI structure, a channel 77 is formed in the channel forming region 76 immediately below the gate electrode 73 on account of a voltage applied to the gate electrode 73, and a depletion layer 78 is formed between the channel 77 and the insulating layer 71 (refer to FIG. 38A).

In the semiconductor device having a partial depletion-type SOI structure, on account of a voltage applied to the gate electrode 73, the channel 77 is formed in the channel forming region 76 immediately below the gate electrode 73 and the depletion layer 78 is formed under the channel 77. However, a region 79 not to be depleted is formed in a bottom of the body portion between the depletion layer 78 and the insulating layer 71 (refer to FIG. 38B). A difference between the semiconductor device having a complete depletion-type SOI structure and the semiconductor device having a partial depletion-type SOI structure is mainly the thickness of the silicon layer (SOI layer). In the semiconductor device having a complete depletion-type SOI structure, the thickness of the silicon layer 72 is, for example, equal to or less than 50 nm. In the semiconductor device having a partial depletion-type SOI structure, the thickness of the silicon layer 72 is, for example, equal to or less than 100 nm.

Figure 39A:
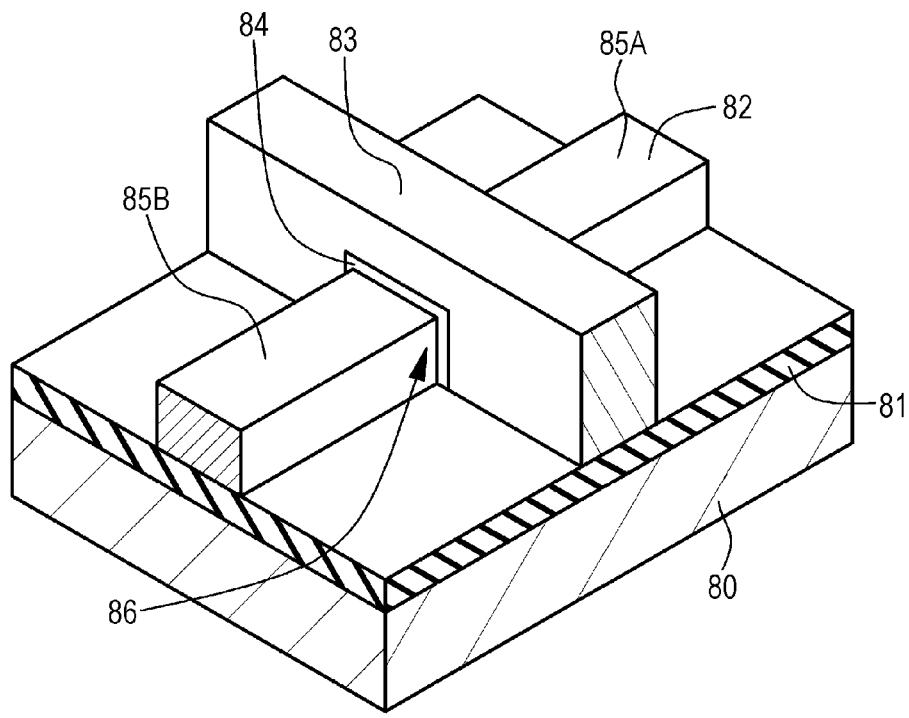
FIGS. 39A and 39B respectively illustrate a schematically partial perspective view of a depletion-type field effect transistor having a fin structure and a schematically partial cross-sectional view of a semiconductor device having a deeply depleted channel structure.

Otherwise, the depletion-type field effect transistor can be a semiconductor device including a fin structure (also referred to as a double gate structure or a tri-gate structure) disclosed in Japanese Unexamined Patent Application Publication No. 2009-182360. The semiconductor device having the fin structure of which schematic and partial perspective view is illustrated in FIG. 39A also has the SOI structure. Specifically, in the depletion-type field effect transistor having the fin structure, an insulating layer 81 made of SiO$_2$ is formed on the surface of a silicon semiconductor substrate 80, and a protruding portion (SOI layer) 82 made of silicon is formed on an insulating layer 81. A channel forming region (body portion) 86, a drain region 85A, and a source region 85B are formed in the protruding portion 82. On the surface of a portion of the protruding portion 82A gate insulating layer 84 is formed, and a gate electrode 83 is formed through the gate insulating layer 84 so as to straddle the protruding portion 82. In the depletion-type field effect transistor having the fin structure, the gate electrode 83 and the gate insulating layer 84 face three surfaces of the channel forming region (body portion) 86. The channel forming region (body portion) 86 can be completely depleted by applying a voltage to the gate electrode 83, thereby configuring the semiconductor device of the complete depletion type.

Figure 39B:
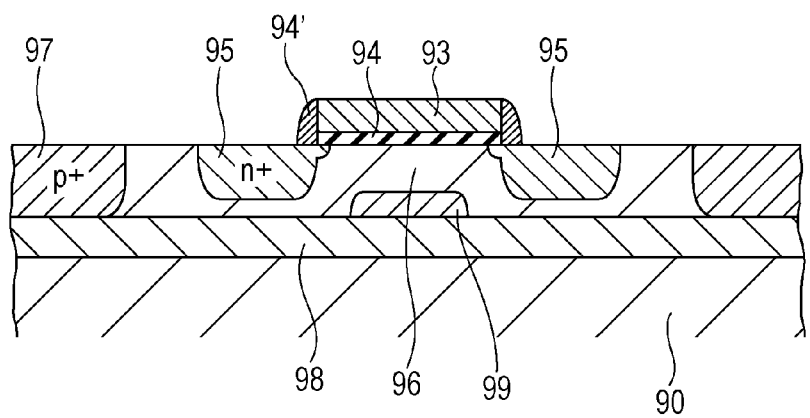

Otherwise, the depletion-type field effect transistor can be the semiconductor device having the deeply depleted channel structure disclosed in Japanese Unexamined Patent Application Publication (Translation of PCT Application) No. 2013-507000. As FIG. 39B illustrates a schematic and partial side view, the semiconductor device having the deeply depleted channel structure includes a source/drain region 95 formed above a p-well 98 formed on the silicon semiconductor substrate 90, a channel forming region 96 formed between the source/drain region 95, and a gate electrode 93 formed to face the channel forming region 96 through the gate insulating layer 94. A side wall 94' is formed on a side wall of the gate electrode 93. A terminal portion (electrode layer) 97 is formed away from the source/drain region 95 and being in contact with the p-well 98. Moreover, a highly-concentrated impurity region 99 is formed in a boundary region between the p-well 98 and the channel forming region 96, being away from the source/drain region 95.

In order to form a circuit group in which the depletion-type field effect transistor, the high breakdown voltage MOS transistor, and the low breakdown voltage MOS transistor (hereinafter, as a general term, may be simply referred to as "MOS transistor") are mixed, for example, when using the SOI substrate, the insulating layer 71 and the semiconductor layer 72 may be removed from the region of the SOI substrate where the MOS transistor supposed to be formed by an etching method, for example, and the silicon semiconductor substrate 70 in bulk may be exposed, thereby forming the MOS transistor in a portion of the exposed silicon semiconductor substrate 70. Otherwise, alternatively, ion implantation may be performed in the region where the depletion-type field effect transistor of the silicon semiconductor substrate 70 in bulk supposed to be formed as necessary, thereby forming the insulating layer 71 and the semiconductor layer 72 in the region where the depletion-type field effect transistor supposed to be formed.

Hereinabove, the present disclosure has been described based on preferable Examples. However, the present disclosure is not limited to Examples. The configurations and the structures of the electronic device including the AD converter described in Examples and the depletion-type field effect transistor are merely examples so as to be able to be appropriately changed. Various circuits configuring the high breakdown voltage transistor system circuit and the low breakdown voltage transistor system circuit are also examples so as to be able to be appropriately changed. In Examples, the description has been given mainly regarding the electronic device including the solid-state imaging apparatus. However, the electronic device is not limited to the solid-state imaging apparatus.

The present disclosure can adopt the following configurations.

[A01] Electronic Device: First Embodiment

An electronic device includes a first semiconductor chip that has a sensor portion in which a plurality of sensors are arranged, and a second semiconductor chip that has a signal processing portion in which a signal obtained by the sensor is processed. The first semiconductor and the second semiconductor are laminated. At least a portion of the signal processing portion has a depletion-type field effect transistor.

[A02] Electronic Device: Second Embodiment

An electronic device includes a first semiconductor chip that has a sensor portion in which a plurality of sensors are arranged, and a second semiconductor chip that has a signal processing portion in which a signal obtained by the sensor is processed. The first semiconductor and the second semiconductor are laminated. The signal processing portion has a high breakdown voltage transistor system circuit and a low breakdown voltage transistor system circuit. At least a portion of the low breakdown voltage transistor system circuit has a depletion-type field effect transistor.

[A03] In the electronic device according to [A02], the high breakdown voltage transistor system circuit and the sensor portion planarly overlap each other. In the second semiconductor chip, a shading region is formed above the high breakdown voltage transistor system circuit which faces the sensor portion of the first semiconductor chip.

[A04] In the electronic device according to [A02], the high breakdown voltage transistor system circuit and the sensor portion do not planarly overlap each other.

[A05] In the electronic device according to any one of [A01] to [A04], the sensor is an image sensor. The electronic device is a solid-state imaging device.

[A06] In the electronic device according to [A05], the image sensor is a CMOS image sensor.

[A07] In the electronic device according to any one of [A01] to [A06], the depletion-type field effect transistor has a complete depletion-type SOI structure.

[A08] In the electronic device according to any one of [A01] to [A06], the depletion-type field effect transistor has a partial depletion-type SOI structure.

[A09] In the electronic device according to any one of [A01] to [A06], the depletion-type field effect transistor has a fin structure.

[A10] In the electronic device according to any one of [A01] to [A06], the depletion-type field effect transistor has a deeply depleted channel structure.

[A11] In the electronic device according to any one of [A01] to [A10], the signal processing portion or the low breakdown voltage transistor system circuit has an analog-digital converter. A portion of the analog-digital converter has the depletion-type field effect transistor.

[A12] In the electronic device according to [A11], the analog-digital converter includes a single slope-type analog-digital converter, a successive approximation-type analog-digital converter, and a delta-sigma modulation-type analog-digital converter.

[A13] In the electronic device according to [A11] or [A12], the analog-digital converter includes a gray code counter.

[A14] In the electronic device according to [A11], one analog-digital converter is provided with respect to a plurality of the sensors. The analog-digital converter which is a single slope-type analog-digital converter has a ramp voltage generator, a comparator to which an analog signal obtained by the sensor and a ramp voltage from the ramp voltage generator are input, and a counter portion to which a clock is supplied from a clock supply portion and which operates based on an output signal of the comparator. At least a portion of the counter portion has the depletion-type field effect transistor.

[A15] In the electronic device according to [A14], the clock supply portion has the depletion-type field effect transistor.

[A16] In the electronic device according to any one of [A11] to [A13], the signal processing portion or the low breakdown voltage transistor system circuit includes the clock supply portion which is connected to the analog-digital converter. The clock supply portion has the depletion-type field effect transistor.

[A17] In the electronic device according to [A16], the clock supply portion has a PLL circuit.

[A18] In the electronic device according to any one of [A01] to [A17], the second semiconductor chip is further provided with a memory portion.

[A19] The electronic device according to any one of [A01] to [A17] further includes a third semiconductor chip that is provided with a memory portion. The semiconductor chips are laminated in the order of the first semiconductor chip, the second semiconductor chip, and the third semiconductor chip.

[B01] In the electronic device according to [A01], a signal processing portion includes an analog-digital converter, a memory portion, a data processing portion, a current source, and a control portion. The digitized digital data by an analog-digital converter is transferred to the memory portion at a first speed which is faster than a frame rate. The data processing portion reads out the digital data from the memory portion at a second speed which is slower than the first speed. The control portion stops an operation of the current source and at least an operation of the analog-digital converter when the digital data is read out from the memory portion.

[B02] In the electronic device according to [B01], the control portion stops the operation of the current source and the operation of the analog-digital converter by vertical synchronizing signal as a unit.

[B03] In the electronic device according to [B01] or [B02], the signal processing portion performs the signal processing in parallel by sensor column as a unit with respect to the analog signal which is read out for each sensor row from each sensor of the sensor portion.

[B04] In the electronic device according to [B03], the signal processing portion has a data latch portion that latches the digital data digitized in the analog-digital converter, and a parallel/serial conversion portion that converts the digital data output from the data latch portion from the parallel data into the serial data. The digital data digitized in the analog-digital converter is subjected to pipeline transferring to the memory portion.

[B05] In the electronic device according to [B04], the signal processing portion performs digitization processing by the analog-digital converter during one horizontal period, and the digitized digital data is transferred to the data latch portion in succeeding 1 horizontal period.

[B06] In the electronic device according to [B04], the signal processing portion performs digitization processing by the analog-digital converter during one horizontal period, and the digitized digital data is transferred to the memory portion through the data latch portion and the column decoder in succeeding 1 horizontal period.

[B07] In the electronic device according to [B03], the signal processing portion has a data latch portion that latches the digital data digitized in the analog-digital converter, and a data compression portion that compresses the digital data output from the data latch portion, and a parallel/serial conversion portion that converts the digital data output from the data latch portion from the parallel data into the serial data. The digital data digitized in the analog-digital converter is subjected to pipeline transferring to the memory portion.

[B08] In the electronic device according to [B07], the signal processing portion performs digitization processing by the analog-digital converter during one horizontal period, and the digitized digital data is transferred to the data latch portion in succeeding 1 horizontal period.

[B09] In the electronic device according to [B07], the signal processing portion performs digitization processing by the analog-digital converter during one horizontal period, and the digitized digital data is transferred to the memory portion through the data latch portion and the column decoder in succeeding 1 horizontal period.

[B10] In the electronic device according to any one of [B01] to [B09], the signal processing portion has two or more analog-digital converters, and performs digitization processing in parallel in the two or more analog-digital converters.

[B11] In the electronic device according to [B10], the two or more analog-digital converters are arranged by divided into both sides in an extending direction of the signal line of the sensor portion.

[B12] In the electronic device according to any one of [B01] to [B11], the current source, the signal processing portion, and the memory portion which are connected to the signal line are provided for each sensor unit by predetermined number of sensors as a unit. The signal processing portion performs the signal processing in parallel with respect to the analog signal read out from the sensor for each sensor unit.

[B13] In the electronic device according to [B12], the signal processing portion performs the signal processing in a predetermined order with respect to the analog signal read out from the sensor in a predetermined number for each sensor.

[B14] In the electronic device according to any one of [B01] to [B13], the data processing portion has a decoder that designates the column address with respect to the memory portion, and a sense amplifier that reads out the digital data of the designated column address. The digital data is read out from the memory portion through the sense amplifier and the decoder.

[B15] In the electronic device according to any one of [B01] to [B14], the data processing portion reads out the digital data from the memory portion during exposure period.

[B16] In the electronic device according to any one of [B01] to [B15], the control portion blocks the current bus between the signal line and the current source when stopping the operation of the current source which is connected to the signal line.

[B17] In the electronic device according to [B16], the control portion applies the fixed potential to the signal line when blocking the current bus between the signal line and the current source.

[C01] An electronic device comprising:
a laminated structure including a first semiconductor chip and a second semiconductor chip,
the first semiconductor chip including a sensor portion in which sensors are arranged, and
the second semiconductor chip including a signal processing portion in which signals obtained by the sensor are processed,
wherein the signal processing portion includes a depletion-type field effect transistor.

[D02] An electronic device comprising:
a laminated structure including a first semiconductor chip and a second semiconductor chip,
the first semiconductor chip including a sensor portion in which sensors are arranged, and
the second semiconductor chip including a signal processing portion in which signals obtained by the sensors are processed,
wherein the signal processing portion includes a high breakdown voltage transistor circuit and a low breakdown voltage transistor circuit, and
wherein the low breakdown voltage transistor circuit includes a depletion-type field effect transistor.

[D03] The electronic device according to [D02],
wherein the high breakdown voltage transistor circuit and the sensor portion overlap each other in a plan view perspective, and
wherein in the second semiconductor chip, a light blocking region is formed between the high breakdown voltage transistor circuit and the sensor portion.

[D04] The electronic device according to [D02],
wherein the high breakdown voltage transistor circuit and the sensor portion do not overlap each other in a plan view perspective.

[D05] The electronic device according to [D02],
wherein the sensors are image sensors, and
wherein the electronic device is a solid-state imaging device.

[D06] The electronic device according to [D05],
wherein the image sensors are CMOS image sensors.

[D07] The electronic device according to [D02],
wherein the depletion-type field effect transistor includes a complete depletion-type SOI structure.

[D08] The electronic device according to [D02],
wherein the depletion-type field effect transistor includes a partial depletion-type SOI structure.

[D09] The electronic device according to [D02],
wherein the depletion-type field effect transistor includes a fin structure.

[D10] The electronic device according to [D02],
wherein the depletion-type field effect transistor includes a deeply depleted channel structure.

[D11] The electronic device according to [D02],
wherein at least one of the signal processing portion and the low breakdown voltage transistor circuit includes an analog-digital converter, and
wherein the analog-digital converter includes the depletion-type field effect transistor.

[D12] The electronic device according to [D11],
wherein the analog-digital converter includes at least one of a single slope-type analog-digital converter, a successive approximation-type analog-digital converter, and a delta-sigma modulation-type analog-digital converter.

[D13] The electronic device according to [D11],
wherein the analog-digital converter includes a gray code counter.

[D14] The electronic device according to [D11],
wherein the analog-digital converter is provided with respect to a plurality of the sensors,
wherein the analog-digital converter is a single slope-type analog-digital converter and includes a ramp voltage generator,
a comparator to which an analog signal obtained by the sensor and a ramp voltage from the ramp voltage generator are input, and
a counter portion to which a clock is supplied from a clock supply portion and which operates based on an output signal of the comparator, and
wherein the counter portion includes the depletion-type field effect transistor.

[D15] The electronic device according to [D14],
wherein the clock supply portion includes the depletion-type field effect transistor.

[D16] The electronic device according to [D11],
wherein the signal processing portion or the low breakdown voltage transistor circuit includes a clock supply portion which is connected to the analog-digital converter, and
wherein the clock supply portion has the depletion-type field effect transistor.

[D17] The electronic device according to [D16],
wherein the clock supply portion includes a PLL circuit.

[D18] The electronic device according to [D02]
wherein the second semiconductor chip includes a memory portion.

[D19] The electronic device according to [D02] further comprising:
a third semiconductor chip that is provided with a memory portion,
wherein the first, second and third semiconductor chips are laminated in the order of the first semiconductor chip, the second semiconductor chip, and the third semiconductor chip.

[D20] The electronic device according to [D13], wherein the gray code counter includes the depletion-type field effect transistor.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
a laminated structure including a first semiconductor chip and a second semiconductor chip,
the first semiconductor chip including a sensor portion in which sensors are arranged, and
the second semiconductor chip including a signal processing portion in which signals obtained by the sensor are processed,
wherein respective ones of the sensors include a plurality of transistors, and
wherein the signal processing portion includes a depletion-type field effect transistor.

2. An electronic device comprising:
a laminated structure including a first semiconductor chip and a second semiconductor chip,
the first semiconductor chip including a sensor portion in which sensors are arranged, and
the second semiconductor chip including a signal processing portion in which signals obtained by the sensors are processed,
wherein respective ones of the sensors include a plurality of transistors,
wherein the signal processing portion includes a high breakdown voltage transistor circuit and a low breakdown voltage transistor circuit, and
wherein the low breakdown voltage transistor circuit includes a depletion-type field effect transistor.

3. The electronic device according to claim 2,
wherein the high breakdown voltage transistor circuit and the sensor portion overlap each other in a plan view perspective, and
wherein in the second semiconductor chip, a light blocking region is formed between the high breakdown voltage transistor circuit and the sensor portion.

4. The electronic device according to claim 2,
wherein the high breakdown voltage transistor circuit and the sensor portion do not overlap each other in a plan view perspective.

5. The electronic device according to claim 2,
wherein the sensors are image sensors, and
wherein the electronic device is a solid-state imaging device.

6. The electronic device according to claim 5,
wherein the image sensors are CMOS image sensors.

7. The electronic device according to claim 2,
wherein the depletion-type field effect transistor includes a complete depletion-type SOI structure.

8. The electronic device according to claim 2,
wherein the depletion-type field effect transistor includes a partial depletion-type SOI structure.

9. The electronic device according to claim 2,
wherein the depletion-type field effect transistor includes a fin structure.

10. The electronic device according to claim 2,
wherein the depletion-type field effect transistor includes a deeply depleted channel structure.

11. The electronic device according to claim 2,
wherein at least one of the signal processing portion and the low breakdown voltage transistor circuit includes an analog-digital converter, and
wherein the analog-digital converter includes the depletion-type field effect transistor.

12. The electronic device according to claim 11,
wherein the analog-digital converter includes at least one of a single slope-type analog-digital converter, a successive approximation-type analog-digital converter, and a delta-sigma modulation-type analog-digital converter.

13. The electronic device according to claim 11,
wherein the analog-digital converter includes a gray code counter.

14. The electronic device according to claim 11,
wherein the analog-digital converter is provided with respect to a plurality of the sensors,
wherein the analog-digital converter is a single slope-type analog-digital converter and includes a ramp voltage generator,
a comparator to which an analog signal obtained by the sensor and a ramp voltage from the ramp voltage generator are input, and
a counter portion to which a clock is supplied from a clock supply portion and which operates based on an output signal of the comparator, and
wherein the counter portion includes the depletion-type field effect transistor.

15. The electronic device according to claim 14,
wherein the clock supply portion includes the depletion-type field effect transistor.

16. The electronic device according to claim 11,
wherein the signal processing portion or the low breakdown voltage transistor circuit includes a clock supply portion which is connected to the analog-digital converter, and
wherein the clock supply portion has the depletion-type field effect transistor.

17. The electronic device according to claim 16,
wherein the clock supply portion includes a PLL circuit.

18. The electronic device according to claim 2,
wherein the second semiconductor chip includes a memory portion.

19. The electronic device according to claim 2, further comprising:
a third semiconductor chip that is provided with a memory portion,
wherein the first, second and third semiconductor chips are laminated in the order of the first semiconductor chip, the second semiconductor chip, and the third semiconductor chip.

20. The electronic device according to claim 13, wherein the gray code counter includes the depletion-type field effect transistor.

* * * * *

UNITED STATES PATENT AND TRADEMARK OFFICE
CERTIFICATE OF CORRECTION

PATENT NO. : 9,762,836 B2
APPLICATION NO. : 14/510935
DATED : September 12, 2017
INVENTOR(S) : Yoshikazu Kurose It is certified that error appears in the above-identified patent and that said Letters Patent is hereby corrected as shown below:

On the Title Page

Item (56), Other Publications:
Please replace "IEEE Service Center, Piscataway, NJ., vol. 56, No. 11 Nov. 1, 1999" with
-- IEEE Service Center, Piscataway, NJ., vol. 56, No. 11 Nov. 1, 2009 --

Signed and Sealed this
Twenty-first Day of November, 2017

Joseph Matal
*Performing the Functions and Duties of the*
*Under Secretary of Commerce for Intellectual Property and*
*Director of the United States Patent and Trademark Office*